United States Patent
Ueki et al.

(10) Patent No.: US 11,016,223 B2
(45) Date of Patent: May 25, 2021

(54) HARDCOAT FILM AND APPLICATION THEREOF

(71) Applicant: FUJIFILM Corporation, Tokyo (JP)

(72) Inventors: Keigo Ueki, Kanagawa (JP); Katsuyuki Takada, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 184 days.

(21) Appl. No.: 16/013,464

(22) Filed: Jun. 20, 2018

(65) Prior Publication Data
US 2018/0297341 A1    Oct. 18, 2018

Related U.S. Application Data

(63) Continuation of application No. PCT/JP2016/087018, filed on Dec. 13, 2016.

(30) Foreign Application Priority Data

Dec. 28, 2015   (JP) ............................. JP2015-256510
Apr. 25, 2016   (JP) ............................. JP2016-087318
Sep. 28, 2016   (JP) ............................. JP2016-189953

(51) Int. Cl.
*G02B 1/14*     (2015.01)
*B32B 27/30*    (2006.01)
(Continued)

(52) U.S. Cl.
CPC ................ *G02B 1/14* (2015.01); *B32B 7/023* (2019.01); *B32B 27/30* (2013.01); *G02B 5/30* (2013.01);
(Continued)

(58) Field of Classification Search
CPC ....... Y10T 428/24942; Y10T 428/2495; Y10T 428/24959; Y10T 428/24967;
(Continued)

(56) References Cited

U.S. PATENT DOCUMENTS 5,688,436 A * 11/1997 Ohnishi ............. C09K 19/3852
                                                        252/299.01
2014/0078098 A1 * 3/2014 Kim ....................... G06F 3/041
                                                        345/174
(Continued)

FOREIGN PATENT DOCUMENTS

JP    2000-071392 A       3/2000
JP    2001328225 A *    11/2001
(Continued)

OTHER PUBLICATIONS

Machine translation (Espacenet) of JP 2001-328225 A. Translated May 8, 2020. (Year: 2020).*

(Continued)

*Primary Examiner* — Maria V Ewald
*Assistant Examiner* — Ethan A. Utt
(74) *Attorney, Agent, or Firm* — Edwards Neils LLC; Jean C. Edwards, Esq.

(57) ABSTRACT

A hardcoat film has a support, a first cured layer, and a second cured layer in this order in which the first cured layer is formed of a curable composition for forming a first cured layer containing a polymerizable compound 1 having a radically polymerizable group and a polymerizable compound 2 having a cationically polymerizable group and a radically polymerizable group, the second cured layer is formed of a curable composition for forming a second cured layer containing a polymerizable compound 3 having at least two radically polymerizable groups, and a content of the polymerizable compound 2 with respect to a total content of the polymerizable compounds contained in the curable composition for forming a first cured layer is equal to or greater than 51% by mass.

21 Claims, 3 Drawing Sheets

(51) Int. Cl.
| | |
|---|---|
| *G02B 5/30* | (2006.01) |
| *G02F 1/1335* | (2006.01) |
| *H05B 33/02* | (2006.01) |
| *G06F 3/045* | (2006.01) |
| *B32B 7/023* | (2019.01) |
| *G06F 3/041* | (2006.01) |
| *B05D 7/00* | (2006.01) |
| *B05D 3/06* | (2006.01) |
| *G06F 3/044* | (2006.01) |
| *G09F 9/30* | (2006.01) |
| *H01L 27/32* | (2006.01) |
| *H01L 51/50* | (2006.01) |
| *H01L 51/52* | (2006.01) |

(52) U.S. Cl.
CPC ......... *G02B 5/3083* (2013.01); *G02F 1/1335* (2013.01); *G06F 3/045* (2013.01); *G09F 9/30* (2013.01); *H01L 27/32* (2013.01); *H01L 27/323* (2013.01); *H01L 51/50* (2013.01); *H01L 51/5281* (2013.01); *H05B 33/02* (2013.01); *B05D 3/067* (2013.01); *B05D 7/546* (2013.01); *G02F 2201/50* (2013.01); *G06F 3/041* (2013.01); *G06F 3/0445* (2019.05); *G06F 2203/04103* (2013.01)

(58) Field of Classification Search
CPC ..... Y10T 428/24975; Y10T 428/24983; Y10T 428/24992; Y10T 428/26; Y10T 428/261; Y10T 428/263; Y10T 428/264; Y10T 428/265; Y10T 428/266; Y10T 428/268; Y10T 428/269; Y10T 428/27; Y10T 428/273; Y10T 428/277; Y10T 428/25; Y10T 428/251; Y10T 428/252; Y10T 428/253; Y10T 428/254; Y10T 428/256; Y10T 428/257; Y10T 428/258; Y10T 428/259; Y10T 428/31507; Y10T 428/31511; Y10T 428/31515; Y10T 428/3154; Y10T 428/31544; Y10T 428/31551; Y10T 428/31554; Y10T 428/31565; Y10T 428/31573; Y10T 428/31576; Y10T 428/3158; Y10T 428/31583; Y10T 428/31587; Y10T 428/31591; Y10T 428/31609; Y10T 428/31786; Y10T 428/3179; Y10T 428/31794; Y10T 428/31797; Y10T 428/31855; Y10T 428/3188; Y10T 428/31884; Y10T 428/31888; Y10T 428/31891; Y10T 428/31909; Y10T 428/31913; Y10T 428/31917; Y10T 428/3192; Y10T 428/31924; Y10T 428/31928; Y10T 428/31931; Y10T 428/31935; Y10T 428/31938; Y10T 428/28; Y10T 428/2809; Y10T 428/2848; Y10T 428/2852; Y10T 428/287; Y10T 428/2878; Y10T 428/2887; Y10T 428/2891; Y10T 428/2896; B32B 5/00; B32B 5/16; B32B 5/22; B32B 5/30; B32B 7/00; B32B 7/02; B32B 7/022; B32B 7/023; B32B 7/04; B32B 7/12; B32B 27/00; B32B 27/04; B32B 27/06; B32B 27/08; B32B 27/16; B32B 27/18; B32B 27/20; B32B 27/26; B32B 27/30; B32B 27/302; B32B 27/308; B32B 27/32; B32B 27/36; B32B 27/365; B32B 27/38; B32B 27/40; B32B 2551/00; B32B 2457/20; B32B 2457/202; B32B 2457/204; B32B 2457/206; B32B 2457/208; G02B 1/00; G02B 1/04; G02B 1/08; G02B 1/10; G02B 1/12; G02B 1/14; G02B 1/18; G02F 1/00; G02F 1/0009; G02F 1/01; G02F 1/13; G02F 1/133; G02F 1/1333; G02F 1/133305; G02F 2001/133302; G02F 2001/133357; G02F 2001/133368

USPC ........ 428/212–220, 323–342, 412, 413, 414, 428/421, 422, 423.1, 423.3, 423.7, 428/424.2–425.1, 425.9, 480–483, 500, 428/507–510, 515–523, 343, 345, 354, 428/355, 355 R, 355 EP, 355 CN, 428/355 AC, 355 N

See application file for complete search history.

(56) References Cited

U.S. PATENT DOCUMENTS

| | | | |
|---|---|---|---|
| 2014/0141223 A1 | 5/2014 | Yoda et al. | |
| 2014/0375927 A1* | 12/2014 | Ishiguro | ............ G02F 1/133602 349/61 |
| 2015/0261259 A1* | 9/2015 | Endo | ..................... G06F 1/1618 361/679.06 |

FOREIGN PATENT DOCUMENTS

| | | | |
|---|---|---|---|
| JP | 2003-195005 A | | 7/2003 |
| JP | 2004-277540 A | | 10/2004 |
| JP | 2006-058574 A | | 3/2006 |
| JP | 2006-098444 A | | 4/2006 |
| JP | 2007-237483 A | | 9/2007 |
| JP | 2009255544 A | * | 11/2009 |
| JP | 2009255565 A | * | 11/2009 |
| JP | 2010024283 A | * | 2/2010 |
| KR | 10-2010-0030586 A | | 3/2010 |
| TW | 201307064 A1 | | 2/2013 |
| WO | 2008-020578 A1 | | 2/2008 |

OTHER PUBLICATIONS

Machine translation (Espacenet) of JP 2009-255544 A. Translated May 7, 2020. (Year: 2020).*
Machine translation (Espacenet) of JP 2009-255565 A. Translated Nov. 2, 2020. (Year: 2020).*
Machine translation (Google Patents) of JP 2010-024283 A. Translated Mar. 12, 2021. (Year: 2021).*
Office Action, issued by the Korean Intellectual Property Office dated Oct. 2, 2019, in connection with Korean Patent Application No. 10-2018-7017358.
International Search Report issued in PCT/JP2016/087018 dated Mar. 21, 2017.
Written Opinion issued in PCT/JP2016/087018 dated Mar. 21, 2017.
International Preliminary Report on Patentability completed by WIPO on Jul. 3, 2018 in connection with International Patent Application No. PCT/JP2016/087018.
Office Action, issued by the Taiwanese Intellectual Property Office dated Jun. 3, 2020, in connection with Taiwanese Patent Application No. 105142598.

* cited by examiner

HARDCOAT FILM AND APPLICATION THEREOF

CROSS-REFERENCE TO RELATED APPLICATIONS

This application is a Continuation of PCT International Application No. PCT/JP2016/087018, filed on Dec. 13, 2016, which was published under PCT Article 21(2) in Japanese, and which claims priority under 35 U.S.C. § 119(a) to Japanese Patent Application No. 2015-256510, filed on Dec. 28, 2015, Japanese Patent Application No. 2016-087318, filed on Apr. 25, 2016, and Japanese Patent Application No. 2016-189953, filed on Sep. 28, 2016. The above applications are hereby expressly incorporated by reference, in their entirety, into the present application.

BACKGROUND OF THE INVENTION

1. Field of the Invention

The present invention relates to a hardcoat film, a method for manufacturing a hardcoat film, a kit, a polarizing plate, a front plate of an image display, an image display, a resistive film-type touch panel, and a capacitance-type touch panel.

2. Description of the Related Art

In the related art, for the uses in which high durability is required for a front plate of an image display, particularly, a front plate of a touch panel or the like, glass such as chemical strengthening glass is mainly used. Compared to glass, plastic has advantages of being lightweight, not easily cracking, and being able to be thinned. Therefore, in recent years, in the uses in which glass is mainly utilized, the usefulness of plastic as a material substituting glass has drawn attention. Particularly, the use of a hardcoat film, which includes a cured layer on a support, as a material substituting glass is being examined.

For a hardcoat film used for the surface of a touch panel, scratch resistance of the surface is considered important.

JP2000-71392A describes a hardcoat film or a sheet obtained by providing a cured resin coat layer on at least one surface of a transparent plastic substrate. The cured resin coat layer provided on the substrate is constituted with two layers including a first hardcoat layer and a second hardcoat layer formed in this order.

JP2006-98444A describes a laminate including a transparent substrate, and an scratch resistant layer and an antireflection layer which are formed in this order from the substrate surface side. The scratch resistant layer is obtained by curing a composition containing a compound, which has at least two radically polymerizable functional groups in a molecule, in an amount of 50 to 99 parts by mass and a compound, which has a cationically polymerizable functional group and a radically polymerizable functional group in a molecule, in an amount of 1 to 50 parts by mass. The antireflection layer is obtained by curing a composition containing a compound, which has a cationically polymerizable functional group in a molecule, and silica particles.

SUMMARY OF THE INVENTION

The inventors of the present invention conducted examinations regarding the publications described above. As a result, the inventors have found that in JP2000-71392A, the adhesiveness between the layers is insufficient. The inventors have also found that in JP2006-98444A, punching properties are poor. Furthermore, the inventors have found that in a case where an attempt is made to improve the adhesiveness or the punching properties, sometimes scratch resistance becomes poor.

The present invention is for solving the aforementioned problems, and an object thereof is to provide a hardcoat film, which has excellent punching properties while maintaining high scratch resistance and in which the adhesiveness between layers is high, a method for manufacturing a hardcoat film, a kit, a polarizing plate, a front plate of an image display, an image display, a resistive film-type touch panel, and a capacitance-type touch panel.

In order to achieve the aforementioned object, the inventors of the present invention conducted examinations. As a result, the inventors have found that the aforementioned object can be achieved, for example, by providing two or more cured layers and mixing a large amount of a polymerizable compound, which has a cationically polymerizable group and a radically polymerizable group in the same molecule, with at least one of the cured layers. Specifically, the aforementioned object has been achieved by the following means <1> and preferably by <2> to <21>.

<1> A hardcoat film comprising at least a support, a first cured layer, and a second cured layer in this order, in which the first cured layer is formed of a curable composition for forming a first cured layer containing a polymerizable compound 1 having a radically polymerizable group and a polymerizable compound 2 which has a cationically polymerizable group and a radically polymerizable group in the same molecule and is different from the polymerizable compound 1, the second cured layer is formed of a curable composition for forming a second cured layer containing a polymerizable compound 3 having at least two radically polymerizable groups in the same molecule, and a content of the polymerizable compound 2 with respect to a total content of the polymerizable compounds contained in the curable composition for forming a first cured layer is equal to or greater than 51% by mass.

<2> The hardcoat film described in <1>, in which a content of a polymerizable compound having a cationically polymerizable group with respect to a total content of polymerizable compounds contained in the curable composition for forming a second cured layer is equal to or smaller than 20% by mass.

<3> The hardcoat film described in <1> or <2>, in which a content of inorganic particles in the curable composition for forming a second cured layer is equal to or smaller than 20% by mass.

<4> The hardcoat film described in any one of <1> to <3>, in which the curable composition for forming a second cured layer contains a fluorine-containing compound.

<5> The hardcoat film described in <4>, in which the fluorine-containing compound has a radically polymerizable group.

<6> The hardcoat film described in any one of <1> to <5>, in which the cationically polymerizable group of the polymerizable compound 2 is an epoxy group.

<7> The hardcoat film described in any one of <1> to <5>, in which the cationically polymerizable group of the polymerizable compound 2 is an alicyclic epoxy group.

<8> The hardcoat film described in any one of <1> to <7>, in which the second cured layer is positioned on a surface of the first cured layer.

<9> The hardcoat film described in any one of <1> to <8>, in which an optically-anisotropic layer containing a liquid crystal compound is laminated on one side of the support.

<10> The hardcoat film described in any one of <1> to <9>, in which a film thickness of the support is 50 μm to 400 μm.

<11> A method for manufacturing a hardcoat film, comprising forming a first cured layer on a support by using a curable composition for forming a first cured layer containing a polymerizable compound 1 having a radically polymerizable group and a polymerizable compound 2 which has a cationically polymerizable group and a radically polymerizable group in the same molecule and is different from the polymerizable compound 1, and forming a second cured layer on the first cured layer by using a curable composition for forming a second cured layer containing a polymerizable compound 3 having at least two radically polymerizable groups in the same molecule, in which the second cured layer is formed such that the support, the first cured layer, and the second cured layer are laminated in this order, and a content of the polymerizable compound 2 with respect to a total content of the polymerizable compounds contained in the curable composition for forming a first cured layer is equal to or greater than 51% by mass.

<12> The method for manufacturing a hardcoat film described in <11>, in which the second cured layer is formed on a surface of the first cured layer.

<13> A kit comprising a curable composition for forming a first cured layer containing a polymerizable compound 1 having a radically polymerizable group and a polymerizable compound 2 which has a cationically polymerizable group and a radically polymerizable group in the same molecule and is different from the polymerizable compound 1; and a curable composition for forming a second cured layer containing a polymerizable compound 3 having at least two radically polymerizable groups in the same molecule, in which a content of the polymerizable compound 2 with respect to a total content of the polymerizable compounds contained in the curable composition for forming a first cured layer is equal to or greater than 51% by mass.

<14> A polarizing plate comprising the hardcoat film described in any one of <1> to <10> and a polarizer.

<15> A front plate of an image display, comprising the hardcoat film described in any one of <1> to <10>.

<16> An image display comprising the front plate described in <15> and an image display element.

<17> The image display described in <16>, in which the image display element is a liquid crystal display element.

<18> The image display described in <16>, in which the image display element is an organic electroluminescent display element.

<19> The image display described in any one of <16> to <18>, in which the image display element is an in-cell touch panel display element.

<20> The image display described in any one of <16> to <18>, in which the image display element is an on-cell touch panel display element.

<21> A resistive film-type touch panel comprising the front plate described in <15>.

<22> A capacitance-type touch panel comprising the front plate described in <15>.

According to the present invention, it is possible to provide a hardcoat film, which has excellent punching properties while maintaining high scratch resistance and in which the adhesiveness between layers is high, a method for manufacturing a hardcoat film, a kit, a polarizing plate, a front plate of an image display, an image display, a resistive film-type touch panel, and a capacitance-type touch panel.

DESCRIPTION OF THE PREFERRED EMBODIMENTS

Figure 1:
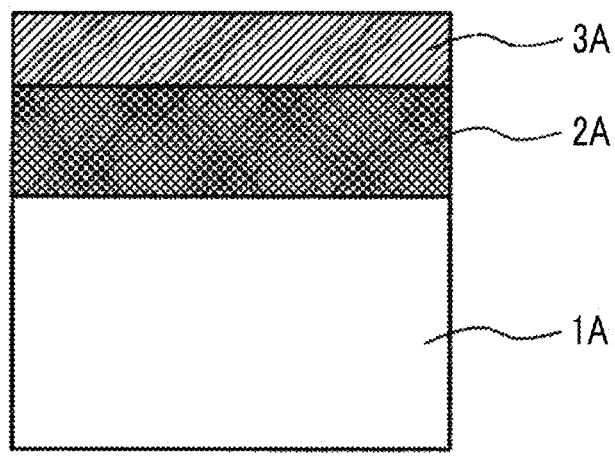
FIG. 1 is a schematic cross-sectional view showing the constitution of an embodiment of a hardcoat film of the present invention.

Hereinafter, the present invention will be described. In the present specification, "to" means that numerical values listed before and after "to" are a lower limit and an upper limit respectively.

In the present specification, "(meth)acryl group" means "either or both of an acryl group and a methacryl group". The same is true for (meth)acrylic acid, (meth)acrylamide, a (meth)acryloyl group, and the like.

In the present specification, a total solid content refers to the total mass of all the components of a composition except for a solvent.

In the present specification, a cured layer refers to a layer which is formed of a composition containing at least a curable compound and has a surface having a pencil hardness equal to or higher than 2H.

Hardcoat Film

The hardcoat film of the present invention has at least a support, a first cured layer, and a second cured layer in this order, in which the first cured layer is formed of a curable composition for forming a first cured layer containing a polymerizable compound 1 having a radically polymerizable group and a polymerizable compound 2 which has a cationically polymerizable group and a radically polymerizable group in the same molecule and is different from the polymerizable compound 1, the second cured layer is formed of a curable composition for forming a second cured layer containing a polymerizable compound 3 having at least two radically polymerizable groups in the same molecule, and a content of the polymerizable compound 2 with respect to a total content of the polymerizable compounds contained in the curable composition for forming a first cured layer is equal to or greater than 51% by mass.

In a case where the above constitution is adopted, it is possible to improve the punching properties and the adhesiveness between the layers while maintaining high scratch resistance. Furthermore, it is possible to improve the pencil hardness.

It is unclear why the above constitution makes it possible to obtain a hardcoat film which has excellent punching properties while maintaining high scratch resistance and in which the adhesiveness between the layers is excellent. According to the inventors of the present invention, the reason is assumed to be as below. That is, because the second cured layer is formed using the polymerizable compound 3 having at least two radically polymerizable groups in the same molecule, high scratch resistance can be imparted. In addition, because the first cured layer is formed using the polymerizable compound 2 having a cationically polymerizable group and a radically polymerizable group in the same molecule, impact absorbing properties are imparted to the first cured layer. It is considered that as a result, high scratch resistance is maintained in the entire hardcoat film, and the punching properties are improved. Furthermore, it is considered that the use of the polymerizable compound 2 makes it easy for a chemical bond to be formed between the first cured layer and the second cured layer, and accordingly, the adhesiveness between the first cured layer and the second cured layer can be improved.

In contrast, in the hardcoat film described in JP2000-71392A, the first cured layer does not contain a polymerizable compound having a cationically polymerizable group and a radically polymerizable group in the same molecule. Accordingly, the adhesiveness thereof is poor. In addition, in the laminate described in JP2006-98444A, the first cured layer contains a small amount of the polymerizable compound having a cationically polymerizable group and a radically polymerizable group in the same molecule. Accordingly, the punching properties thereof are poor.

Furthermore, in the present invention, because the second cured layer contains polymerizable compounds 3 having at least two radically polymerizable groups in the same molecule, the pencil hardness can be improved.

Hereinafter, preferred aspects of the hardcoat film of the present invention will be described.

<Constitution>

As shown in FIG. 1, the hardcoat film as an embodiment has at least a support 1A, a first cured layer 2A, and a second cured layer 3A in this order.

In FIG. 1, the first cured layer is position on a surface of the support 1A. However, the first cured layer does not need to be positioned on a surface of the support 1A, and there may be other layers between the support 1A and the first cured layer. Likewise, the second cured layer does not need to be positioned on a surface of the first cured layer, and there may be other layers between the first cured layer and the second cured layer. From the viewpoint of improving the adhesiveness between the first cured layer and the second cured layer, it is preferable that the second cured layer is positioned on a surface of the first cured layer, that is, it is preferable that the two cured layers come into contact with each other through at least a portion of the film surface. Other layers will be specifically described later.

Each of the first cured layer and the second cured layer may be constituted with one layer or two or more layers, but is preferably constituted with one layer.

As will be specifically described later, in a case where the hardcoat film of the present invention is used in a touch panel, it is preferable that the hardcoat film is disposed such that the second cured layer becomes the front side of an image display element. However, in order to improve the scratch resistance and the punching properties of the hardcoat film surface, the second cured layer is preferably disposed on the front surface side of the hardcoat film and particularly preferably disposed on the outermost surface thereof.

<Support>

The support used in the present invention is not particularly limited, and known films can be used as the support.

As the support, a resin film is preferable. Examples of the resin film include an acrylic resin film, a polycarbonate (PC)-based resin film, a triacetyl cellulose (TAC)-based resin film, a polyethylene terephthalate (PET)-based resin film, a polyolefin-based resin film, a polyester-based resin film, an acrylonitrile-butadiene-styrene copolymer film, and the like. Among these, an acrylic resin film, a triacetyl cellulose-based resin film a polyethylene terephthalate-based resin film, and a polycarbonate-based resin film are preferable.

The acrylic resin film refers to a resin film of a polymer or a copolymer formed of one or more kinds of compounds selected from the group consisting of an acrylic acid ester and a methacrylic acid ester. Examples of the acrylic resin film include a polymethyl methacrylate (PMMA) resin film.

The support used in the present invention may be a single layer or a laminated film including two or more layers, and is preferably a laminated film including two or more layers.

The number of layers laminated to form the laminated film is preferably 2 to 10, more preferably 2 to 5, and even more preferably 2 or 3. In a case where the support used in the present invention includes three or more layers, it is preferable that the outer layers and layers (a core layer and the like) other than the outer layers are films of different compositions. Furthermore, it is preferable that the outer layers are films of the same composition.

Examples of the support as a laminated film used in the present invention include a laminated film constituted with the aforementioned resin films.

As an embodiment of the support as a laminated film used in the present invention, a laminated film can be exemplified which has at least one layer of acrylic resin film and at least one layer of polycarbonate-based resin film. As the support, a laminated film is preferable which has an acrylic resin film, a polycarbonate-based resin film, and an acrylic resin film in this order.

Commercial products may be used as the support, or the support may be manufactured by a known film forming methods.

As commercial supports, for example, it is possible to use TECHNOLLOY C101 and TECHNOLLOY C001 (all manufactured by Escarbo Sheet Company, Ltd.), AW-10 (manufactured by Wavelock Advanced Technology Co., Ltd.), and the like.

The support can also contain, in addition to a resin, one or more kinds of optional components as other components such as known additives. As an example of the components that can be optionally contained in the support, an ultraviolet absorber can be exemplified. Examples of the ultraviolet absorber include a benzotriazole compound and a triazine compound. The benzotriazole compound is a compound having a benzotriazole ring, and specific examples thereof include various benzotriazole-based ultraviolet absorbers described in paragraph "0033" in JP2013-111835A. The triazine compound is a compound having a triazine ring, and specific examples thereof include various triazine-based ultraviolet absorbers described in paragraph "0033" in JP2013-11835A. The content of the ultraviolet absorber in the resin film is, for example, about 0.1 to 10 parts by mass with respect to 100 parts by mass of the resin contained in the film, but is not particularly limited. Regarding the ultraviolet absorber, paragraph "0032" in JP2013-111835A can also be referred to. In the present specification, ultraviolet rays mean the light having a central emission wavelength in a wavelength range of 200 to 380 nm.

The film thickness of the support is preferably equal to or greater than 50 µm, more preferably equal to or greater than 70 µm, even more preferably equal to or greater than 75 µm, and particularly preferably equal to or greater than 80 µm. In a case where the film thickness is equal to or greater than 50 µm, the pencil hardness and the keystroke resistance can be further improved. The upper limit of the film thickness is not particularly limited, but is preferably equal to or smaller than 400 μm, more preferably equal to or smaller than 350 μm, and even more preferably equal to or smaller than 300 μm.

In a case where the support has at least outer layers and a core layer, in an embodiment, the outer layers each independently has a film thickness equal to or greater than 15 μm and less than 60 μm for example. In another embodiment, the film thickness of each of the outer layers is equal to or greater than 3 μm and less than 60 μm, for example.

<First Cured Layer and Curable Composition for Forming First Cured Layer>

The first cured layer of the present invention is formed of the curable composition for forming a first cured layer.

The curable composition for forming a first cured layer contains a polymerizable compound 1 having a radically polymerizable group and a polymerizable compound 2 which has a cationically polymerizable group and a radically polymerizable group in the same molecule and is different from the polymerizable compound 1. The content of the polymerizable compound 2 with respect to the total content of the polymerizable compounds contained in the curable composition for forming a first cured layer is equal to or greater than 51% by mass.

<<Polymerizable Compound 1>>

The polymerizable compound 1 used in the present invention has a radically polymerizable group. The polymerizable compound 1 used in the present invention is a compound different from the polymerizable compound 2. That is, the polymerizable compound 1 used in the present invention is a polymerizable compound other than a compound having a cationically polymerizable group and a radically polymerizable group in the same molecule.

The polymerizable compound 1 may have a high molecular weight (for example, a molecular weight equal to or greater than 2,000) or a low molecular weight (for example, a molecular weight less than 2,000). However, it is preferable that the polymerizable compound 1 has a low molecular weight. In a case where the low-molecular weight polymerizable compound 1 is used, the moiety other than the radically polymerizable group is reduced, and hence the pencil hardness of the hardcoat film can be more effectively improved. Specifically, the molecular weight of the polymerizable compound 1 is preferably equal to or smaller than 1.500, more preferably equal to or smaller than 1,200, and even more preferably equal to or smaller than 1,000. The lower limit of the molecular weight of the polymerizable compound 1 is preferably equal to or greater than 100 and more preferably equal to or greater than 120. In a case where the lower limit is within the above range, it is possible to more effectively inhibit the volatilization of the polymerizable compound 1 at the time of forming the first cured layer.

Although the polymerizable compound 1 may have one radically polymerizable group, the number of radically polymerizable groups in the same molecule is preferably equal to or greater than 2, more preferably equal to or greater than 3, even more preferably equal to or greater than 4, and particularly preferably equal to or greater than 6. In a case where the polymerizable compound 1 has two or more radically polymerizable groups in the same molecule, the pencil hardness and the adhesiveness can be more effectively improved. The upper limit of the number of radically polymerizable groups of the polymerizable compound 1 is not particularly limited. Even though the polymerizable compound 1 has 10 or less radically polymerizable groups in the same molecule, the effects of the present invention can be sufficiently achieved.

As the radically polymerizable group that the polymerizable compound 1 has, a styryl group and a (meth)acryl group are preferable, a (meth)acryl group is more preferable, and a (meth)acryloyloxy group is even more preferable. As the (meth)acryl group, a methacryl group is preferable.

As the polymerizable compound 1, a (meth)acrylate-based compound is preferably used. As the (meth)acrylate-based compound, it is possible to adopt the compounds that are used for forming a cured substance having high hardness in the technical field of the present invention.

Examples of the (meth)acrylate-based compound include esters of a polyhydric alcohol and (meth)acrylic acid.

Examples of the esters of a polyhydric alcohol and (meth)acrylic acid include ethylene glycol di(meth)acrylate, diethylene glycol di(meth)acrylate, butanediol di(meth)acrylate, hexanediol di(meth)acrylate, 1,4-cyclohexane diacrylate, pentaerythritol tetra(meth)acrylate, pentaerythritol tri(meth)acrylate, trimethylolpropane tri(meth)acrylate, ethylene oxide (EO)-modified trimethylolpropane tri(meth)acrylate, propylene oxide (PO)-modified trimethylolpropane tri(meth)acrylate, EO-modified phosphoric acid tri(meth)acrylate, trimethylolethane tri(meth)acrylate, ditrimethylolpropane tetra(meth)acrylate, dipentaerythritol tetra(meth)acrylate, dipentaerythritol penta(meth)acrylate, dipentaerythritol hexa(meth)acrylate, pentaerythritol hexa(meth)acrylate, 1,2,3-cyclohexane tetramethacrylate, polyurethane polyacrylate, polyester polyacrylate, caprolactone-modified tris(acryloxyethyl)isocyanurate, and the like.

As the aforementioned (meth)acrylate-based compound, a compound (urethane (meth)acrylate) having the aforementioned (meth)acryloyl group and one or more urethane bonds in one molecule is also preferable.

Commercial products of the urethane (meth)acrylate are not particularly limited, and examples thereof include UA-306H, UA-306I, UA-306T, UA-510H, UF-8001G, UA-101I, UA-101T, AT-600, AH-600, and AI-600 manufactured by KYOEISHA CHEMICAL Co., LTD., U-4HA, U-6HA, U-6LPA, UA-32P, U-15HA, and UA-1100H manufactured by SHIN-NAKAMURA CHEMICAL CO., LTD., SHIKOH UV-1400B, SHIKOH UV-1700B, SHIKOH UV-6300B, SHIKOH UV-7550B, SHIKOH UV-7600B, SHIKOH UV-7605B, SHIKOH UV-7610B, SHIKOH UV-7620EA, SHIKOH UV-7630B, SHIKOH UV-7640B, SHIKOH UV-6630B, SHIKOH UV-7000B, SHIKOH UV-7510B, SHIKOH UV-7461TE, SHIKOH UV-3000B, SHIKOH UV-3200B, SHIKOH UV-3210EA, SHIKOH UV-3310EA, SHIKOH UV-3310B, SHIKOH UV-3500BA, SHIKOH UV-3520TL, SHIKOH UV-3700B, SHIKOH UV-6100B, SHIKOH UV-6640B, SHIKOH UV-2000B, SHIKOH UV-2010B, SHIKOH UV-2250EA, and SHIKOH UV-2750B manufactured by NIPPON GOHSEI, UL-503LN manufactured by KYOEISHA CHEMICAL Co., LTD., UNIDIC 17-806, UNIDIC 17-813, UNIDIC V-4030, and UNIDIC V-4000BA manufactured by DIC Corporation, EB-1290K manufactured by Daicel-Allnex, Ltd., HI-COAP AU-2010 and HI-COAP AU-2020 manufactured by TOKUSHIKI Co., Ltd., and the like.

As specific examples of the urethane (meth)acrylate, the following example compounds A-1 to A-8 are also preferable.

A-1
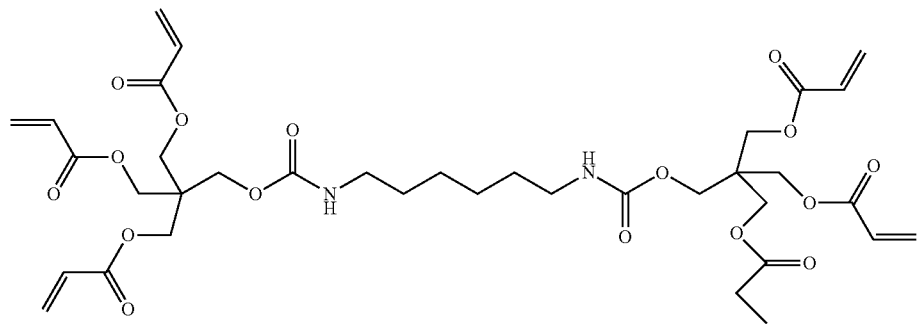
A-2
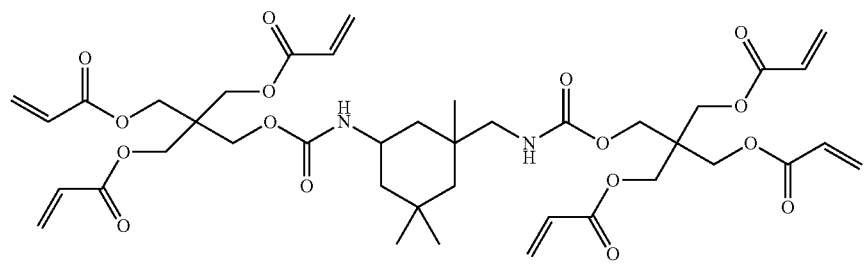
A-3
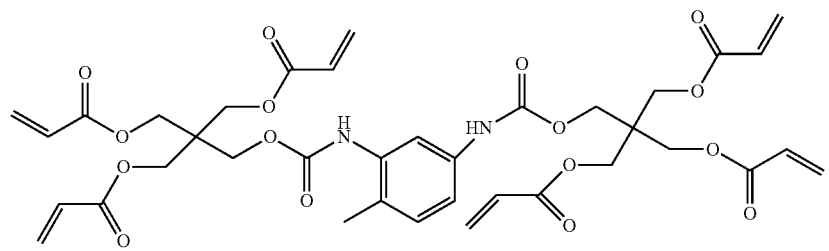
A-4
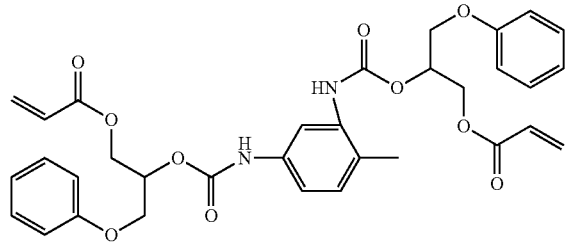
A-5
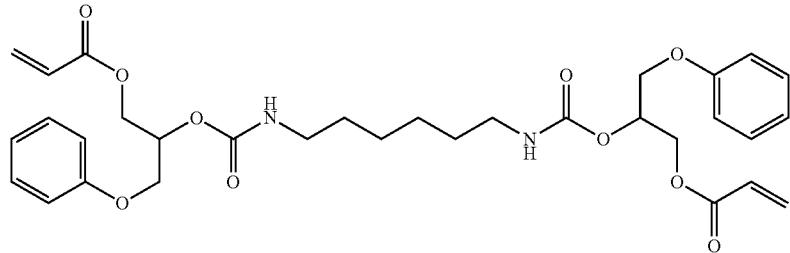
A-6
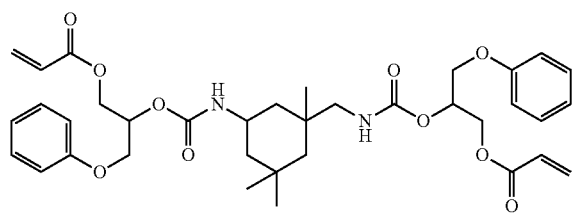
A-7
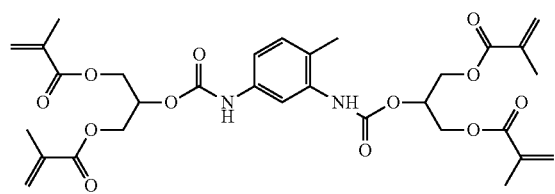

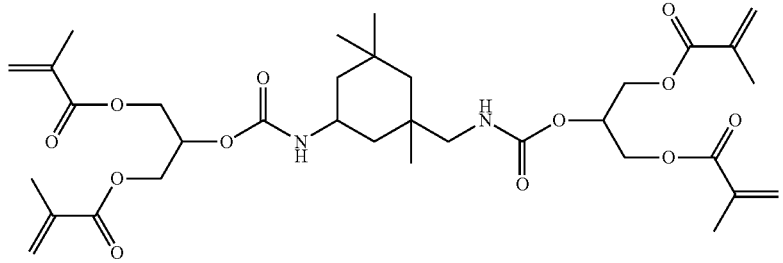

A-8

In a case where the polymerizable compound 1 is a (meth)acrylate-based compound which does not have a urethane bond, examples of the compound also include the following ones, but the present invention is not limited to the following example compounds.

Examples of the (meth)acrylate-based compound include bifunctional (meth)acrylate compounds such as polyethylene glycol 200 di(meth)acrylate, polyethylene glycol 300 di(meth)acrylate, polyethylene glycol 400 di(meth)acrylate, polyethylene glycol 600 di(meth)acrylate, triethylene glycol di(meth)acrylate, epichlorohydrin-modified ethylene glycol di(meth)acrylate (as a commercial product, for example, DENACOL DA-811 manufactured by NAGASE & CO., LTD, or the like), polypropylene glycol 200 di(meth)acrylate, polypropylene glycol 400 di(meth)acrylate, polypropylene glycol 700 di(meth)acrylate, Ethylene Oxide (EO) .Propylene Oxide (PO) block polyether di(meth)acrylate (as a commercial product, for example, a BLEMMER PET series manufactured by NOF CORPORATION or the like), dipropylene glycol di(meth)acrylate, bisphenol A EO addition-type di(meth)acrylate (as a commercial product, for example, M-210 manufactured by TOAGOSEI CO., LTD. NK ESTER A-BPE-20 manufactured by SHIN-NAKAMURA CHEMICAL CO., LTD., or the like), hydrogenated bisphenol A EO addition-type di(meth)acrylate (such as NK ESTER A-HPE-4 manufactured by SHIN-NAKAMURA CHEMICAL CO., LTD.), bisphenol A PO-addition type di(meth)acrylate (as a commercial product, for example, LIGHT ACRYLATE BP-4PA manufactured by KYOEISHA CHEMICAL Co., LTD., or the like), bisphenol A epichlorohydrin addition-type di(meth)acrylate (as a commercial product, for example, EBECRYL 150 manufactured by Daicel-Allnex, Ltd., or the like), bisphenol A EOPO addition-type di(meth)acrylate (as a commercial product, for example, BP-023-PE manufactured by TOHO Chemical Industry Co., Ltd., or the like), bisphenol F EO addition-type di(meth)acrylate (as a commercial product, for example, ARONIX M-208 manufactured by TOAGOSEI CO., LTD., or the like), 1,6-hexanediol di(meth)acrylate, 1,6-hexanediol di(meth)acrylate modified with epichlorohydrin, neopentyl glycol di(meth)acrylate, hydroxypivalic acid neopentyl glycol di(meth)acrylate, hydroxypivalic acid neopentyl glycol di(meth)acrylate modified with caprolactone, 1,4-butanediol di(meth)acrylate, 1,9-nonanediol di(meth)acrylate, trimethylolpropane di(meth)acrylate, tricyclodecane dimethanol di(meth)acrylate, pentaerythritol di(meth)acrylate monostearate, trimethylolpropane acrylic acid-benzoic acid ester, and isocyanuric acid EO-modified di(meth)acrylate (as a commercial product, for example, ARONIX M-215 manufactured by TOAGOSEI CO., LTD., or the like).

Examples of the (meth)acrylate-based compound also include trifunctional (meth)acrylate compounds such as trimethylolpropane tri(meth)acrylate, trimethylolpropane tri(meth)acrylate modified with EO, PO, or epichlorohydrin, pentaerythritol tri(meth)acrylate, glycerol tri(meth)acrylate, glycerol tri(meth)acrylate modified with EO, PO, or epichlorohydrin, isocyanuric acid EO-modified tri(meth)acrylate (as a commercial product, for example, ARONIX M-315 manufactured by TOAGOSEI CO., LTD., or the like), tris(meth)acryloyloxyethyl phosphate, (2,2,2-tri-(meth)acryloyloxymethyl)ethyl hydrogen phthalate, glycerol tri(meth)acrylate, and glycerol tri(meth)acrylate modified with EO, PO, or epichlorohydrin; tetrafunctional (meth)acrylate compounds such as pentaerythritol tetra(meth)acrylate, pentaerythritol tetra(meth)acrylate modified with EO, PO, or epichlorohydrin, and ditrimethylolpropane tetra(meth)acrylate; pentafunctional (meth)acrylate compounds such as dipentaerythritol penta(meth)acrylate and dipentaerythritol penta(meth)acrylate modified with EO, PO, epichlorohydrin, a fatty acid, or alkyl; and hexafunctional (meth)acrylate compounds such as dipentaerythritol hexa(meth)acrylate, dipentaerythritol hexa(meth)acrylate modified with EO, PO, epichlorohydrin, a fatty acid, or alkyl, sorbitol hexa(meth)acrylate, and sorbitol hexa(meth)acrylate modified with EO, PO, epichlorohydrin, a fatty acid, or alkyl.

As the (meth)acrylate-based compound which is the polymerizable compound 1, polyester (meth)acrylate or epoxy (meth)acrylate having a weight-average molecular weight equal to or greater than 200 and less than 1,000 is also preferable.

Examples thereof include commercial polyester (meth)acrylate products such as a BEAMSET (trade name) 700 series, that is, BEAMSET 700 (hexafunctional), BEAMSET 710 (tetrafunctional), and BEAMSET 720 (trifunctional) manufactured by Arakawa Chemical Industries, Ltd., and the like.

Specific examples of the (meth)acrylate-based compound as the polymerizable compound 1 include (meth)acrylate-based compounds having three or more (meth)acryloyl groups other than the above compounds as preferred aspects.

Examples of the (meth)acrylate-based compound having three or more (meth)acryloyl groups also include the following example compounds A-9 to A-11.

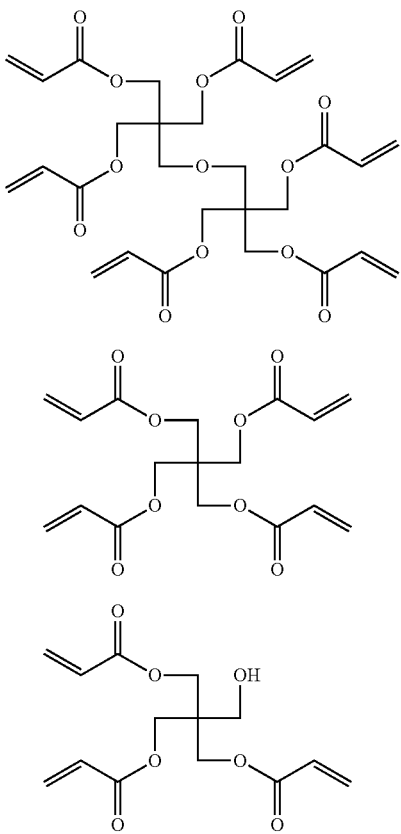

A-9

A-10

A-11

Examples of the (meth)acrylate-based compound having three or more (meth)acryloyl groups include the example compounds described in paragraph "0096" in JP2007-256844A.

Furthermore, as specific (meth)acrylate-based compounds having three or more (meth)acryloyl groups, it is possible to suitably use KAYARAD DPHA, KAYARAD DPHA-2C, KAYARAD PET-30, KAYARAD TMPTA, KAYARAD TPA-320, KAYARAD TPA-330, KAYARAD RP-1040, KAYARAD T-1420, KAYARAD D-310, KAYARAD DPCA-20, KAYARAD DPCA-30, KAYARAD DPCA-60, and KAYARAD GPO-303 manufactured by Nippon Kayaku Co., Ltd., and compounds obtained by esterifying a polyol and (meth)acrylic acid, such as V #400 and V #36095D manufactured by OSAKA ORGANIC CHEMICAL INDUSTRY LTD. Furthermore, it is possible to suitably use urethane acrylate compounds having three or more functional groups, such as SHIKOH UV-1400B, SHIKOH UV-1700B, SHIKOH UV-6300B, SHIKOH UV-7550B, SHIKOH UV-7600B, SHIKOH UV-7605B, SHIKOH UV-7610B, SHIKOH UV-7620EA, SHIKOH UV-7630B, SHIKOH UV-7640B, SHIKOH UV-6630B, SHIKOH UV-7000B, SHIKOH UV-7510B, SHIKOH UV-7461TE, SHIKOH UV-3000B, SHIKOH UV-3200B, SHIKOH UV-3210EA, SHIKOH UV-3310EA, SHIKOH UV-3310B, SHIKOH UV-3500BA, SHIKOH UV-3520TL, SHIKOH UV-3700B, SHIKOH UV-6100B, SHIKOH UV-6640B, SHIKOH UV-2000B, SHIKOH UV-2010B, SHIKOH UV-2250EA, and SHIKOH UV-2750B (manufactured by NIPPON GOHSEI), UL-503LN (manufactured by KYOEISHA CHEMICAL Co., LTD), UNIDIC 17-806, UNIDIC 17-813, UNIDIC V-4030, and UNIDIC V-4000BA (manufactured by DIC Corporation), EB-1290K, EB-220. EB-5129, EB-1830, and EB-4358 (manufactured by Daicel-Allnex, Ltd.), HI-COAP AU-2010 and HI-COAP AU-2020 (manufactured by TOKUSHIKI Co., Ltd.), ARONIX M-1960 (manufactured by TOAGOSEI CO., LTD.), ART RESIN UN-3320HA, UN-3320HC, UN-3320HS, UN-904, and HDP-4T, polyester compounds having three or more functional groups such as ARONIX M-8100, M-8030, and M-9050 (manufactured by TOAGOSEI CO., LTD.) and KBM-8307 (manufactured by Daicel SciTech), and the like.

In the present invention, it is preferable that the polymerizable compound 1 is at least one kind of compound selected from dipentaerythritol pentaacrylate, dipentaerythritol hexaacrylate, pentaerythritol triacrylate, and diethylene glycol di(meth)acrylate. Examples of commercial products of these include those described later in examples.

One kind of polymerizable compound 1 or two or more kinds of polymerizable compounds 1 may be used. Examples of a blend of two or more kinds of polymerizable compounds 1 include a combination of dipentaerythritol pentaacrylate and dipentaerythritol hexaacrylate.

The content of the polymerizable compound 1 with respect to the total content of the polymerizable compounds contained in the curable composition for forming a first cured layer is preferably equal to or smaller than 49% by mass, and more preferably equal to or smaller than 45% by mass. The content of the polymerizable compound 1 may be equal to or smaller than 35% by mass. In a case where the content of the polymerizable compound 1 is equal to or smaller than 49% by mass, the punching properties can be more effectively improved. The lower limit of the content of the polymerizable compound 1 is preferably equal to or greater than 5% by mass, more preferably equal to or greater than 8% by mass, even more preferably equal to or greater than 10% by mass, and still more preferably equal to or greater than 25% by mass. In a case where the lower limit is equal to or greater than 5% by mass, the adhesiveness and the pencil hardness can be more effectively improved.

The curable composition for forming a first cured layer may contain only one kind of polymerizable compound 1 or two or more kinds of polymerizable compounds 1. In a case where the curable composition contains two or more kinds of polymerizable compounds 1, it is preferable that the total amount of the compounds is within the above range.

<<Polymerizable Compound 2>>

The polymerizable compound 2 used in the present invention is a polymerizable compound which has a cationically polymerizable group and a radically polymerizable group in the same molecule and is different from the polymerizable compound 1. In a case where the polymerizable compound having a cationically polymerizable group and a radically polymerizable group is used, the punching properties and the adhesiveness can be improved.

The polymerizable compound 2 is preferably a compound having a molecular weight less than 10,000, and more preferably a low-molecular weight compound. In a case where the low-molecular weight polymerizable compound 2 is used, the moiety other than the cationically polymerizable group or the radically polymerizable group is reduced, and hence the punching properties and the adhesiveness of the hardcoat film can be more effectively improved. Specifically, the molecular weight of the polymerizable compound 2 is preferably equal to or smaller than 400, more preferably equal to or smaller than 300, and even more preferably equal to or smaller than 250. The lower limit of the molecular weight of the polymerizable compound 2 is preferably equal to or greater than 100, and more preferably equal to or greater than 120. In a case where the lower limit is within the above range, it is possible to more effectively inhibit the volatilization of the polymerizable compound 2 at the time of forming the first cured layer.

The number of cationically polymerizable groups in one molecule of the polymerizable compound 2 is preferably large, and more preferably 1 to 10. The number of radically polymerizable groups in one molecule of the polymerizable compound 2 is preferably large, and more preferably 1 to 10. A ratio of the number of cationically polymerizable groups to the number of radically polymerizable groups in one molecule of the polymerizable compound 2 (number of cationically polymerizable groups/number of radically polymerizable groups) is preferably 0.5 to 2.0, and more preferably 0.8 to 1.2. In a case where the ratio is within the above range, the punching properties, the adhesiveness, and the scratch resistance can be improved in a well-balanced manner.

As the cationically polymerizable group that the polymerizable compound 2 has, an oxetane group and an epoxy group are preferable, an epoxy group is more preferable, and an alicyclic epoxy group is even more preferable. Examples of the cyclic structure included in the alicyclic epoxy group include structures of a cyclo ring, a dicyclo ring, and a tricyclo ring. Specific examples thereof include a dicyclopentanyl ring, a cyclohexane ring, and the like.

As the radically polymerizable group that the polymerizable compound 2 has, a styryl group and a (meth)acryl group are preferable, a (meth)acryl group is more preferable, and a (meth)acryloyloxy group is even more preferable. As the (meth)acryl group, a methacryl group is preferable.

It is preferable that the polymerizable compound 2 has one alicyclic epoxy group and one radically polymerizable group in the same molecule.

As the polymerizable compound 2, a compound represented by General Formula (1) shown below is more preferable.

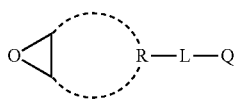

(1)

In General Formula (1), R represents monocyclic hydrocarbon or cross-linked hydrocarbon, L represents a single bond or a divalent linking group, and Q represents a radically polymerizable group.

In a case where R in General Formula (1) is monocyclic hydrocarbon, the monocyclic hydrocarbon is preferably alicyclic hydrocarbons. Among these, an alicyclic group having 4 to 10 carbon atoms is more preferable, an alicyclic group having 5 to 7 carbon atoms is even more preferable, and an alicyclic group having 6 carbon atoms is particularly preferable. Specifically, a cyclobutyl group, a cyclopentyl group, a cyclohexyl group, and a cycloheptyl group are preferable, and a cyclohexyl group is particularly preferable.

In a case where R in General Formula (1) is cross-linked hydrocarbon, a bicyclic crosslink (bicyclo ring) and a tricyclic crosslink (tricyclo ring) are preferable. Examples thereof include cross-linked hydrocarbon having 5 to 20 carbon atoms, such as a norbornyl group, a bornyl group, an isobornyl group, a tricyclodecyl group, a dicyclopentenyl group, dicyclopentanyl group, a tricyclopentenyl group, a tricyclopentanyl group, an adamantyl group, an adamantyl group substituted with a lower alkyl group, and the like.

In a case where L represents a divalent linking group, a divalent aliphatic hydrocarbon group is preferable. The number of carbon atoms in the divalent aliphatic hydrocarbon group is preferably 1 to 6, more preferably 1 to 3, and even more preferably 1. The divalent aliphatic hydrocarbon group is preferably a linear, branched, or cyclic alkylene group, more preferably a linear or branched alkylene group, and even more preferably a linear alkylene group.

The radically polymerizable group represented by Q has the same definition as the aforementioned radically polymerizable group, and the preferred range thereof is also the same.

Specific examples of the polymerizable compound 2 include the alicyclic epoxy group-containing (meth)acrylate described in paragraph "0015" in JP1998-17614A (JP-H10-17614A) and a compound represented by General Formula (1A) or (1B) shown below. Among these, the compound represented by General Formula (1A) or (1B) is more preferable, and the compound represented by General Formula (1A) having a low molecular weight is even more preferable. An isomer of the compound represented by General Formula (1A) is also preferable. In General Formula (1A), $L_2$ represents a divalent aliphatic hydrocarbon group having 1 to 6 carbon atoms. The number of carbon atoms is more preferably 1 to 3. From the viewpoint of effectively improving the punching properties, the number of carbon atoms is even more preferably 1 (that is, the polymerizable compound 2 is even more preferably epoxycyclohexyl methyl (meth)acrylate).

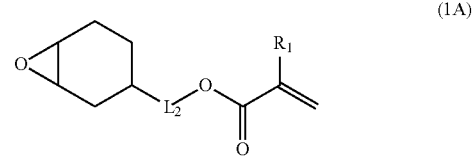

(1A)

In General Formula (1A), $R_1$ represents a hydrogen atom or a methyl group, and $L_2$ represents a divalent aliphatic hydrocarbon group having 1 to 6 carbon atoms.

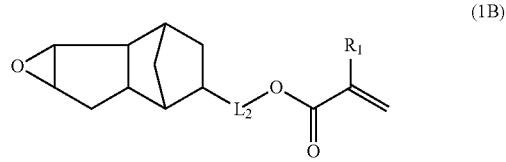

(1B)

In General Formula (1B), $R_1$ represents a hydrogen atom or a methyl group, and $L_2$ represents a divalent aliphatic hydrocarbon group having 1 to 6 carbon atoms.

The number of carbon atoms in the divalent aliphatic hydrocarbon group represented by $L_2$ in General Formulae (1A) and (1B) is 1 to 6, more preferably 1 to 3, and even more preferably 1. The divalent aliphatic hydrocarbon group is preferably a linear, branched, or cyclic alkylene group, more preferably a linear or branched alkylene group, and even more preferably a linear alkylene group.

In the present invention, it is particularly preferable that the polymerizable compound 2 is at least one kind of compound selected from glycidyl (meth)acrylate and epoxycyclohexyl methyl methacrylate.

The polymerizable compound 2 can be synthesized by known methods.

Furthermore, commercial products are available as the polymerizable compound 2. Examples of the commercial products include CYCLOMER M100 manufactured by Daicel Corporation, LIGHT ESTER G (trade name) manufactured by KYOEISHA CHEMICAL Co., LTD, 4HBAGE manufactured by Nippon Kasei Chemical Co., Ltd, an SP series (trade name) such as SP-1506, 500, SP-1507, 480 and a VR series such as VR-77 manufactured by Showa Highpolymer Co., Ltd., EA-1010/ECA, EA-11020, EA-1025, EA-6310/ECA (trade names) manufactured by SHIN-NAKAMURA CHEMICAL CO., LTD., and the like.

The content of the polymerizable compound 2 with respect to the total content of polymerizable compounds contained in the curable composition for forming a first cured layer is equal to or greater than 51% by mass, preferably equal to or greater than 55% by mass, and more preferably equal to or greater than 65% by mass. In a case where the content of the polymerizable compound 2 is within the above range, a hardcoat film having excellent punching properties is obtained. The upper limit of the content of the polymerizable compound 2 is preferably equal to or smaller than 99% by mass, more preferably equal to or smaller than 92% by mass, and even more preferably equal to or smaller than 90% by mass. The upper limit may be equal to or smaller than 80% by mass.

The curable composition for forming a first cured layer may contain only one kind of polymerizable compound 2 or two or more kinds of polymerizable compounds 2. In a case where the curable composition contains two or more kinds of polymerizable compounds 2, it is preferable that the total amount of the compounds is within the above range.

<<Another Polymerizable Compound>>

The curable composition for forming a first cured layer may contain another polymerizable compound different from the polymerizable compound 1 and the polymerizable compound 2.

The aforementioned another polymerizable compound is preferably a polymerizable compound having a cationically polymerizable group. The cationically polymerizable group has the same definition as the cationically polymerizable group described regarding the polymerizable compound 2, and the preferred range thereof is also the same. In the present invention, as the aforementioned another polymerizable compound, a compound containing a nitrogen-containing heterocyclic ring containing a cationically polymerizable group is preferable. In a case where such a compound is used, the adhesiveness between the support and the first cured layer can be more effectively improved. Examples of the nitrogen-containing heterocyclic ring include a nitrogen-containing heterocyclic ring selected from the group consisting of an isocyanurate ring (nitrogen-containing heterocyclic ring contained in example compounds B-1 to B-3 which will be described later) and a glycoluril ring (nitrogen-containing heterocyclic ring contained in an example compound B-10 which will be described later). Among these, an isocyanurate ring is more preferable. The number of cationic groups of the aforementioned another polymerizable compound is preferably 1 to 10, and more preferably 2 to 5. In a case where a polymerizable compound having a cationically polymerizable group and a nitrogen-containing heterocyclic ring structure is used as the aforementioned another polymerizable compound, as the support, a support including an acrylic resin film is preferable. In a case where the aforementioned constitution is adopted, the adhesiveness between the support and the first cured layer tends to be further improved.

Specific examples of the aforementioned another polymerizable compound include the example compounds B-1 to B-10 shown below, but the present invention is not limited to the following specific examples.

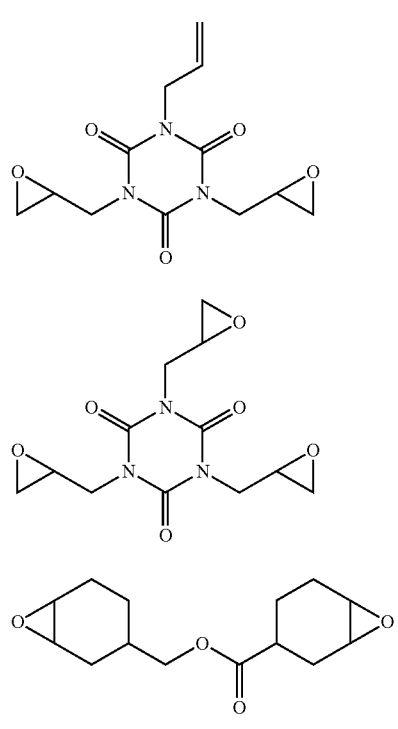

B-7
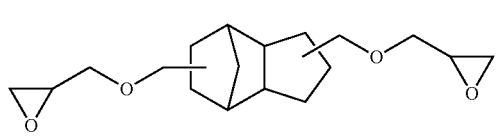

B-8
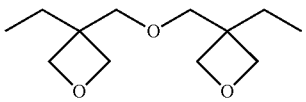

B-9
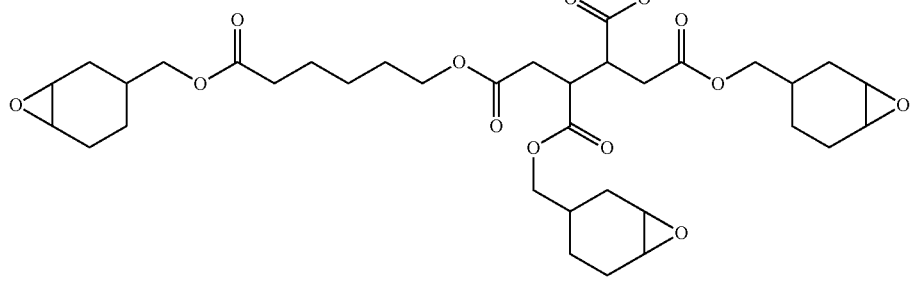

B-10
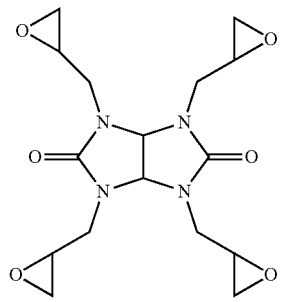

As the aforementioned another polymerizable compound, commercial products may also be used. Examples thereof include 3,4-epoxycyclohexylmethyl-3',4'-epoxycyclohexane carboxylate (for example, commercial products such as UVR 6105 and UVR 6110 manufactured by Union Carbide Corporation and CELLOXIDE 2021P manufactured by Daicel Corporation), bis(3,4-epoxycyclohexylmethyl)adipate (such as UVR 6128 manufactured by Union Carbide Corporation), vinylcyclohexene monoepoxide (such as CELLOXIDE 2000 manufactured by DAICEL CORPORATION), ε-caprolactam-modified 3,4-epoxycyclohexylmethyl 3',4'-epoxycyclohexane carboxylate (such as CELLOXIDE 2081 manufactured by DAICEL CORPORATION), and the like.

In a case where the curable composition for forming a first cured layer contains the aforementioned another polymerizable compound (particularly, a polymerizable compound having a cationically polymerizable group), the content of the aforementioned another polymerizable compound with respect to the total content of the polymerizable compounds contained in the curable composition for forming a first cured layer is preferably equal to or smaller than 20% by mass, more preferably equal to or smaller than 15% by mass, particularly preferably equal to or smaller than 10% by mass, and more particularly preferably equal to or smaller than 5% by mass. In a case where the curable composition contains the aforementioned another polymerizable compound, the lower limit of the content of the compound is preferably equal to or greater than 1% by mass, and more preferably equal to or greater than 3% by mass.

The curable composition for forming a first cured layer may contain only one kind of another polymerizable compound described above or two or more kinds of other polymerizable compounds. In a case where the curable composition contains two or more kinds of other polymerizable compounds, it is preferable that the total amount thereof is within the above range.

In the present invention, it is also possible to adopt a constitution in which the curable composition for forming a first cured layer substantially does not contain the aforementioned another polymerizable compound. "Substantially does not contain" means, for example, that the content of the aforementioned another polymerizable compound with respect to the total content of the polymerizable compounds contained in the curable composition for forming a first cured layer is less than 1% by mass. The content of the aforementioned another polymerizable compound is preferably 0% by mass (hereinafter, the same shall be applied to "substantially does not contain").

<<Inorganic Particles>>

It is preferable that the curable composition for forming a first cured layer contains inorganic particles. In a case where the curable composition contains inorganic particles, the pencil hardness-improving effect is more effectively achieved.

The inorganic particles usable in the curable composition for forming a first cured layer are not particularly limited, and examples thereof include silica particles, zirconia particles, and alumina particles. Among these, silica particles are preferable.

Commercial products may be used as the inorganic particles. For example, MEK-AC-2140Z (manufactured by NISSAN CHEMICAL INDUSTRIES, LTD.) can be used.

In a case where the curable composition for forming a first cured layer contains the inorganic particles, the content of the inorganic particles with respect to the solid content in the curable composition for forming a first cured layer is preferably equal to or smaller than 20% by mass, and more preferably equal to or smaller than 17% by mass. The lower limit of the content is preferably equal to or greater than 1% by mass, and more preferably equal to or greater than 7% by mass.

In the present invention, high surface hardness is expressed mainly because of the second cured layer, and hence the surface hardness can be maintained even though the first cured layer is flexible. Accordingly, a constitution can also be adopted in which the curable composition for forming a first cured layer substantially does not contain inorganic particles.

<<Polymerization Initiator>>

It is preferable that the curable composition for forming a first cured layer contains a polymerization initiator. The polymerization initiator may be a photopolymerization initiator or a thermal polymerization initiator.

Examples of the polymerization initiator include a radical polymerization initiator and a cationic polymerization initiator. In a case where a radical polymerization initiator is mixed with the curable composition, the polymerization reaction of the radically polymerizable group can be accelerated. In a case where a cationic polymerization initiator is mixed with the curable composition, the polymerization reaction of the cationically polymerizable group can be accelerated.

The curable composition for forming a first cured layer preferably contains at least one of the radical polymerization initiator and the cationic polymerization initiator, and more preferably contains both of the radical polymerization initiator and the cationic polymerization initiator.

Hereinafter, the polymerization initiators will be sequentially described.

<<<Radical Polymerization Initiator>>>

The radical polymerization initiator is preferably a radical photopolymerization initiator.

The radical photopolymerization initiator is not limited as long as it can generate a radical as an active species by light irradiation, and known radical photopolymerization initiators can be used without any limitation. Specific examples thereof include acetophenones such as diethoxyacetophenone, 2-hydroxy-2-methyl-1-phenylpropan-1-one, benzyl dimethyl ketal, 4-(2-hydroxyethoxy)phenyl-(2-hydroxy-2-propyl)ketone, 1-hydroxycyclohexyl phenyl ketone, 2-methyl-2-morpholino(4-thiomethylphenyl)propan-1-one, 2-benzyl-2-dimethylamino-1-(4-morpholinophenyl)butanone, a 2-hydroxy-2-methyl-1-[4-(1-methylvinyl)phenyl] propane oligomer, and 2-hydroxy-1-{4-[4-(2-hydroxy-2-methyl-propionyl)-benzyl]phenyl}-2-methyl-propan-1-one; oxime esters such as 1,2-octanedione, 1-[4-(phenylthio)-,2-(O-benzyloxime)], and ethanone, 1-[9-ethyl-6-(2-methyl-benzoyl)-9H-carbazol-3-yl]-, 1-(O-acetyloxime); benzoins such as benzoin, benzoin methyl ether, benzoin ethyl ether, benzoin isopropyl ether, and benzoin isobutyl ether; benzophenones such as benzophenone, methyl o-benzoyl benzoate, 4-phenylbenzophenone, 4-benzoyl-4'-methyl-diphenyl sulfide, 3,3',4,4'-tetra(t-butylperoxycarbonyl)benzophenone, 2,4,6-trimethylbenzophenone, 4-benzoyl-N,N-dimethyl-N-[2-(1-oxo-2-propenyloxy)ethyl]benzene methanaminium bromide, and (4-benzoylbenzyl)trimethyl ammonium chloride; thioxanthones such as 2-isopropylthioxanthone, 4-isopropylthioxanthone, 2,4-diethylthioxanthone, 2,4-dichlorothioxanthone, 1-chloro-4-propoxythioxanthone, and 2-(3-dimethylamino-2-hydroxy)-3,4-dimethyl-9H-thioxanthon-9-one methochloride; acylphosphine oxides such as 2,4,6-trimethylbenzoyl-diphenylphosphine oxide, bis(2,6-dimethoxy benzoyl)-2,4,4-trimethyl-pentylphosphine oxide, and bis(2,4,6-trimethylbenzoyl)-phenylphosphine oxide; and the like. Furthermore, as an aid for the radical photopolymerization initiator, triethanolamine, triisopropanolamine, 4,4'-dimethylaminobenzophenone (Michler's ketone), 4,4'-diethylaminobenzophenone, 2-dimethylaminoethyl benzoate, ethyl 4-dimethylaminobenzoate, (n-butoxy) ethyl 4-dimethylaminobenzoate, isoamyl 4-dimethylaminobenzoate, 2-ethylhexyl 4-dimethylaminobenzoate, 2,4-diethylthioxanthone, 2,4-diisopropylthioxanthone, and the like may be used in combination.

The aforementioned radical photopolymerization initiators and aids can be synthesized by known methods or can be obtained as commercial products.

Examples of commercial products of the radical photopolymerization initiators include IRGACURE (registered trademark) 184 (radical photopolymerization initiator based on 1-hydroxy-cyclohexyl-phenyl-ketone, α-hydroxyalkylphenone, manufactured by BASF SE).

The content of the radical polymerization initiator may be appropriately adjusted within a range in which the polymerization reaction (radical polymerization) of the radically polymerizable compound excellently proceeds, and is not particularly limited. The content with respect to the solid content in the curable composition for forming a first cured layer is preferably 1% to 8% by mass, and more preferably 3% to 5% by mass.

The curable composition for forming a first cured layer may contain only one kind of radical polymerization initiator or two or more kinds of radical polymerization initiators. In a case where the curable composition contains two or more kinds of radical polymerization initiators, it is preferable that the total amount thereof is within the above range.

<<<Cationic Polymerization Initiator>>>

The cationic polymerization initiator is preferably a cationic photopolymerization initiator.

The cationic photopolymerization initiator is not limited as long as it can generate a cation as an active species by light irradiation, and known cationic photopolymerization initiators can be used without any limitation. Specific examples thereof include a sulfonium salt, an ammonium salt, an iodonium salt (for example, a diaryl iodonium salt), a triaryl sulfonium salt, a diazonium salt, an iminium salt, and the like that are known. More specifically, examples thereof include the cationic photopolymerization initiators represented by Formulae (25) to (28) shown in paragraphs "0050" to "0053" in JP1996-143806A (JP-H08-143806A), the compounds exemplified as cationic polymerization catalysts in paragraph "0020" in JP1996-283320A (JP-H08-283320A), and the like. The contents of the aforementioned publications are incorporated into the present specification. The cationic photopolymerization initiator can be synthesized by a known method, or can be obtained as a commercial product. Examples of the commercial product include CI-1370, CI-2064, CI-2397, CI-2624, CI-2639, CI-2734, CI-2758. CI-2823, CI-2855, CI-5102, and the like manufactured by NIPPON SODA CO., LTD., PHOTOINITIATOR 2047 and the like manufactured by Rhodia, UVI-6974 and UVI-6990 manufactured by Union Carbide Corporation, CPI-10P manufactured by San-Apro Ltd., and the like.

In view of the sensitivity of the photopolymerization initiator with respect to light, the compound stability, and the like, a diazonium salt, an iodonium salt, a sulfonium salt, and an iminium salt are preferable as the cationic photopolymerization initiator. In view of weather fastness, an iodonium salt is most preferable.

Specific examples of commercial products of the iodonium salt-based cationic photopolymerization initiator include B2380 manufactured by TOKYO CHEMICAL INDUSTRY CO., LTD., BBI-102 manufactured by Midori Kagaku Co., Ltd., WPI-113 manufactured by Wako Pure Chemical Industries, Ltd., WPI-124 manufactured by Wako Pure Chemical Industries, Ltd., WPI-169 manufactured by Wako Pure Chemical Industries, Ltd., WPI-170 manufactured by Wako Pure Chemical Industries, Ltd., and DTBPI-PFBS manufactured by Toyo Gosei Co., Ltd.

Specific examples of iodonium salt compounds which can be used as the cationic photopolymerization initiator include the following compounds PAG-1 and PAG-2.

Cationic photopolymerization initiator (iodonium salt compound) PAG-1

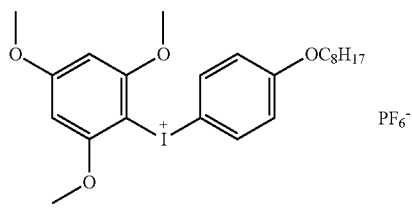

Cationic photopolymerization initiator (iodonium salt compound) PAG-2

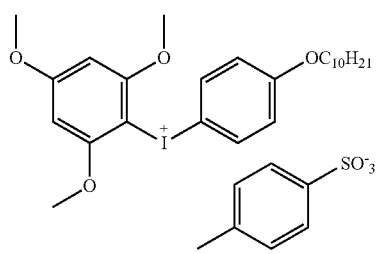

The content of the cationic polymerization initiator used in the curable composition for forming a first cured layer may be appropriately adjusted within a range in which the polymerization reaction (cationic polymerization) of the cationically polymerizable compound excellently proceeds, and is not particularly limited. The content of the aforementioned cationic polymerization initiator with respect to the solid content in the curable composition for forming a first cured layer is preferably equal to or smaller than 5% by mass, more preferably equal to or smaller than 3% by mass, and even more preferably equal to or smaller than 2% by mass. The lower limit of the content with respect to the solid content in the curable composition for forming a first cured layer is preferably equal to or greater than 0.5% by mass, and more preferably equal to or greater than 1% by mass.

The curable composition for forming a first cured layer may contain only one kind of cationic polymerization initiator or two or more kinds of cationic polymerization initiators. In a case where the curable composition contains two or more kinds of cationic polymerization initiators, it is preferable that the total amount thereof is within the above range.

<<Solvent>>

It is preferable that the curable composition for forming a first cured layer contains a solvent. As the solvent, an organic solvent is preferable. One kind of organic solvent can be used, or two or more kinds of organic solvents can be used by being mixed together at any ratio. Specific examples of the organic solvent include alcohols such as methanol, ethanol, propanol, n-butanol, and i-butanol; ketones such as acetone, methyl isobutyl ketone, methyl ethyl ketone, and cyclohexanone; cellosolves such as ethyl cellosolve; aromatic solvents such as toluene and xylene; glycol ethers such as propylene glycol monomethyl ether; acetic acid esters such as methyl acetate, ethyl acetate, and butyl acetate; diacetone alcohol; and the like. Among these, methyl ethyl ketone, methyl isobutyl ketone, and methyl acetate are preferable. It is more preferable to use methyl ethyl ketone, methyl isobutyl ketone, and methyl acetate by mixing these together at any ratio. In a case where this constitution is adopted, a hardcoat film having further improved scratch resistance, punching properties, and adhesiveness is obtained.

The amount of the solvent in the curable composition for forming a first cured layer can be appropriately adjusted within a range in which coating suitability of the aforementioned composition can be secured. For example, the content of the solvent with respect to a total of 100 parts by mass of the polymerizable compound and the photopolymerization initiator can be 50 to 500 parts by mass, and preferably can be 80 to 200 parts by mass.

The solid content in the curable composition for forming a first cured layer is preferably 10% to 90% by mass, more preferably 50% to 80% by mass, and particularly preferably 65% to 75% by mass.

<<Other Materials of First Cured Layer>>

In addition, if necessary, the first cured layer can optionally contain one or more kinds of known additives. Examples of the additives include an antifoulant, a surface conditioner, a leveling agent, a polymerization inhibitor, and the like. For details of these, for example, paragraphs "0032" to "0034" in JP2012-229412A can be referred to, and the contents of the paragraphs are incorporated into the present specification. Furthermore, it is possible to use various types of additives that can be generally used in photopolymerizable compositions. The amount of various additives added to the first cured layer or the curable composition for forming a first cured layer may be appropriately adjusted and is not particularly limited.

<<Leveling Agent>>

As the leveling agent, a fluorine-containing polymer is preferably used, and examples thereof include the fluoroaliphatic group-containing polymer described in JP5175831B. As the leveling agent, a fluoroaliphatic group-containing polymer can also be used in which the content of a fluoroaliphatic group-containing monomer represented by General Formula (1) constituting the fluoroaliphatic group-containing polymer is equal to or smaller than 50% by mass with respect to the total content of polymerizable units.

<<Antifoulant>>

Regarding the details of the antifoulant, the antifoulant described for the curable composition for forming a second cured layer, which will be described later, can be adopted, and the preferred range thereof is also the same.

In a case where the curable composition for forming a first cured layer contains the antifoulant, the content of the antifoulant with respect to the solid content in the curable composition for forming a first cured layer is preferably 0.01% to 7% by mass, more preferably 0.05% to 5% by mass, and even more preferably 0.1% to 2% by mass.

The curable composition for forming a first cured layer may contain only one kind of antifoulant or two or more kinds of antifoulants. In a case where the curable composition contains two or more kinds of antifoulants, it is preferable that the total amount thereof is within the above range.

Furthermore, it is possible to adopt a constitution in which the curable composition for forming a first cured layer substantially does not contain an antifoulant.

<<Film Thickness of First Cured Layer>>

The film thickness of the first cured layer is not particularly limited, but is preferably equal to or greater than 5 μm, and more preferably equal to or greater than 10 μm. In a case where the film thickness is equal to or greater than 5 μm, the pencil hardness can be more effectively improved. The upper limit of the film thickness of the first cured layer is preferably equal to or smaller than 60 μm, more preferably equal to or smaller than 50 μm, even more preferably equal to or smaller than 45 μm, still more preferably equal to or smaller than 30 μm, and yet more preferably equal to or smaller than 25 μm. In a case where the upper limit is equal to or smaller than 60 μm, the punching properties can be more effectively improved.

<Second Cured Layer and Curable Composition for Forming Second Cured Layer>

The second cured layer of the present invention is formed of the curable composition for forming a second cured layer.

The curable composition for forming a second cured layer contains a polymerizable compound 3 having at least two radically polymerizable groups in the same molecule.

<<Polymerizable Compound 3>>

The polymerizable compound 3 has at least two radically polymerizable groups in the same molecule.

The number of radically polymerizable groups of the polymerizable compound 3 is preferably equal to or greater than 3, more preferably equal to or greater than 4, and even more preferably equal to or greater than 6. In a case where polymerizable compound 3 has two or more radically polymerizable groups in the same molecule, the scratch resistance and the adhesiveness can be more effectively improved. The upper limit of the number of radically polymerizable groups of the polymerizable compound 3 is not particularly limited. Even in a case where the number of radically polymerizable groups in the same molecule is equal to or smaller than 10, the effects of the present invention can be sufficiently achieved.

As the radically polymerizable group that the polymerizable compound 3 has, a styryl group and a (meth)acryl group are preferable, a (meth)acryl group is more preferable, and a (meth)acrylolooxy group is even more preferable. As the (meth)acryl group, a methacryl group is preferable.

The polymerizable compound 3 may have a high molecular weight (for example, a molecular weight equal to or greater than 2,000) or a low molecular weight (for example, a molecular weight less than 2,000). However, it is preferable that the polymerizable compound 3 has a low molecular weight. In a case where the low-molecular weight polymerizable compound 3 is used, the moiety other than the radically polymerizable group is reduced, and hence the pencil hardness of the hardcoat film can be more effectively improved. Specifically, the molecular weight of the polymerizable compound 3 is preferably equal to or smaller than 1,500, more preferably equal to or smaller than 1,200, and even more preferably equal to or smaller than 250. The lower limit of the molecular weight of the polymerizable compound 3 is preferably equal to or greater than 100 and more preferably equal to or greater than 120. In a case where the lower limit is within the above range, it is possible to more effectively inhibit the volatilization of the polymerizable compound 3 at the time of forming the second cured layer.

Specific examples of the polymerizable compound 3 include (meth)acrylate-based compounds. Among these, the (meth)acrylate-based compounds exemplified above regarding the polymerizable compound 1 are more preferable.

In the present invention, it is particularly preferable that the polymerizable compound 1 and the polymerizable compound 3 are the same compounds. In a case where the same compounds are used, the compounds exhibit high affinity with each other in the interface between the first cured layer and the second cured layer, and hence the adhesiveness between the first cured layer and the second cured layer can be more effectively improved.

The content of the polymerizable compound 3 with respect to the total content of polymerizable compounds contained in the curable composition for forming a second cured layer is preferably equal to or greater than 70% by mass, more preferably equal to or greater than 75% by mass, particularly preferably equal to or greater than 80% by mass, still more preferably equal to or greater than 90% by mass, and yet more preferably equal to or greater than 95% by mass. In a case where the content of the polymerizable compound 3 is within the above range, the scratch resistance can be further improved. The upper limit of the content is not particularly limited, and can be preferably equal to or smaller than 100% by mass.

The curable composition for forming a second cured layer may contain only one kind of polymerizable compound 3 or two or more kinds of polymerizable compounds 3. In a case where the curable composition contains two or more kinds of polymerizable compounds 3, it is preferable that the total amount thereof is within the above range.

<<Another Polymerizable Compound>>

The curable composition for forming a second cured layer may contain another polymerizable compound in addition to the polymerizable compound 3. As the aforementioned another polymerizable compound, it is possible to adopt a compound, which is the polymerizable compound 2 mixed with the curable composition for forming a first cured layer but does not correspond to the polymerizable compound 3, or another polymerizable compound which may be mixed with the composition. Furthermore, as the aforementioned another polymerizable compound, a polymerizable compound having a cationically polymerizable group is preferable. As the polymerizable compound having a cationically polymerizable group, it is possible to adopt the polymerizable compound having a cationically polymerizable group that may be mixed with the curable composition for forming a first cured layer, and the preferred range thereof is also the same.

In a case where the curable composition for forming a second cured layer contains the aforementioned another polymerizable compound (particularly, a polymerizable compound having a cationically polymerizable group), the content thereof with respect to the total content of the polymerizable compounds contained in the curable composition for forming a second cured layer is preferably equal to or smaller than 20% by mass, more preferably equal to or smaller than 15% by mass, particularly preferably equal to or smaller than 10% by mass, and more particularly preferably equal to or smaller than 5% by mass. In a case where the curable composition contains the aforementioned another polymerizable compound, the lower limit of the content of the aforementioned another polymerizable compound is preferably equal to or greater than 1% by mass, and more preferably equal to or greater than 3% by mass.

The curable composition for forming a second cured layer may contain only one kind of another polymerizable compound described above or two or more kinds of other polymerizable compounds. In a case where the curable composition contains two or more kinds of other polymerizable compounds, it is preferable that the total amount thereof is within the above range.

In the present invention, it is also possible to adopt a constitution in which the curable composition for forming a second cured layer substantially does not contain the aforementioned another polymerizable compound.

<<Inorganic Particles>>

The curable composition for forming a second cured layer may contain inorganic particles. As the inorganic particles, the inorganic particles which may be mixed with the curable composition for forming a first cured layer can be used, and the preferred range thereof is also the same.

In a case where the curable composition for forming a second cured layer contains inorganic particles, the content of the inorganic particles with respect to the solid content in the curable composition for forming a second cured layer is preferably equal to or smaller than 20% by mass, and more preferably equal to or smaller than 17% by mass. The lower limit of the content is preferably equal to or greater than 1% by mass, and more preferably equal to or greater than 7% by mass.

Particularly, in the present invention, it is possible to adopt a constitution in which the curable composition for forming a second cured layer substantially does not contain inorganic particles.

<<Polymerization Initiator>>

It is preferable that the curable composition for forming a second cured layer contains a polymerization initiator which is preferably a radical polymerization initiator. The polymerization initiator may be a photopolymerization initiator or a thermal polymerization initiator.

As the radical polymerization initiator used in the curable composition for forming a second cured layer, the radical polymerization initiator which may be used in the curable composition for forming a first cured layer can be adopted, and the preferred range thereof is also the same.

In a case where the curable composition for forming a second cured layer contains a cationically polymerizable compound as a polymerizable compound, it is also preferable that the curable composition contains a cationic polymerization initiator.

As the cationic polymerization initiator used in the curable composition for forming a second cured layer, the cationic polymerization initiator which may be used in the curable composition for forming a first cured layer can be adopted, and the preferred range thereof is also the same.

The content of the cationic polymerization initiator used in the curable composition for forming a second cured layer may be appropriately adjusted within a range in which the polymerization reaction (cationic polymerization) of the cationically polymerizable compound excellently proceeds, and is not particularly limited. The content with respect to the solid content in the curable composition for forming a second cured layer is preferably equal to or smaller than 5% by mass, more preferably equal to or smaller than 3% by mass, and even more preferably equal to or smaller than 2% by mass. The lower limit of the content with respect to the solid content in the curable composition for forming a second cured layer is preferably equal to or greater than 0.5% by mass, and more preferably equal to or greater than 1% by mass.

The curable composition may contain only one kind of cationic polymerization initiator or two or more kinds of cationic polymerization initiators. In a case where the curable composition contains two or more kinds of cationic polymerization initiators, it is preferable that the total amount thereof is within the above range.

<<Antifoulant>>

It is preferable that the second cured layer or the curable composition for forming a second cured layer contains an antifoulant. In a case where the second cured layer or the curable composition contains an antifoulant, the adhesion of finger print or contaminant is suppressed, the contaminant that has adhered can be wiped off in a simple way. Furthermore, scratch resistance can be improved by enhancing sliding properties of the surface.

It is preferable that the antifoulant contains a fluorine-containing compound. It is preferable that the fluorine-containing compound has a perfluoropolyether group and a polymerizable group (preferably a radically polymerizable group). It is more preferable that the fluorine-containing compound has a perfluoropolyether group and polymerizable groups, and the plurality of polymerizable groups are contained in one molecule of the compound. In a case where this constitution is adopted, the scratch resistance improving effect can be more effectively exerted.

In the present specification, even in a case where the antifoulant has polymerizable groups, the antifoulant is regarded as a compound that does not correspond to the aforementioned polymerizable compounds 1 to 3 and the aforementioned another polymerizable compound.

The fluorine-containing compound may be any of a monomer, an oligomer, and a polymer, and is preferably an oligomer (fluorine-containing oligomer).

As the antifoulant usable in the present invention, it is possible to use the materials described in paragraphs "0012" to "0101" in JP2012-088699A. and the content of the publication is incorporated into the present specification.

As the antifoulant described so far, those synthesized by known methods or commercial products may be used. As commercial products, RS-90 and RS-78 manufactured by DIC Corporation and the like can be preferably used.

In a case where the curable composition for forming a second cured layer contains an antifoulant, the content of the antifoulant with respect to the solid content in the curable composition for forming a second cured layer is preferably 0.01% to 7% by mass, more preferably 0.05% to 5% by mass, and even more preferably 0.1% to 2% by mass.

The curable composition for forming a second cured layer may contain only one kind of antifoulant or two or more kinds of antifoulants. In a case where the curable composition contains two or more kinds of antifoulants, it is preferable that the total amount of the antifoulants is within the above range.

Furthermore, it is possible to adopt a constitution in which the curable composition for forming a second cured layer substantially does not contain an antifoulant.

<<Solvent>>

It is preferable that the curable composition for forming a second cured layer contains a solvent. As the solvent used in the curable composition for forming a second cured layer, the solvent used in the curable composition for forming a first cured layer can be used, and the preferred range thereof is also the same.

The amount of the solvent in the curable composition for forming a second cured layer can be appropriately adjusted within a range in which the coating suitability of the aforementioned composition can be secured. For example, the content of the solvent with respect to a total of 100 parts by mass of the polymerizable compound and the photopolymerization initiator can be 50 to 500 parts by mass, and preferably can be 80 to 200 parts by mass.

The solid content in the curable composition for forming a second cured layer is preferably 10% to 90% by mass, more preferably 50% to 80% by mass, and particularly preferably 65% to 75% by mass.

<<Other Materials of Second Cured Layer>>

In addition, if necessary, the second cured layer or the curable composition for forming a second cured layer can optionally contain one or more kinds of known additives. Examples of the additives include a surface conditioner, a leveling agent, a polymerization inhibitor, and the like. For details of these, for example, paragraphs "0032" to "0034" in JP2012-229412A can be referred to. The additives are not limited to these, and various additives that can be generally used in a polymerizable composition can be used. The amount of various additives added to the curable composition for forming a second cured layer may be appropriately adjusted, and is not particularly limited.

<<Film Thickness of Second Cured Layer>>

The film thickness of the second cured layer is not particularly limited, but is preferably equal to or greater than 0.05 μm, more preferably 0.08 μm, even more preferably equal to or greater than 0.1 μm, and still more preferably equal to or greater than 1 μm. The film thickness may be equal to or greater than 3 μm. In a case where the film thickness of the second cured layer is equal to or greater than 0.05 μm, the pencil hardness and the scratch resistance can be more effectively improved. The upper limit of the film thickness of the second cured layer is preferably equal to or smaller than 40 μm, more preferably equal to or smaller than 30 μm, even more preferably equal to or smaller than 20 μm, and still more preferably equal to or smaller than 15 μm. The upper limit may be equal to or smaller than 8 μm. In a case where the upper limit of the film thickness of the second cured layer is equal to or smaller than 40 μm, the punching properties can be more effectively improved.

<Optional Layer>

The hardcoat film may optionally have one or more other layers in addition to the support, the first cured layer, and the second cured layer. The aforementioned other layers are not particularly limited, and for example, the hardcoat film may have a cured layer other than the first cured layer and the second cured layer described above, an antireflection layer, an easy-adhesive layer, a decorative layer, an optically-anisotropic layer used in a ¼ wave phase difference plate which will be described later, and the like. For details of aforementioned other layers, paragraphs "0069" to "0091" in JP5048304B can be referred to, and the contents of the paragraphs are incorporated into the present specification.

<<Antireflection Layer>>

In a case where the hardcoat film is used as an antireflection film, an aspect is also preferable in which one antireflection layer or a plurality of antireflection layers are laminated on a surface of the cured layer such as the second cured layer or another cured layer. In the present specification, a layer of high refractive index, a layer of medium refractive index, and a layer of low refractive index are collectively called an antireflection layer in some cases. The constitution of an antireflection layer that can be preferably used in the present invention is shown below.

A: support/first cured layer/second cured layer/layer of low refractive index

B: support/first cured layer/second cured layer/layer of high refractive index/layer of low refractive index C: support/first cured layer/second cured layer/layer of medium refractive index/layer of high refractive index/layer of low refractive index In the hardcoat film of the present invention, it is preferable that a layer of low refractive index is disposed on the cured layer directly or through another layer.

Paragraphs "0077" to "0102" in JP2009-204725A describe preferred aspects of the layer of low refractive index, and the content of the publication is incorporated into the present specification.

In the hardcoat film of the present invention, by providing a layer having a high refractive index (layer of high refractive index or a layer of medium refractive index) between the layer of low refractive index and the cured layer, antireflection properties can be improved. "High", "medium", and "low" for the layer of high refractive index, the layer of medium refractive index, and the layer of low refractive index show the relationship between the layers based on the relative magnitude of the refractive index thereof. Furthermore, regarding the relationship with the support based on the refractive index, it is preferable that a relationship of support >layer of low refractive index and a relationship of layer of high refractive index >support are satisfied.

Paragraphs "0103" to "0112" in JP2009-204725A describe preferred aspects of the layer of high refractive index, and the content of the publication is incorporated into the present specification.

—Layer of Low Refractive Index—

Examples of materials constituting the layer of low refractive index include materials having a refractive index lower than that of the materials constituting the layer of high refractive index, such as aluminum oxide ($Al_2O_3$), silicon dioxide ($SiO_2$), non-stoichiometric silicon oxide ($SiO_{2-X}$, $0 \leq X < 1$), magnesium fluoride ($MgF_2$), a mixture of these, and the like. Among these, silicon oxide is preferable.

The refractive index of the layer of low refractive index is preferably equal to or higher than 1.35 and equal to or lower than 1.5. The lower limit of the refractive index of the layer of low refractive index is preferably equal to or higher than 1.38, and more preferably equal to or higher than 1.47. Provided that a design wavelength $\lambda 0$ is 500 nm, the optical film thickness of the layer of low refractive index is preferably equal to or smaller than $0.44\lambda 0$, more preferably equal to or smaller than $0.35\lambda 0$, and even more preferably equal to or smaller than $0.14\lambda 0$.

—Layer of High Refractive Index—

Examples of materials constituting the layer of high refractive index include materials having a refractive index higher than that of the materials constituting the layer of low refractive index, such as tantalum pentoxide ($Ta_2O_5$), niobium pentoxide ($Nb_2O_5$), lanthanum titanate ($LaTiO_3$), hafnium oxide ($HfO_2$), titanium oxide ($TiO_2$), chromium oxide ($Cr_2O_3$), zirconium oxide (ZrO), zinc sulfate (ZnS), tin-doped indium oxide (ITO), antimony-doped tin oxide (ATO), a mixture of these, and the like.

The refractive index of the layer of high refractive index is preferably equal to or higher than 1.7 and equal to or lower than 2.5, and more preferably equal to or higher than 1.8 and equal to or lower than 2.2. Furthermore, provided that a design wavelength λ0 is 500 nm, the optical film thickness of the layer of high refractive index is preferably equal to or greater than 0.036λ0 and equal to or smaller than 0.54λ0, and more preferably equal to or greater than 0.072λ0 and equal to or smaller than 0.43λ0.

The method for forming the layer of low refractive index and the layer of high refractive index is not particularly limited, and examples thereof include a wet coating method and a dry coating method. Among these, a dry coating method such as vacuum vapor deposition, chemical vapor deposition (CVD), sputtering, or electron beam vapor deposition is preferable, and sputtering or electron beam vapor deposition is more preferable, because these methods make it possible to form a thin film having a uniform film thickness and make it easy to adjust the film thickness of a thin film of a nanometer level.

Method for Manufacturing Hardcoat Film

The method for manufacturing a hardcoat film of the present invention includes forming a first cured layer on a support by using a curable composition for forming a first cured layer containing a polymerizable compound 1 having a radically polymerizable group and a polymerizable compound 2 which has a cationically polymerizable group and a radically polymerizable group in the same molecule and is different from the polymerizable compound 1, and forming a second cured layer on the first cured layer by using a curable composition for forming a second cured layer containing a polymerizable compound 3 having at least two radically polymerizable groups in the same molecule, in which the second cured layer is formed such that the support, the first cured layer, and the second cured layer are laminated in this order, and a content of the polymerizable compound 2 with respect to a total content of the polymerizable compounds contained in the curable composition for forming a first cured layer is equal to or greater than 51% by mass. In a case where the aforementioned constitution is adopted, a hardcoat film having excellent scratch resistance, punching properties, and adhesiveness is obtained. Furthermore, the pencil hardness of the obtained hardcoat film can be improved.

Each of the curable composition for forming a first cured layer and the curable composition for forming a second cured layer has the same definition of each of the curable composition for forming a first cured layer and the curable composition for forming a second cured layer described above, and the preferred range thereof is also the same.

<Formation of First Cured Layer>

The method for manufacturing a hardcoat film of the present invention includes forming the first cured layer by using the curable composition for forming a first cured layer containing the polymerizable compound 1 having a radically polymerizable group and the polymerizable compound 2 which has a cationically polymerizable group and a radically polymerizable group in the same molecule and is different from the polymerizable compound 1.

<<Preparation>>

The curable composition for forming a first cured layer can be prepared by simultaneously mixing together various components constituting the curable composition for forming a first cured layer or prepared by sequentially mixing together the various components in any order. The preparation method is not particularly limited, and for preparing the curable composition, a known stirrer or the like can be used.

<<Lamination>>

The curable composition for forming a first cured layer prepared as described above is laminated on a surface of the support directly or through another layer such as an adhesive layer, a pressure sensitive adhesive layer, or an easy-adhesive layer, and in this way, the first cured layer can be formed. In the present invention, it is preferable that the first cured layer is formed on a surface of the support.

The lamination method is not particularly limited, and known methods can be adopted. As the lamination method, coating is preferable. The coating can be performed by known coating methods such as a dip coating method, an air knife coating method, a curtain coating method, a roller coating method, a die coating method, a wire bar coating method, and a gravure coating method. The amount of the curable composition used for coating may be adjusted such that the first cured layer having a desired film thickness can be formed. The transport speed at the time of coating is not particularly limited, but can be set to be 10 to 50 m/min for example.

By simultaneously or sequentially laminating two or more kinds of curable compositions for forming a first cured layer of different makeups, the first cured layer can be formed as a cured layer having a laminated structure including two or more layers (for example, about 2 to 5 layers). Furthermore, the first cured layer and the second cured layer may be simultaneously laminated.

<<Curing>>

It is preferable that the first cured layer is formed by curing the curable composition for forming a first cured layer. The curing method is not particularly limited, and examples thereof include a method of performing a photopolymerization treatment or a thermal polymerization treatment. In the present invention, it is preferable to perform a photopolymerization treatment. In a case where the photopolymerization treatment is performed, the following aspect is preferable.

In a case where the photopolymerization treatment (light irradiation) is performed on the curable composition for forming a first cured layer, the radically polymerizable group and the cationically polymerizable group are affected by the action of the radical photopolymerization initiator and the cationic photopolymerization initiator respectively, and hence the polymerization reaction of the radically polymerizable group and the cationically polymerizable group is initiated and proceeds. The wavelength of the radiated light may be determined according to the type of the polymerizable compound and the polymerization initiator used. Examples of light sources for light irradiation include a high-pressure mercury lamp, an ultrahigh-pressure mercury lamp, a carbon arc lamp, a metal halide lamp, a xenon lamp, a chemical lamp, an electrodeless discharge lamp, a light emitting diode (LED), and the like that emit light in a wavelength range of 150 to 450 nm. The light irradiation amount is generally within a range of 10 to 3,000 mJ/cm$^2$, and preferably within a range of 20 to 1,500 mJ/cm$^2$. The output or the illuminance of the lamp is not particularly limited as long as the light irradiation amount is within the above range. The light irradiation is preferably performed with nitrogen purging, and more preferably performed at an oxygen concentration of equal to or lower than 0.1% by volume.

Particularly, it is preferable that the curable composition for forming a second cured layer is provided in a state where some of the polymerizable compounds having the radically polymerizable group in the curable composition for forming a first cured layer remain unreacted. It is preferable to adopt this constitution because then the adhesiveness between the first cured layer and the second cured layer tends to be further improved.

The curable composition for forming a first cured layer and the curable composition for forming a second cured layer may be simultaneously cured. That is, the curable composition for forming a first cured layer and the curable composition for forming a second cured layer may be cured at the same time after they are simultaneously or sequentially used for coating.

<<Drying>>

If necessary, before or after curing or before and after curing, a drying treatment may be performed on the curable composition for forming a first cured layer or the first cured layer. The drying treatment can be performed by hot air blowing, disposing the cured layer or the curable composition in a heating furnace, or transporting the cured layer or the curable composition in a heating furnace, and the like. The heating temperature may be set to be a temperature at which a solvent can be dried and removed, and is not particularly limited. For example, drying can be performed at a temperature of 40° C. to 80° C. for 100 to 200 seconds. Herein, the heating temperature refers to the temperature of hot air or the internal atmospheric temperature of the heating furnace.

<Formation of Second Cured Layer>

The method for manufacturing a hardcoat film of the present invention includes forming the second cured layer on the first cured layer by using the curable composition for forming a second cured layer containing the polymerizable compound 3 having at least two radically polymerizable groups in the same molecule. The second cured layer is formed such that the support, the first cured layer, and the second cured layer are laminated in this order. The second cured layer may be formed on a surface of the first cured layer directly or through another layer. It is preferable to adopt an aspect in which the second cured layer is formed on a surface of the first cured layer.

Other preferred aspects for forming the second cured layer are the same as the preferred aspects for forming the first cured layer.

<Processing Hardcoat Film>

The hardcoat film of the present invention is processed so as to be used for various purposes.

For example, by the process, the manufactured hardcoat film is wound up such that a roll-shaped hardcoat film is obtained.

Furthermore, because the hardcoat film of the present invention has excellent punching properties, the manufactured hardcoat film may be subjected to punching (referred to as die cutting as well) by using a punching blade such that the hardcoat film has a desired shape. Examples of the desired shape include shapes of a polarizing plate, a liquid crystal display, a touch panel, and the like. During punching, it is preferable to use a method in which the punching blade is stuck into the hardcoat film of the present invention from the second cured layer side and caused to pass through the hardcoat film in order of the first cured layer and the support. In the present invention, the punching blade is stuck into the hardcoat film from the second cured layer side for performing punching, and in this way, the hardcoat film of the present invention can be particularly excellently punched.

The direction along which the punching blade is stuck into the hardcoat film is preferably a direction in which an angle of 90° 10° is formed between the film surface of the second cured layer and the punching blade, more preferably a direction in which an angle of 90°±30 is formed between the film surface of the second cured layer and the punching blade, and even more preferably a direction in which an angle of 90°±1 is formed between the film surface of the second cured layer and the punching blade.

The die cutting machine used for punching is not particularly limited, and a manual press machine TOR-PAC PRESS TP series manufactured by AMADA CO., LTD. or the like can be preferably used. Punching is preferably performed at a temperature of 10° C. to 40° C. and a relative humidity of 30% to 80%, and more preferably performed at a temperature of 20° C. to 30° C. and a relative humidity of 50% to 70%.

Kit

The kit of the present invention includes a curable composition for forming a first cured layer containing a polymerizable compound 1 having a radically polymerizable group and a polymerizable compound 2 which has a cationically polymerizable group and a radically polymerizable group in the same molecule and is different from the polymerizable compound 1; and a curable composition for forming a second cured layer containing a polymerizable compound 3 having at least two radically polymerizable groups in the same molecule; in which the content of the polymerizable compound 2 with respect to the total content of the polymerizable compounds contained in the curable composition for forming a first cured layer is equal to or greater than 51% by mass.

In a case where the curable composition for forming a first cured layer and the curable composition for forming a second cured layer in the kit of the present invention are used, the hardcoat film of the present invention can be easily manufactured.

As the curable composition for forming a first cured layer and the curable composition for forming a second cured layer in the kit of the present invention, the curable composition for forming a first cured layer and the curable composition for forming a second cured layer in the hardcoat film can be used respectively, and the preferred range thereof is also the same.

Articles Including Hardcoat Film

Examples of articles including the hardcoat film of the present invention include various articles required to be improved in terms of scratch resistance in various industrial fields such as the field of home appliances, the field of electricity and electronics, the field of automobiles, and the field of housing. Specifically, examples of such articles include a touch sensor, a touch panel, an image display such as a liquid crystal display, window glass of automobiles, window glass for home, and the like. By providing the hardcoat film of the present invention in these articles preferably as a surface protective film, it is possible to provide articles having excellent scratch resistance. The hardcoat film of the present invention is preferably a hardcoat film used as a hardcoat film for a front plate of an image display, and more preferably a hardcoat film used for a front plate of an image display element such as a touch panel.

The touch panel in which the hardcoat film of the present invention can be used is not particularly limited, and can be appropriately selected according to the purpose. Examples of the touch panel include a surface capacitance-type touch panel, a projected capacitance-type touch panel, a resistive film-type touch panel, and the like. Details of the touch panel will be specifically described later.

The touch panel includes a so-called touch sensor. In the touch panel, the layer constitution of a touch panel sensor electrode portion may be established by any of a bonding method in which two sheets of transparent electrodes are bonded to each other, a method of providing a transparent electrode on both surfaces of one sheet of substrate, a method using a single-face jumper or a through hole, and a single-face lamination method.

<Image Display>

The image display of the present invention is an image display including a front plate having the hardcoat film of the present invention and an image display element.

As the image display, it is possible to use image displays such as a Liquid Crystal Display (LCD), a plasma display panel, an electroluminescent display, a cathode tube display, and a touch panel.

Examples of the liquid crystal display include a twisted nematic (TN) type, a super-twisted nematic (STN) type, a triple super twisted nematic (TSTN) type, a multi domain type, a vertical alignment (VA) type, an in-plane switching (IPS) type, an optically compensated bend (OCB) type, and the like.

It is preferable that the image display has ameliorated brittleness and excellent handleability, does not impair display quality by surface smoothness or wrinkles, and can suppress the leakage of light at the time of moisture-heat test.

That is, in the image display of the present invention, the image display element is preferably a liquid crystal display element. Examples of the image display having a liquid crystal display element include Xperia P manufactured by Sony Ericsson, and the like.

In the image display of the present invention, the image display element is also preferably an organic Electroluminescence (EL) display element.

In the organic electroluminescent display element, known techniques can be adopted without any limitation. Examples of the image display having an organic electroluminescent display element include GALAXY SII manufactured by SAMSUNG, and the like.

In the image display of the present invention, the image display element is preferably an in-cell touch panel display element. The in-cell touch panel display element is an element in which a touch panel function is included in a cell of an image display element.

In the in-cell touch panel display element, for example, the known techniques described in JP2011-76602A, JP2011-222009A. and the like can be adopted without any limitation. Examples of the image display having an in-cell touch panel display element include Xperia P manufactured by Sony Ericsson, and the like.

Furthermore, in the image display of the present invention, the image display element is also preferably an on-cell touch panel display element. The on-cell touch panel display element is an element in which a touch panel function is on the outside of a cell of an image display element.

In the on-cell touch panel display element, for example, the known techniques described in JP2012-88683A and the like can be adopted without any limitation. Examples of the image display having an on-cell touch panel display element include GALAXY SII manufactured by SAMSUNG, and the like.

<<Touch Panel>>

In the hardcoat film of the present invention, a touch sensor film is bonded to a surface, which is opposite to a surface on which the first cured layer and the second cured layer are disposed, of the support, and in this way, the hardcoat film can be used as a touch panel including a touch sensor.

The touch sensor film is not particularly limited, but is preferably a conductive film in which a conductive layer is formed.

The conductive film preferably includes any support and a conductive layer formed on the support.

The material of the conductive layer is not particularly limited, and examples thereof include an indium-tin composite oxide (Indium Tin Oxide; ITO), tin oxide, an antimony-tin composite oxide (Antimony Tin Oxide; ATO), copper, silver, aluminum, nickel, chromium, an alloy of these, and the like.

The conductive layer is preferably an electrode pattern. Furthermore, the conductive layer is also preferably a transparent electrode pattern. The electrode pattern may be obtained by forming a layer of a transparent conductive material by patterning or obtained by forming a layer of a non-transparent conductive material by patterning.

As the transparent conductive material, it is possible to use an oxide such as ITO or ATO, silver nanowires, carbon nanotubes, a conductive polymer, and the like.

Examples of the layer of a non-transparent conductive material include a metal layer. As the metal layer, any metal having conductivity can be used, and silver, copper, gold, aluminum, and the like are suitably used. The metal layer may be a simple metal or an alloy, or may be a layer in which metal particles are bonded to each other through a binder. If necessary, the surface of the metal may be subjected to a blackening treatment or a rust-proofing treatment. In a case where a metal is used, a sensor portion that is substantially transparent and a peripheral wiring portion can be collectively formed.

It is preferable that the conductive layer contains a plurality of metal thin wires.

The metal thin wires are preferably formed of silver or an alloy containing silver. The conductive layer containing metal thin wires formed of silver or an alloy containing silver is not particularly limited, and known conductive layers can be used. For example, it is preferable to use the conductive layer described in paragraphs "0040" and "0041" in JP2014-168886A, and the content of the publication is incorporated into the present specification.

It is also preferable that the metal thin wires are formed of copper or an alloy containing copper. The alloy is not particularly limited, and known conductive layers can be used. For example, it is preferable to use the conductive layer described in paragraphs "0038" to "0059" in JP2015-49852A. and the content of the publication is incorporated into the present specification.

It is also preferable that the conductive layer is formed of an oxide. In a case where the conductive layer is formed of an oxide, it is more preferable that the oxide is formed of indium oxide containing tin oxide or of tin oxide containing antimony. The conductive layer formed of an oxide is not particularly limited, and known conductive layers can be used. For example, it is preferable to use the conductive layer described in paragraphs "0017" to "0037" in JP2010-27293A, and the content of the publication is incorporated into the present specification.

Among these conductive layer constituted as above, a conductive layer is preferable which contains a plurality of metal thin wires that are disposed in a mesh shape or a random shape, and a conductive layer is more preferable in which the metal thin wires are disposed in a mesh shape. Particularly, a conductive layer is preferable in which the metal thin wires are disposed in a mesh shape and formed of a silver or an alloy containing silver.

It is also preferable that the touch sensor film has a conductive layer on both surfaces thereof.

Paragraphs "0016" to "0042" in JP2012-206307A describe preferred aspects of the touch sensor film, and the content of the publication is incorporated into the present specification.

<<Resistive Film-Type Touch Panel>>

The resistive film-type touch panel of the present invention includes the front plate of the present invention.

Basically, the resistive film-type touch panel has a constitution in which conductive films of a pair of upper and lower substrates each having a conductive layer are disposed with a spacer therebetween such that the conductive layers face each other. The constitution of the resistive film-type touch panel is known, and in the present invention, known techniques can be adopted without any limitation.

<<Capacitance-Type Touch Panel>>

The capacitance-type touch panel of the present invention includes the front plate of the present invention.

Examples of the capacitance-type touch panel include a surface capacitance-type touch panel, a projected capacitance-type touch panel, and the like. Basically, the projected capacitance-type touch panel has a constitution in which an X electrode and a Y electrode orthogonal to the X electrode are disposed with an insulating material therebetween. Examples of specific aspects thereof include an aspect in which an X electrode and a Y electrode are formed on different surfaces of one sheet of substrate, an aspect in which an X electrode, a layer of an insulating material, and a Y electrode are formed in this order on one sheet of substrate, an aspect in which an X electrode is formed on one sheet of substrate while a Y electrode is formed on the other substrate (in this aspect, a constitution in which two sheets of substrates are bonded to each other is adopted as the aforementioned basic constitution), and the like. The constitution of the capacitance-type touch panel is known, and in the present invention, known techniques can be adopted without any limitation.

Figure 2:
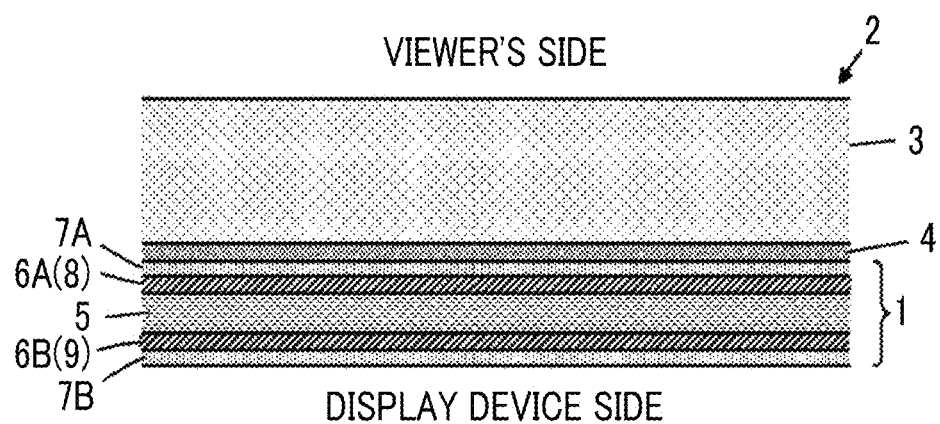
FIG. 2 is a schematic cross-sectional view showing an embodiment of a capacitance-type touch panel.

FIG. 2 shows an example of the constitution of an embodiment of a capacitance-type touch panel. A touch panel 2 is used in combination with a display device. The display device is used by being disposed on the display device side in FIG. 2. In FIG. 2, a viewer's side is a side on which a person operating the touch panel visually recognizes an image displayed on the display device. The hardcoat film (represented by the reference 3 in FIG. 2) of the present invention is used by bonding a conductive film 1 for a touch panel to a surface, which is opposite to the first cured layer (not shown in the drawing) side, of the support (not shown in the drawing) by using a transparent pressure sensitive adhesive 4. The conductive film 1 for a touch panel includes a conductive member 6A (first conductive layer 8) and a conductive member 6B (second conductive layer 9) on both surfaces of a flexible transparent insulating substrate 5. Each of the conductive member 6A and the conductive member 6B at least constitutes an electrode, peripheral wiring, an external connection terminal, and a connector portion as a touch panel which will be described later.

As shown in FIG. 2, for the purpose of flattening or protecting the conductive members 6A and 6B, a transparent protective layer 7A and a transparent protective layer 7B may be disposed to cover the conductive member 6A and the conductive member 6B.

In a hardcoat film 3, a decorative layer for shielding a peripheral area S2, which will be described later, from light may be formed.

As materials of the transparent insulating substrate 5, glass, polyethylene terephthalate (PET), polyethylene naphthalate (PEN), a cycloolefin polymer (COP), a cycloolefin copolymer (COC), polycarbonate (PC), and the like are used. The thickness of the transparent insulating substrate 5 is preferably 20 to 200 µm.

As the pressure sensitive adhesive 4, an Optical Clear Adhesive or an Optical Clear Resin can be used. The film thickness of the pressure sensitive adhesive 4 is preferably 10 to 100 µm. As the optical clear adhesive, for example, an 8146 series manufactured by 3M can be preferably used. The relative permittivity of the pressure sensitive adhesive 4 is preferably 4.0 to 6.0, and more preferably 5.0 to 6.0.

As the protective layer 7A and the protective layer 7B, for example, it is possible to use an organic film such as gelatin, an acrylic resin, or a urethane resin and an inorganic film such as silicon dioxide. The film thickness thereof is preferably equal to or greater than 10 nm and equal to or smaller than 100 nm, and the relative permittivity thereof is preferably 2.5 to 4.5. The concentration of halogen impurities in the protective layer 7A and the protective layer 7B is preferably equal to or lower than 50 ppm. It is more preferable that the protective layer 7A and the protective layer 7B do not contain halogen impurities. According to this aspect, it is possible to inhibit the corrosion of the conductive member 6A and the conductive member 6B.

Figure 3:
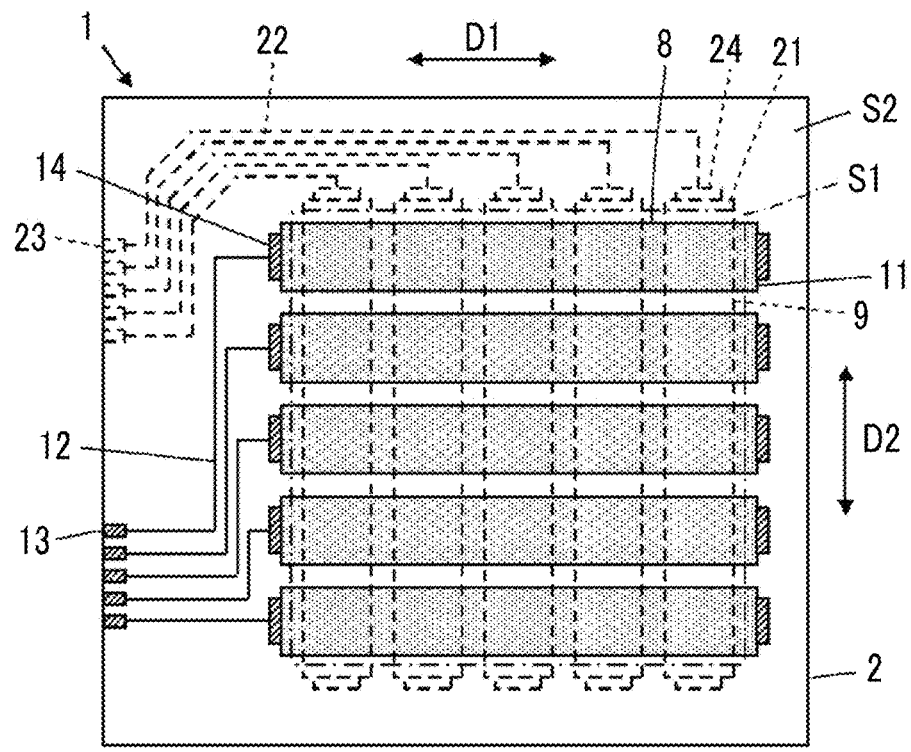
FIG. 3 is a schematic view of a conductive film for a touch panel.

As shown in FIG. 3, the conductive film 1 for a touch panel is divided into a transparent active area S1 and a peripheral region S2 which is on the outside of the active area S1.

Within the active area S1, the first conductive layer 8 formed on the front surface (first surface) of the transparent insulating substrate 5 and the second conductive layer 9 formed on the rear surface (second surface) of the transparent insulating substrate 5 are disposed such that they overlap each other. The first conductive layer 8 and the second conductive layer 9 are disposed in a state where they are insulated from each other through the transparent insulating substrate 5.

The first conductive layer 8 on the front surface of the transparent insulating substrate 5 forms a plurality of first electrodes 11 which each extend along a first direction D1 and are disposed in parallel to each other along a second direction D2 orthogonal to the first direction D1. The second conductive layer 9 on the rear surface of the transparent insulating substrate 5 forms a plurality of second electrodes 21 which extend along the second direction D2 and are disposed in parallel to each other along the first direction D1.

The plurality of first electrodes 11 and the plurality of second electrodes 21 constitute detection electrodes of the touch panel 2. Each of the first electrode 11 and the second electrode 21 preferably has an electrode width of 1 to 5 mm, and an interelectrode pitch thereof is preferably 3 to 6 mm.

On the front surface of the transparent insulating substrate 5 in the peripheral region S2, a plurality of first peripheral wiring 12 connected to the plurality of first electrodes 11 are formed, and a plurality of first external connection terminals 13 are arrayed and formed in the border portion of the transparent insulating substrate 5. Furthermore, at both ends of each of the first electrodes 11, a first connector portion 14 is formed. The first connector portion 14 is connected to one end of the corresponding first peripheral wiring 12, and the other end of the first peripheral wiring 12 is connected to the corresponding first external connection terminal 13.

Likewise, on the rear surface of the transparent insulating substrate 5 in the peripheral region S2, a plurality of second peripheral wiring 22 connected to the plurality of second electrodes 21 are formed, and a plurality of second external connection terminals 23 are arrayed and formed in the border portion of the transparent insulating substrate 5.

Furthermore, at both ends of each of the second electrodes 21, a second connector portion 24 is formed. The second connector portion 24 is connected to one end of the corresponding second peripheral wiring 22, and the other end of the second peripheral wiring 22 is connected to the corresponding second external connection terminal 23.

The conductive film 1 for a touch panel has a conductive member 6A which has the first electrode 11, the first peripheral wiring 12, the first external connection terminal 13, and the first connector portion 14 on the front surface of the transparent insulating substrate 5 and the conductive member 6B which has the second electrode 21, the second peripheral wiring 22, the second external connection terminal 23, and the second connector portion 24 on the rear surface of the transparent insulating substrate 5.

In FIG. 3, although the first electrode 11 and the first peripheral wiring 12 are connected to each other through the first connector portion 14, a constitution may also be adopted in which the first connector portion 14 is not provided such that the first electrode 11 and the first peripheral wiring 12 are directly connected to each other. Furthermore, a constitution may also be adopted in which the second connector portion 24 is not provided such that the second electrode 21 and the second peripheral wiring 22 are directly connected to each other.

In a case where the first connector portion 14 and the second connector portion 24 are provided, electricity can be effectively excellently conducted at the site where the electrode and the peripheral wiring are connected to each other. Particularly, in a case where the electrode and the peripheral wiring are formed of different materials, it is preferable to provide the first connector portion 14 and the second connector portion 24. The width of each of the first connector portion 14 and the second connector portion 24 is preferably equal to or greater than 1/3 of the width of the electrode connected to each of the connector portions and equal to or smaller than the width of the electrode. The first connector portion 14 and the second connector portion 24 may have the shape of a solid film, the frame shape shown in WO2013/089085A, or a mesh shape.

The wiring width of the first peripheral wiring 12 and the second peripheral wiring 22 is equal to or greater than 10 μm and equal to or smaller than 200 μm, and the minimum wiring interval (minimum interwiring distance) is preferably equal to or greater than 20 μm and equal to or smaller than 100 μm.

Each of the peripheral wiring may be covered with a protective insulating film formed of a urethane resin, an acrylic resin, an epoxy resin, or the like. In a case where the protective insulating film is provided, it is possible to prevent the migration, rusting, and the like of the peripheral wiring. It is preferable that the insulating film does not contain halogen impurities because the impurities are likely to cause the corrosion of the peripheral wiring. The film thickness of the protective insulating film is preferably 1 to 20 μm.

In a case where the conductive film 1 for a touch panel is used as a touch panel, the first external connection terminal 13 and the second external connection terminal 23 are electrically connected to Flexible Printed Circuits through an Anisotropic Conductive Film. The flexible printed circuits are connected to a touch panel control board having a driving function and a position detection function.

For the purpose of improving the electric connectivity with respect to the flexible printed circuits, the first external connection terminal 13 and the second external connection terminal 23 are formed to have a terminal width larger than the wiring width of the first peripheral wiring 12 and the second peripheral wiring 22. Specifically, each of the first external connection terminal 13 and the second external connection terminal 23 preferably has a terminal width equal to or greater than 0.1 mm and equal to or smaller than 0.6 mm and a terminal length equal to or greater than 0.5 mm and equal to or smaller than 2.0 mm.

The transparent insulating substrate 5 corresponds to a substrate having a first surface and a second surface facing the first surface. The first conductive layer 8 is disposed on the first surface (front surface), and the second conductive layer 9 is disposed on the second surface (rear surface). Although FIG. 2 shows a state where the transparent insulating substrate 5 comes into direct contact with the first conductive layer 8 and the second conductive layer 9, one or more functional layers such as an adhesion enhancing layer, an undercoat layer, a hardcoat layer, and an optical adjustment layer can be formed between the transparent insulating substrate 5 and the first conductive layer 8 as well as the second conductive layer 9.

Figure 4:
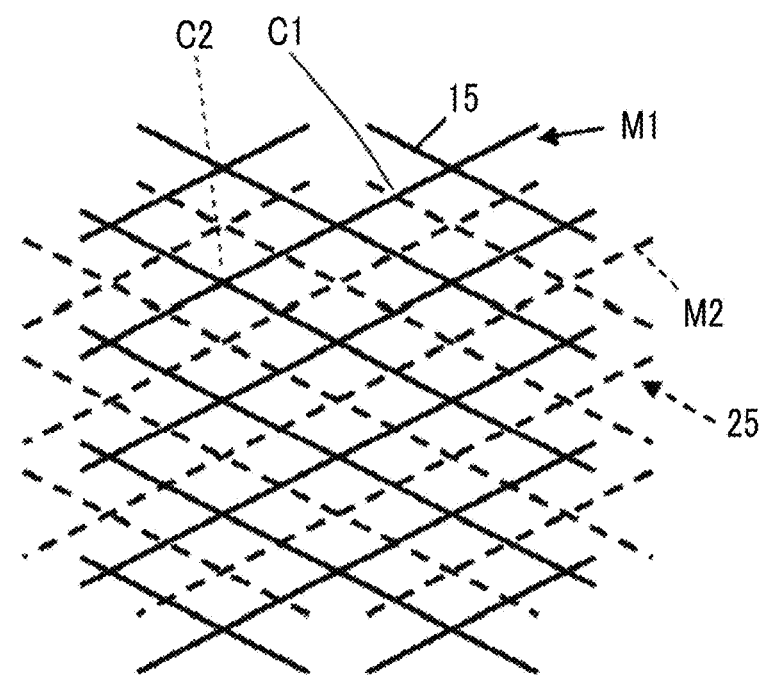
FIG. 4 is a schematic view showing portions in which a first electrode 11 and a second electrode 21 in FIG. 3 cross each other.

FIG. 4 shows portions in which the first electrode 11 and the second electrode 21 cross each other. The first electrode 11 formed on the front surface of the transparent insulating substrate 5 is formed of a mesh pattern M1 composed of a first metal thin wire 15, and the second electrode 21 disposed on the rear surface of the transparent insulating substrate 5 is formed of a mesh pattern M2 composed of a second metal thin wire 25. In a case where the touch panel is viewed from the viewer's side, the first metal thin wire 15 and the second metal thin wire 25 are disposed such that they cross each other in the portions in which the first electrode 11 and the second electrode 21 cross each other. In FIG. 4, in order to make it easy for the first metal thin wire 15 and the second metal thin wire 25 to be differentiated from each other, the second metal thin wire 25 is indicated by a dotted line, but in reality, the second metal thin wire 25 is formed of a connected wire just like the first metal thin wire 15.

It is preferable that the mesh pattern has a pattern shape in which the same mesh (regular cell) as shown in FIG. 4 is repeatedly disposed, and the mesh shape is particularly preferably a diamond shape. The pattern shape may be a quadrangular shape such as a parallelogram, a square, or a rectangle, a regular hexagon shape, or other polygon shapes. In a case where the mesh shape is a diamond shape, from the viewpoint of reducing moire formed between the pattern and the pixels of the display device, an acute angle of the diamond is preferably equal to or greater than 20° and equal to or smaller than 70°. From the viewpoint of visibility, the center-to-center distance between meshes (mesh pitch) is preferably 100 to 600 μm. It is preferable that the mesh pattern M1 formed of the first metal thin wire 15 and the mesh pattern M2 formed of the second metal thin wire 25 have the same shape. Furthermore, from the viewpoint of visibility, it is preferable that the mesh pattern M1 formed of the first metal thin wire 15 and the mesh pattern M2 formed of the second metal thin wire 25 are disposed by being caused to deviate from each other by a distance corresponding to 1/2 of the mesh pitch as shown in FIG. 4 such that a mesh pattern having a mesh pitch that is 1/2 of the aforementioned mesh pitch is formed from the viewer's side. In another aspect, the mesh shape may be a random pattern or a semi-random shape obtained by imparting a certain degree of randomicity to a regular cell shape as described in JP2013-214545A in which about 10% of randomicity is imparted to the pitch of regular diamond cells.

Furthermore, a dummy mesh pattern, which is insulated from the electrodes formed of the first metal thin wire 15 and the second metal thin wire 25 respectively, may be provided between the first electrodes 11 adjacent to each other and between the second electrodes 21 adjacent to each other. It is preferable that the dummy mesh pattern is formed to have the same mesh shape as that of the mesh pattern forming the electrodes.

The touch panel 2 and the display device may be bonded to each other by a method of directly bonding them to each other by using a transparent pressure sensitive adhesive (direct bonding method) or a method of bonding only the peripheries of the touch panel 2 and the display device to each other by using a double-sided tape (air gap method), and any of these may be used. At the time of bonding the touch panel 2 and the display device to each other, a protective film may be additionally provided on the conductive member 6B or the protective layer 7B. As the protective film, for example, a PET film (thickness: 20 to 150 µm) with a hardcoat is used. It is possible to adopt a constitution in which the protective film is bonded to the top of the conductive member 6B or the protective layer 7B by using an Optical Clear Adhesive.

As the transparent pressure sensitive adhesive used in the direct bonding method, it is possible to use an Optical Clear Adhesive or an Optical Clear Resin used as the transparent pressure sensitive adhesive 4 described above, and the film thickness thereof is preferably equal to or greater than 10 µm and equal to or smaller than 100 µm. As the optical clear adhesive, for example, an 8146 series manufactured by 3M can be preferably used as described above. It is preferable that the relative permittivity of the transparent pressure sensitive adhesive used in the direct bonding method is lower than the relative permittivity of the aforementioned transparent pressure sensitive adhesive 4, because then the detection sensitivity of the touch panel 2 is improved. The relative permittivity of the transparent pressure sensitive adhesive used in the direct bonding method is preferably 2.0 to 3.0.

In view of further improving the effects of the present invention, the visible light reflectance of each of the viewer's side surface of the first metal thin wire 15 and the viewer's side surface of the second metal thin wire 25 is preferably equal to or lower than 5%, and more preferably less than 1%. In a case where the visible light reflectance is within this range, the mesh can be effectively inhibited from being noticed, or haze can be effectively reduced.

The visible light reflectance is measured by the following method. First, by using an ultraviolet-visible spectrophotometer V660 (single reflection measurement unit SLM-721) manufactured by JASCO Corporation, a reflectance spectrum is measured at a measurement wavelength of 350 nm to 800 nm and an incidence angle of 5°. At this time, the regular reflection light from a vapor-deposited aluminum flat mirror is used as a base line. From the obtained reflectance spectrum, the Y value in the XYZ color space (color-matching function JIS Z9701-1999) with a light source of D65 at a 2 degree field of view is calculated using a color computation program manufactured by JASCO Corporation, and the value is taken as the visible light reflectance.

As the materials constituting the first metal thin wire 15 and the second metal thin wire 25, it is possible to use metals such as silver, aluminum, copper, gold, molybdenum, and chromium, and an alloy of these. These materials can be used as a single layer or a laminate. From the viewpoint of inhibiting the mesh of the metal thin wire from being noticed and reducing moire, the line width of each of the first metal thin wire 15 and the second metal thin wire 25 is preferably equal to or greater than 0.5 µm and equal to or smaller than 5 µm. The first metal thin wire 15 and the second metal thin wire 25 may be in the form of a straight line, a folded line, a curved line, or wavy line. The film thickness of each of the first metal thin wire 15 and the second metal thin wire 25 is preferably equal to or greater than 0.1 µm from the viewpoint of the value of resistance, and preferably equal to or smaller than 3 µm from the viewpoint of the visibility in an oblique direction. From the viewpoint of the visibility in an oblique direction and from the viewpoint of the workability of patterning, the film thickness is more preferably equal to or smaller than ½ of the line width of the metal thin wire. In addition, in order to reduce the visible light reflectance of the first metal thin wire 15 and the second metal thin wire 25, a blackened layer may be provided on the viewer's side of the first metal thin wire 15 and the second metal thin wire 25.

The conductive member 6A including the first electrode 11, the first peripheral wiring 12, the first external connection terminal 13, and the first connector portion 14 can be formed of the material constituting the first metal thin wire 15. Accordingly, the conductive member 6A including the first electrode 11, the first peripheral wiring 12, the first external connection terminal 13, and the first connector portion 14 can be simultaneously formed of the same metal at the same thickness.

The same is true for the conductive member 6B including the second electrode 21, the second peripheral wiring 22, the second external connection terminal 23, and the second connector portion 24.

The sheet resistance of the first electrode 11 and the second electrode 21 is preferably equal to or higher than 0.1 Ω/square and equal to or lower than 200 Ω/square. Particularly, in a case where the electrodes are used in a projected capacitance-type touch panel, the sheet resistance thereof is preferably equal to or higher than 10 Ω/square and equal to or lower than 100 Ω/square.

Figure 5:
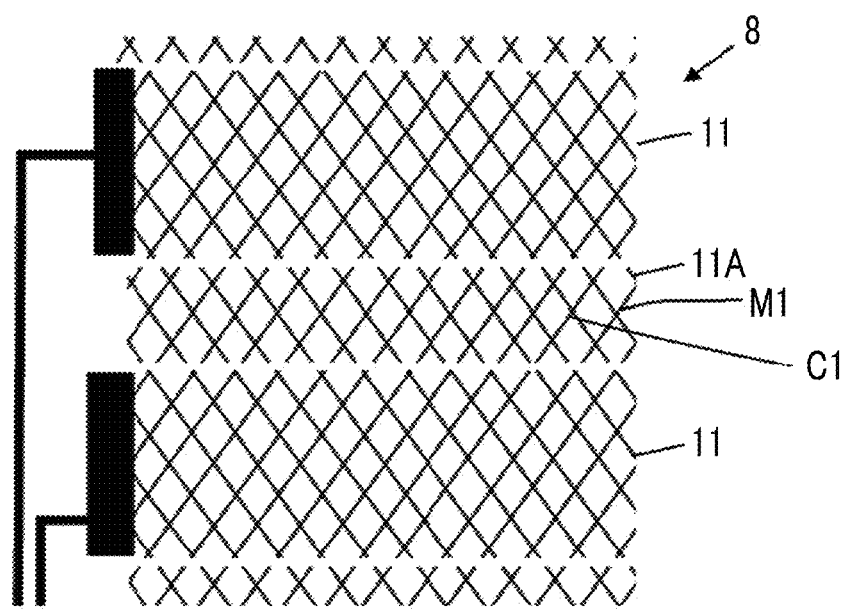
FIG. 5 is a schematic view showing an embodiment of a first dummy electrode 11A that a first conductive layer 8 in an active area S1 in FIG. 3 may have.

As shown in FIG. 5, the first conductive layer 8 disposed on the front surface of the transparent insulating substrate 5 in the active area S1 may have a plurality of first dummy electrodes 11A each of which is disposed between the plurality of first electrodes 11. The plurality of first dummy electrodes 11A are insulated from the plurality of first electrodes 11, and have the first mesh pattern M1 constituted with a number of first cells C1 just like the first electrodes 11.

A disconnection portion having a width of equal to or greater than 5 µm and equal to or smaller than 30 µm is provided in the metal thin wire disposed along the continuous first mesh pattern M1, and in this way, the first electrode 11 and the adjacent first dummy electrode 11A are electrically insulated from each other. Although FIG. 5 shows a state where the disconnection portion is formed only in the border line between the first electrode 11 and the adjacent first dummy electrode 11A, the disconnected portion may be formed in all or some of the sides of the first cell C1 in the first dummy electrode 11A.

The second conductive layer 9 disposed on the rear surface of the transparent insulating substrate 5 in the active area S1 may have a plurality of second dummy electrodes each of which is disposed between the plurality of second electrodes 21, although second conductive layer 9 is not shown in the drawing. The second dummy electrodes are insulated from the plurality of second electrodes 21, and have the second mesh pattern M2 constituted with a number of second cells C2 just like the second electrodes 21.

A disconnection portion having a width of equal to or greater than 5 µm and equal to or smaller than 30 µm is provided in the metal thin wire disposed along the continuous second mesh pattern M2, and in this way, the second electrode 21 and the adjacent second dummy electrode are electrically insulated from each other. The disconnection portion may be formed only in the border line between the second electrode 21 and the adjacent second dummy electrode, or may be formed in all or some of the sides of the second cell C2 in the second dummy electrode.

As described above, the conductive film 1 for a touch panel is manufactured by forming the conductive member 6A, which includes the first electrode 11, the first peripheral wiring 12, the first external connection terminal 13, and the first connector portion 14, on the front surface of the transparent insulating substrate 5 and forming the conductive member 6B, which includes the second electrode 21, the second peripheral wiring 22, the second external connection terminal 23, and the second connector portion 24, on the rear surface of the transparent insulating substrate 5.

At this time, the first electrode 11 is formed of the first conductive layer 8 in which the first metal thin wire 15 is disposed along the first mesh pattern M1, the second electrode 21 is formed of the second conductive layer 9 in which the second metal thin wire 25 is disposed along the second mesh pattern M2, and the first conductive layer 8 and the second conductive layer 9 are disposed such that the conductive layers overlap each other in the active area S1 as shown in FIG. 3 in a state of interposing the transparent insulating substrate 5 therebetween.

The method for forming the conductive member 6A and the conductive member 6B is not particularly limited. For example, as described in paragraphs "0067" to "0083" in JP2012-185813A, paragraphs "0115" to "0126" in JP2014-209332A, or paragraphs "0215" and "0216" in JP2015-5495A, by exposing a photosensitive material, which has an emulsion layer containing a photosensitive silver halide salt, to light and performing a development treatment, the conductive members 6A and 6B can be formed.

The conductive members can also be formed by forming a metal thin film on each of the front surface and the rear surface of the transparent insulating substrate 5 and patternwise printing a resist on each of the metal thin film or by performing exposure and development on a resist, with which the entire surface of the substrate is coated, such that a pattern is formed and etching the metal in the opening portion. In addition, it is possible to use a method in which a paste containing the fine particles of a material constituting the conductive member is printed on the front surface and the rear surface of the transparent insulating substrate 5 and plated with a metal, a method of using an ink jet method in which an ink containing the fine particles of a material constituting the conductive member is used, a method of forming the conductive member through screen printing by using an ink containing the fine particles of a material constituting the conductive member, a method of forming grooves in the transparent insulating substrate 5 and coating the grooves with a conductive ink, a patterning method exploiting a microcontact printing, and the like.

In the aspect described above, the conductive member 6A including the first electrode 11, the first peripheral wiring 12, the first external connection terminal 13, and the first connector portion 14 is disposed on the front surface of the transparent insulating substrate 5, and the conductive member 6B including the second electrode 21, the second peripheral wiring 22, the second external connection terminal 23, and the second connector portion 24 is disposed on the rear surface of the transparent insulating substrate 5. However, the present invention is not limited to this aspect.

For example, a constitution may be adopted in which the conductive member 6A and the conductive member 6B are disposed on one surface of the transparent insulating substrate 5 through an interlayer insulating film.

Furthermore, a constitution can be adopted in which two sheets of substrates are used. That is, the conductive member 6A can be disposed on the front surface of a first transparent insulating substrate, the conductive member 6B can be disposed on the front surface of a second transparent insulating substrate, and the first transparent insulating substrate and the second transparent insulating substrate can be used by being bonded to each other by using an Optical Clear Adhesive.

Moreover, a constitution may be adopted in which the conductive member 6A and the conductive member 6B are disposed on a surface of the hardcoat film 3 shown in FIG. 2 through an interlayer insulating film without using the transparent insulating substrate 5.

It goes without saying that the electrode pattern shape of the capacitance-type touch panel can be applied to, in addition to a so-called bar-and-stripe electrode pattern shape shown in FIG. 3, for example, the diamond pattern disclosed in FIG. 16 in WO2010/012179A and the electrode pattern shape disclosed in FIG. 7 or 20 in WO2013/094728A. Furthermore, the electrode pattern shape can be applied to electrode pattern shapes of other capacitance-type touch panels. In addition, the electrode pattern shape can be applied to a touch panel disclosed in US2012/0262414 that has a constitution in which a detection electrode is provided only on one side of a substrate as in an electrode constitution without a crossing portion.

The touch panel can be used in combination with other functional films such as the functional film for improving image quality disclosed in JP2014-13264A that prevents the occurrence of rainbow-like irregularities by using a substrate having a high retardation value, the circular polarizing plate disclosed in JP2014-142462A that is for improving the visibility of a touch panel electrode, and the like.

<Polarizing Plate>

The hardcoat film of the present invention can be used as a polarizing plate in which a polarizer is provided on a side, which is opposite to a surface on which with the first cured layer and the second cured layer are disposed, of the support.

More specifically, in a polarizing plate including a polarizer and a protective film disposed on both sides of the polarizer, the hardcoat film of the present invention can be used as either or both of the protective films. In a case where the hardcoat film of the present invention is used, it is possible to provide a polarizing plate which has ameliorated brittleness and excellent handleability, does not impair display quality by surface smoothness or wrinkles, and can suppress the leakage of light at the time of the moisture-heat test.

The hardcoat film of the present invention may be used as one of the protective films, and a general cellulose acetate film may be used as the other protective film. In this case, as the other protective film, it is preferable to use a cellulose acetate film which is manufactured by a solution film forming method and stretched along a width direction in a roll film form at a stretching ratio of 10% to 100%.

An aspect is also preferable in which, of the two sheets of the protective films of the polarizer, the film other than the hardcoat film of the present invention is an optical compensation film having an optical compensation layer including an optically-anisotropic layer. The optical compensation film (phase difference film) can improve the viewing angle characteristics of a liquid crystal display screen. As the optical compensation film, known optical compensation films can be used, but in view of widening the viewing angle, the optical compensation film described in JP2001-100042A is preferable.

The polarizer includes an iodine-based polarizer, a dye-based polarizer using a dichroic dye, and a polyene-based polarizer. The iodine-based polarizer and the dye-based polarizer are generally manufactured using a polyvinyl alcohol-based film.

As the polarizer, a known polarizer or a polarizer cut out from a long polarizer whose absorption axis is neither parallel nor perpendicular to the longitudinal direction may be used. The long polarizer whose absorption axis is neither parallel nor perpendicular to the longitudinal direction is manufactured by the following method.

That is, the polarizer can be manufactured by a stretching method in which, in a state where both ends of a continuously supplied polymer film such as a polyvinyl alcohol-based film are being held by holding means, the film is stretched under a tension applied thereto such that the film is stretched 110% to 2,000% in at least the film width direction; a difference in a moving rate between the holding devices at both ends of the film in the longitudinal direction is made within 3%; and the transport direction of the film is bent in a state where both ends of the film are being held, such that the transport direction of the film at the exit of the step of holding both ends of the film and the actual stretching direction of the film form an oblique angle of 20° to 70°. From the viewpoint of productivity, it is particularly preferable to use a stretching method in which an oblique angle of 45° is formed between the transport direction of the film at the exit of the step of holding both ends of the film and the actual stretching direction of the film.

The stretching method of the polymer film is specifically described in paragraphs "0020" to "0030" in JP2002-86554A.

<Phase Difference Plate>

The hardcoat film of the present invention may be used as a phase difference plate which has a hardcoat film and an optically-anisotropic layer formed on one surface of the aforementioned support by using a composition containing a liquid crystal compound as described in JP5703187B. The surface of the support on which the optically-anisotropic layer is laminated is not particularly limited, but it is preferable that the optically-anisotropic layer is laminated on a surface opposite to a surface on which a cured layer is laminated. An alignment film for controlling the alignment of a liquid crystal compound may be provided between the support and the optically-anisotropic layer containing the liquid crystal compound. The optical characteristics of the hardcoat film on which the optically-anisotropic layer is laminated are not particularly limited. However, the in-plane retardation Re of the hardcoat film at 550 nm is preferably 5 to 300 nm, more preferably 10 to 250 nm, and even more preferably 80 to 200 nm. Furthermore, the Nz value of the hardcoat film defined below is preferably 0 to 2.0, more preferably 0.1 to 1.6, and particularly preferably 0.1 to 0.9 (Nz value is represented by 0.5+Rth/Re, and Rth represents a retardation in a thickness direction; the methods for measuring these optical characteristics will be specifically described later). Particularly, assuming that the hardcoat film can be used as a ¼ wave phase difference plate, Re and the Nz value are preferably 80 to 200 nm and 0.1 to 0.9 respectively, and more preferably 100 to 150 nm and 0.1 to 0.9 respectively.

<¼ Wave Phase Difference Plate>

The hardcoat film of the present invention may be used as a ¼ wave phase difference plate. The ¼ wave phase difference plate can convert linearly polarized light emitted from a polarizer into a circularly polarized light. Therefore, for example, in a case where a viewer wears polarized sunglasses, the ¼ wave phase difference plate can improve the visibility. The ¼ wave phase difference plate can be prepared by known methods. Alternatively, a commercial resin film having a ¼ wave phase difference function may be used as it is, or a ¼ wave phase difference plate, which is obtained by performing a stretching treatment or the like on a commercial resin film so as to impart a ¼ wave phase difference function thereto, may be used. The surface of the support in the hardcoat film and a film on which an optically-anisotropic layer is laminated may be bonded to each other by using a pressure sensitive adhesive, and only the film portion may be peeled off, such that the optically-anisotropic layer is provided on the hardcoat film. Furthermore, the ¼ wave phase difference plate may be prepared, for example, by coating any support with a curable composition containing a liquid crystal compound as described in JP4866638B. Between the surfaces of the support of the hardcoat film, the surface on which the first cured layer and the second cured layer are not formed may be provided with the ¼ wave phase difference plate, or the surface of the second cured layer may be provided with the ¼ wave phase difference plate.

EXAMPLES

Hereinafter, the present invention will be more specifically described based on examples. The materials as well as the amount and proportion thereof used, the content of a treatment, the sequence of a treatment, and the like shown in the following examples can be appropriately changed within a range that does not depart from the gist of the present invention. Accordingly, the scope of the present invention is not limited to the specific examples described below. Unless other specified, a mixing ratio means a mass ratio. Furthermore, unless otherwise specified, the steps described below were performed at room temperature. The room temperature is a temperature around 25° C.

<Measurement of Weight-Average Molecular Weight-Number-Average Molecular Weight>

The weight-average molecular weight-number-average molecular weight of polymers such as an oligomer and a polymer having a repeating unit were measured by Gel Permeation Chromatography (GPC) and expressed in terms of polystyrene. Specific examples of the measurement conditions include the following.

GPC device: HLC-8120 (manufactured by Tosoh Corporation):

Column: TSK gel Multipore HXL-M (manufactured by Tosoh Corporation, 7.8 mm (inside diameter)×30.0 cm)

Eluent: tetrahydrofuran

Examples 1 to 32 and Comparative Examples 1 to 3

1. Preparation of Support (Film Thickness 80 μm, TAC)

A cellulose acylate laminated film including three layers of outer layer/core layer/outer layer was prepared by the following method.

(1) Preparation of Cellulose Acylate Dope for Core Layer

The following composition was put into a mixing tank and stirred, thereby preparing a cellulose acylate dope for a core layer.

Cellulose Acylate Dope for Core Layer

Cellulose acetate with a degree of acetyl substitution of 2.88 and a weight-average molecular weight of 260,000 . . . 100 parts by mass Phthalic acid ester oligomer A having the following structure . . . 10 parts by mass Compound (A-1) represented by Formula I shown below . . . 4 parts by mass Ultraviolet absorber II represented by Formula II shown below (manufactured by BASF SE) . . . 2.7 parts by mass Light stabilizer (manufactured by BASF SE, TINUVIN 123) . . . 0.18 parts by mass N-alkenylpropylenediamine tetraacetic acid (manufactured by Nagase ChemteX Corporation, TEKURAN DO) . . . 0.02 parts by mass Methylene chloride (first solvent) . . . 430 parts by mass Methanol (second solvent) . . . 64 parts by mass The used compounds will be shown below:

Phthalic Acid Ester Oligomer A (Weight-Average Molecular Weight: 750)

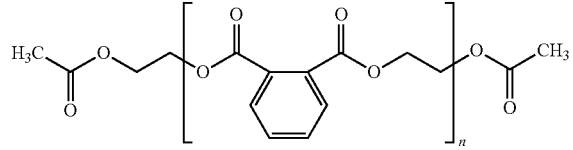

Compound (A-1) Represented by Formula 1

Formula I

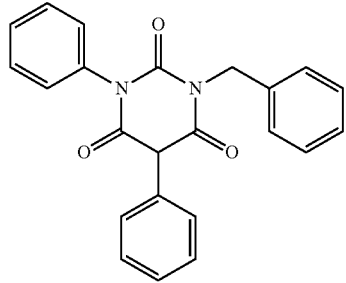

Ultraviolet Absorber II Represented by Formula II

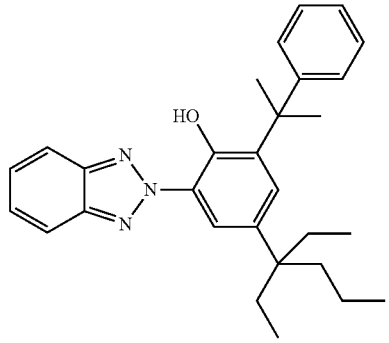 [SMILES: CCCC(CC)(CC)c1cc(-n2nc3ccccc3n2)c(O)c(C(C)(C)c2ccccc2)c1]

(2) Preparation of Cellulose Acylate Dope for Outer Layer 10 parts by mass of a composition containing inorganic particles shown below was added to 90 parts by mass of the aforementioned cellulose acylate dope for a core layer, thereby preparing a cellulose acylate dope solution for an outer layer.

Composition Containing Inorganic Particles

Silica particles having an average primary particle diameter of 20 nm (AEROSIL R972 manufactured by NIPPON AEROSIL CO., LTD) . . . 2 parts by mass Methylene chloride (first solvent) . . . 76 parts by mass Methanol (second solvent) . . . 11 parts by mass Cellulose acylate dope for core layer . . . 1 part by mass (3) Preparation of Support (TAC)

In order for the cellulose acylate dope for an outer layer to be positioned on both sides of the cellulose acylate dope for a core layer, three kinds of dopes including the cellulose acylate dope for an outer layer, the cellulose acylate dope for a core layer, and the cellulose acylate dope for an outer layer were simultaneously cast onto a drum with a surface temperature of 20° C. from a casting outlet. After the amount of residual solvent in the obtained casting film became about 20% by mass, the film was peeled off from the drum. Then, both ends of the obtained film in the width direction were fixed to tenter clips, and after the amount of residual solvent became 3% to 15% by mass, the film was dried while being stretched 118% in the width direction. Thereafter, the film was transported between rolls of a heat treatment device and then further dried, thereby preparing a resin film having a thickness of 80 μm (outer layer/core layer/outer layer=3 μm/74 μm/3 μm). The obtained resin film was used a TAC support and described as TAC in Table 3 shown below.

2. Preparation of Support (Film Thickness: 120 μm, 150 μm, 300 μm)

TAC supports were prepared by the same method as described above, except that the thicknesses thereof were adjusted to be 120 μm (outer layer/core layer/outer layer=3 μm/1 14 μm/3 μm), 150 μm (outer layer/core layer/outer layer=3 μm/144 μm/3 μm), and 300 μm (outer layer/core layer/outer layer=3 μm/294 μm/3 μm).

3. Preparation of Support (PMMA/PC/PMMA)

Pellets of an acrylic resin (trade name: SUMIPEX EX) manufactured by Sumitomo Chemical Co., Ltd were put into a single-screw extruder having an extrusion diameter of 65 mm, and a polycarbonate-based resin (trade name: CALIBRE 301-10) manufactured by Sumika Styron Polycarbonate Limited was put into a single-screw extruder having an extrusion diameter of 45 mm. The resins were melted, and by a multi-manifold method, the molten resins were integrated by being laminated with each other. Then, the processing values were controlled such that the film thickness of each layer became 35 μm/230 μm/35 μm after drying, and the resins were extruded through T-shaped dies at a set temperature of 260° C. The obtained film-shaped substance was molded by being sandwiched between a pair of metal rolls, thereby preparing a resin film (PMMA/PC/PMMA) which had a thickness of 300 μm and constituted with three layers of acrylic resin film/polycarbonate-based resin film/acrylic resin film.

4. Preparation of Support (PET)

(1) Preparation of Composition for Forming Easy-Adhesive Layer (1-1) Preparation of Polyester-Based Resin A sulfonic acid-based aqueous dispersion of a polyester-based resin, which was prepared by copolymerizing polymerizable compounds composed as below, was obtained.

(Acid components) terephthalic acid/isophthalic acid/sodium 5-sulfoisophthalic acid//(diol components) ethylene glycol/diethylene glycol=44/46/10/84/16 (molar ratio)

(1-2) Preparation of Cross-Linking Agent (Isocyanate-Based Compound A)

A nitrogen atmosphere was created in a four-neck flask (reactor) equipped with a stirrer, a thermometer, a reflux cooling pipe, and a nitrogen blowing pipe. 1,000 parts by mass of hexamethylene diisocyanate (HDI) and 22 parts by mass of trimethylolpropane (molecular weight: 134) as a trihydric alcohol were put into the reactor. The temperature of the reaction solution in the rector was kept at 90° C., and in this state, the reaction solution was stirred for 1 hour so as to perform urethanization. Then, the temperature of the reaction solution was kept at 60° C., trimethylbenzylammonium.hydroxide as an isocyanurating catalyst was added thereto, and at a point in time when the isocyanurate conversion rate became 48%, the reaction was stopped by adding phosphoric acid. Thereafter, the reaction solution was filtered, and then the unreacted HDI was removed using a thin film evaporator.

The obtained isocyanate-based compound a had a viscosity of 25,000 mPa·s at 25° C., an isocyanate group content of 19.9% by mass, a number-average molecular weight of 1,080, and the average number of isocyanate groups of 5.1. Through Nuclear Magnetic Resonance (NMR) spectroscopy, the existence of a urethane bond, an allophanate bond, and an isocyanurate bond was confirmed.

A nitrogen atmosphere was created in a four-neck flask (reactor) equipped with a stirrer, a thermometer, a reflux cooling pipe, a nitrogen blowing pipe, and a dropping funnel. 100 parts by mass of the isocyanate-based compound a obtained as above, 42.3 parts by mass of methoxypolyethylene glycol having a number-average molecular weight of 400, and 76.6 parts by mass of dipropylene glycol dimethyl ether were put into the reactor, and the temperature of the reaction solution was kept at 80° C. for 6 hours. Then, the reaction solution was cooled to a temperature of 60° C., 72 parts by mass of diethyl malonate and 0.88 parts by mass of a 28% by mass methanol solution of sodium methylate were added thereto, and the reaction solution was kept as it was for 4 hours. Thereafter, 0.86 parts by mass of 2-ethylhexyl acid phosphate was added thereto. Subsequently, 43.3 parts by mass of diisopropylamine was added thereto, and the temperature of the reaction solution was kept at 70° C. for 5 hours. By analyzing the reaction solution through gas chromatography, it was confirmed that the reaction rate of diisopropylamine was 70%. In this way, an isocyanate-based compound A was obtained (concentration of solid contents: 70% by mass, mass of effective NCO groups: 5.3% by mass).

(1-3) Preparation of Composition for Forming Easy-Adhesive Layer 57.6 parts by mass of a carboxylic acid-modified polyvinyl alcohol resin (manufactured by KURARAY CO., LTD.) having a degree of saponification of 77% and a degree of polymerization of 600, 28.8 parts by mass (solid content) of the polyester-based resin prepared as above, 4.0 parts by mass of the isocyanate-based compound A prepared as above, 0.7 parts by mass of an organic tin-based compound (ELASTRON CAT-21 manufactured by DKS Co., Ltd.), and 8.1 parts by mass of silica sol having an average primary particle diameter of 80 nm were mixed together, the mixture was diluted with water such that the solid content thereof became 8.9 parts by mass, thereby preparing a composition for forming an easy-adhesive layer.

(2) Preparation of PET Film (2-1) Preparation of Raw Material Polyester 1

Terephthalic acid and ethylene glycol were directly reacted with each other as described below, water was distilled away, and esterification was performed. Then, by a direct esterification method in which polycondensation was performed under reduced pressure, a raw material polyester 1 (Sb catalyst-based PET) was obtained using a continuous polymerization device.

(2-1-1) Esterification Reaction 4.7 tons of high-purity terephthalic acid and 1.8 tons of ethylene glycol were mixed together for 90 minutes, thereby forming a slurry. The slurry was continuously supplied to the first esterification reactor at a flow rate of 3,800 kg/h. Furthermore, an ethylene glycol solution containing antimony trioxide was continuously supplied thereto, and a reaction was performed with stirring at an internal temperature of the reactor of 250° C. and an average residence time of about 4.3 hours. At this time, the antimony trioxide was continuously added such that the amount of Sb added became 150 mass parts per million (ppm) in terms of the element.

The reactant was moved to a second esterification reactor and reacted with stirring at an internal temperature of the reactor of 250° C. and an average residence time of 1.2 hours. An ethylene glycol solution containing magnesium acetate and an ethylene glycol solution containing trimethyl phosphate were continuously supplied to the second esterification reactor, such that the amount of Mg added and the amount of P added became 65 mass ppm and 35 mass ppm respectively in terms of the elements.

(2-1-2) Polycondensation Reaction

The esterification reaction product obtained as above was continuously supplied to a first polycondensation reactor and subjected to polycondensation with stirring at a reaction temperature of 270° C., an internal pressure of the reactor of 20 torr ($2.67 \times 10^{-4}$ MPa, 1 Torr≈133.3224 Pa), and an average residence time of about 1.8 hours.

The product was moved to a second polycondensation reactor and reacted (polycondensed) with stirring under the condition of an internal temperature of the reactor of 276° C., an internal pressure of the reactor of 5 torr ($6.67 \times 10^{-4}$ MPa), and an average residence time of about 1.2 hours.

Then, the product was moved to a third polycondensation reactor. The product was reacted (polycondensed) under the condition of an internal temperature of the reactor of 278° C. an internal pressure of the reactor of 1.5 torr ($2.0 \times 10^{-4}$ MPa), and an average residence time of 1.5 hours, thereby obtaining a reactant (polyethylene terephthalate (PET)).

(2-1-3) Preparation of Raw Material Polyester 1

Thereafter, the obtained reactant was jetted to cold water in the form of strands and immediately cut, thereby preparing polyester pellets (cross-section: major axis of about 4 mm, minor axis of about 2 mm, and length of about 3 mm). Intrinsic viscosity (IV) of the obtained polymer was 0.63 dL/g. The polymer was used as a raw material polyester 1.

(2-2) Preparation of Raw Material Polyester 2

10 parts by mass of a dried ultraviolet absorber (2,2'-(1,4-phenylene)bis(4H-3,1-benzoxazin-4-one)) and 90 parts by mass of the raw material polyester 1 (IV=0.63 dL/g) were mixed together and made into pellets in the same manner as in Preparation of raw material polyester 1 by using a kneading extruder, thereby obtaining a raw material polyester 2 containing an ultraviolet absorber.

(2-3) Preparation of PET Film

A polyester-based resin film (laminated film) constituted with three layers (layer I/layer II/layer III) was prepared by the following method.

A composition for layer II shown below was dried until the moisture content thereof became equal to or lower than 20 mass ppm, put into a hopper of a single-screw kneading extruder having a diameter of 50 mm and melted at 300° C. in the extruder, thereby preparing a molten resin material for forming the layer II positioned between the layer I and the layer III.

Composition for Layer II

Raw material polyester 1 . . . 90 parts by mass

Raw material polyester 2 containing 10 parts by mass of ultraviolet absorber (2,2'-(1,4-phenylene)bis(4H-3,1-benzoxazin-4-one)) . . . 10 parts by mass The raw material polyester 1 was dried until the moisture content thereof became equal to or lower than 20 mass ppm, then put into a hopper of a single-screw kneading extruder having a diameter of 30 mm, and melted at 300° C. in the extruder, thereby preparing a molten resin material for forming the layer I and the layer III.

These two kinds of molten resin materials were respectively passed through a gear pump and a filter (pore size: 20 μm). Then, through a block by which the two kinds of resins become confluent as three layers, the molten resin materials were laminated such that the molten resin material extruded from the extruder for the layer II became the inner layer and that the molten resin material extruded from the extruder for the layer I and the layer III became the outer layers, and then extruded in the form of a sheet from a die having a width of 120 mm.

The molten resin sheet extruded from the die was extruded onto a cooling cast drum set to have a surface temperature of 25° C. and caused to come into close contact with the cooling cast drum by using a method of applying static electricity. By using a peeling roll disposed to face the cooling cast drum, the film obtained after cooling was peeled from the drum, thereby obtaining a non-stretched film. At this time, the amount of resin jetted from each extruder was adjusted such that a thickness ratio of layer I:layer II:layer III became 10:80:10.

By using a group of heated rolls and an infrared heater, the non-stretched film was heated such that the surface temperature of the film became 95° C. Then, by using a group of rolls of different circumferential speeds, the film was stretched 400% in a direction perpendicular to the transport direction of the film, thereby obtaining a resin film (laminated film) having a thickness of 300 μm.

(3) Preparation of Resin Film with Easy-Adhesive Layer

One surface of the resin film prepared as above was subjected to a corona discharge treatment at a throughput of 500 J/m$^2$. Then, the surface having undergone the corona discharge treatment was coated with the composition for forming an easy-adhesive layer, which was prepared as above, by a reverse roll method with adjusting the amount of the composition such that the thickness became 0.1 μm after drying. In this way, a resin film with an easy-adhesive layer was prepared. The obtained resin film with an easy-adhesive layer was used as a PET support and described as PET in Table 3 shown below.

5. Preparation of Hardcoat Film

By using any of the curable compositions for forming a first cured layer A-1 to A-12 and the curable compositions for forming a second cured layer B-1 to B-9 shown in Table 1 or Table 2, the first cured layer and the second cured layer were formed by the method described below, thereby preparing films of Examples 1 to 32 and Comparative Examples 1 to 3.

The details of each step and the compounds used for preparing the hardcoat films are described below.

(5-1) Preparation of Kit Including Curable Composition for Forming Cured Layer

The components were mixed together according to the composition shown in the following Table 1, and filtered through a polypropylene filter having a pore size of 10 μm, thereby preparing curable compositions for forming a first cured layer A-1 to A-12. Furthermore, the components were mixed together according to the composition shown in the following Table 2, and filtered through a polypropylene filter having a pore size of 10 μm, thereby preparing curable compositions for forming a second cured layer B-1 to B-9.

One kind of composition among the curable compositions for forming a first cured layer A-1 to A-12 and one kind of composition among the curable compositions for forming a second cured layer B-1 to B-9 were combined according to the combination shown in the following Table 3, thereby obtaining a kit.

TABLE 1

| Curable composition for forming a first cured layer | | A-1 | A-2 | A-3 | A-4 | A-5 | A-6 | A-7 | A-8 | A-9 | A-10 | A-11 | A-12 |
|---|---|---|---|---|---|---|---|---|---|---|---|---|---|
| Polymerizable compound 1 or 2, or compound for comparison | DPHA | 46.50% | 37.50% | 28.50% | 9.50% | 23.50% | 23.50% | 23.50% | 47.25% | 28.50% | | | 23.47% |
| | ATMMT | | | | | | | | | | 23.50% | | |
| | PETA | | | | | | | | | | | 23.50% | |
| | 2G | | | | | | | | | | | | |
| | IAA | | | | | | | | | | | | |
| | CYCLOMER | 48.00% | 57.00% | 66.00% | 85.00% | 56.00% | | | 47.25% | | 56.00% | 56.00% | 56.00% |
| | LIGHT ESTER G | | | | | | 56.00% | | | | | | |
| | 4HBAGE | | | | | | | 56.00% | | | | | |
| | CEL2021P | | | | | | | | | 66.00% | | | |
| Inorganic particles | MEK-AC-2140Z | | | | | 15.00% | 15.00% | 15.00% | | | 15.00% | 15.00% | 15.00% |
| Polymerization initiator | Radical photo-polymerization initiator Irg 184 | 4.00% | 4.00% | 4.00% | 4.00% | 4.00% | 4.00% | 4.00% | 4.00% | 4.00% | 4.00% | 4.00% | 4.00% |
| | Cationic photo-polymerization initiator PAG-1 | 1.50% | 1.50% | 1.50% | 1.50% | 1.50% | 1.50% | 1.50% | 1.50% | 1.50% | 1.50% | 1.50% | 1.50% |
| Antifoulant | RS-90 | | | | | | | | | | | | |
| | F-555 | | | | | | | | | | | | |

TABLE 1-continued

| Curable composition for forming a first cured layer | | A-1 | A-2 | A-3 | A-4 | A-5 | A-6 | A-7 | A-8 | A-9 | A-10 | A-11 | A-12 |
|---|---|---|---|---|---|---|---|---|---|---|---|---|---|
| Leveling agent | P-112 | | | | | | | | | | | | 0.03% |
| Solvent | Methyl ethyl ketone | 52.00% | 52.00% | 52.00% | 52.00% | 52.00% | 52.00% | 52.00% | 52.00% | 52.00% | 52.00% | 52.00% | 52.00% |
| | Methyl isobutyl ketone | 30.00% | 30.00% | 30.00% | 30.00% | 30.00% | 30.00% | 30.00% | 30.00% | 30.00% | 30.00% | 30.00% | 30.00% |
| | Methyl acetate | 18.00% | 18.00% | 18.00% | 18.00% | 18.00% | 18.00% | 18.00% | 18.00% | 18.00% | 18.00% | 18.00% | 18.00% |
| Solid content | | 70% | 70% | 70% | 70% | 70% | 70% | 70% | 70% | 70% | 70% | 70% | 70% |

TABLE 2

| Curable composition for forming a second cured layer | | B-1 | B-2 | B-3 | B-4 | B-5 | B-6 | B-7 | B-8 | B-9 |
|---|---|---|---|---|---|---|---|---|---|---|
| Polymerizable compound 3 or compound for comparison | DPHA | 95.30% | 78.80% | 80.30% | 63.80% | | | | 96.00% | 95.30% |
| | ATMMT | | | | | | | | | |
| | PETA | | | | | 95.30% | | | | |
| | 2G | | | | | | 95.30% | | | |
| | IAA | | | | | | | 95.30% | | |
| | CYCLOMER | | 15.00% | | 15.00% | | | | | |
| | LIGHT ESTER G | | | | | | | | | |
| | 4HBAGE | | | | | | | | | |
| | CEL2021P | | | | | | | | | |
| Inorganic particles | MEK-AC-2140Z | | | 15.00% | 15.00% | | | | | |
| Polymerization initiator | Radical photopolymerization initiator Irg 184 | 4.00% | 4.00% | 4.00% | 4.00% | 4.00% | 4.00% | 4.00% | 4.00% | 4.00% |
| | Cationic photopolymerization initiator PAG-1 | | 1.50% | | 1.50% | | | | | |
| Antifoulant | RS-90 | 0.70% | 0.70% | 0.70% | 0.70% | 0.70% | 0.70% | 0.70% | | |
| | F-555 | | | | | | | | | 0.70% |
| Solvent | Methyl ethyl ketone | 40.00% | 40.00% | 40.00% | 40.00% | 40.00% | 40.00% | 40.00% | 40.00% | 40.00% |
| | Methyl isobutyl ketone | 60.00% | 60.00% | 60.00% | 60.00% | 60.00% | 60.00% | 60.00% | 60.00% | 60.00% |
| | Methyl acetate | | | | | | | | | |
| Solid content | | 60% | 60% | 60% | 60% | 60% | 60% | 60% | 60% | 60% |

In Table 1 and Table 2, % means % by mass. In the above tables, the amount of components (solid contents) other than solvents is set such that the total amount of the solid contents becomes 100% by mass. Furthermore, the amount of solvents are set such that the total amount of the solvents becomes 100% by mass. In Tables 1 and 2, "Solid content" shows the concentration of the solid contents in the composition.

The abbreviations of the compounds used in the curable composition for forming a first cured layer and the curable composition for forming a second cured layer and the abbreviation of each of the compounds described in Tables 1 to 3 are shown below:

<Polymerizable Compound>

DPHA: mixture (manufactured by Nippon Kayaku Co., Ltd.) of dipentaerythritol pentaacrylate (having five radically polymerizable groups without a cationically polymerizable group) and dipentaerythritol hexaacrylate (having six radically polymerizable groups)

ATMMT: pentaerythritol tetraacrylate (having four radically polymerizable groups without a cationically polymerizable group) (manufactured by SHIN-NAKAMURA CHEMICAL CO., LTD.)

PETA: pentaerythritol triacrylate (having three radically polymerizable groups without a cationically polymerizable group) (manufactured by SHIN-NAKAMURA CHEMICAL CO., LTD.)

2G: diethylene glycol di(meth)acrylate (having two radically polymerizable groups without a cationically polymerizable group) (manufactured by SHIN-NAKAMURA CHEMICAL CO., LTD., NK ESTER 2G)

IAA: isoamyl acrylate (having one radically polymerizable group without a cationically polymerizable group) (manufactured by KYOEISHA CHEMICAL Co., LTD. LIGHT ACRYLATE IAA)

CYCLOMER: 3,4-epoxycyclohexylmethyl methacrylate (manufactured by Daicel Corporation, CYCLOMER M100) (having one radically polymerizable group and one cationically polymerizable group)

LIGHT ESTER G: glycidyl methacrylate (having one radically polymerizable group and one cationically polymerizable group) (manufactured by KYOEISHA CHEMICAL Co., LTD)

4HBAGE: 4-hdroxybutyl acrylate glycidyl ether (having one radically polymerizable group and one cationically polymerizable group) (manufactured by Nippon Kasei Chemical Co., Ltd)

CEL2021P: 3',4'-epoxycyclohexylmethyl-3,4-epoxycyclohexane carboxylate (having one cationically polymerizable group without a radically polymerizable group) (manufactured by Daicel Corporation, CELLOXIDE 2021P)

<Inorganic Particles>

MEK-AC-2140Z: (organosilica sol, particle diameter: 10 to 15 nm), (manufactured by NISSAN CHEMICAL INDUSTRIES, LTD.)

<Polymerization Initiator>

Radical photopolymerization initiator Irg 184 (IRGACURE 184, 1-hydroxy-cyclohexyl-phenyl-ketone, α-hydroxyalkylphenone-based radical photopolymerization initiator, manufactured by BASF SE)

Cationic photopolymerization initiator PAG-1 (cationic photopolymerization initiator which is an iodonium salt compound shown below)

Cationic Photopolymerization Initiator (Iodonium Salt Compound)

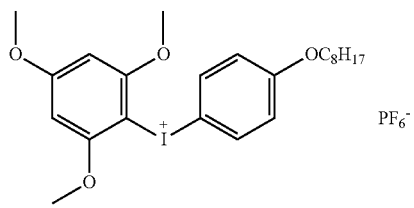

<Fluorine-Containing Compound>

RS-90: an antifoulant, manufactured by DIC Corporation, a fluorine-containing oligomer having a radically polymerizable group F-555: an antifoulant, manufactured by DIC Corporation, a fluorine-containing oligomer without a radically polymerizable group P-112: a leveling agent, the compound P-112 described in paragraph "0053" in JP5175831B <Solvent>

Methyl ethyl ketone

Methyl isobutyl ketone

Methyl acetate (5-2) Formation of First Cured Layer

One surface of the support shown in the following Table 3 was coated with the curable composition for forming a first cured layer, and the curable composition was cured, thereby forming the first cured layer. In the support having an easy-adhesive layer, the surface of the easy-adhesive layer of the support was coated with the curable composition for forming a first cured layer. Specifically, coating and curing were performed by the following method. By a die coating method described in Example 1 in JP2006-122889A in which a slot die was used, the support was coated with the curable composition for forming a first cured layer under the condition of a transport speed of 30 m/min, and the curable composition was dried for 150 seconds at an atmospheric temperature of 60° C. Then, with nitrogen purging, by using a 160 W/cm air-cooled metal halide lamp (manufactured by EYE GRAPHICS Co., Ltd.) at an oxygen concentration of about 0.1% by volume, the curable composition for forming a first cured layer was cured by being irradiated with ultraviolet rays at an illuminance of 20 mW/cm² and an irradiation amount of 30 mJ/cm². In this way, the first cured layer was formed and then wound up.

(5-3) Formation of Second Cured Layer

The laminate obtained by forming the first cured layer on the support was wound up, and the surface of the first cured layer was coated with the curable composition for forming a second cured layer. Under the same conditions as those for forming the first cured layer, the curable composition was dried and cured so as to form the second cured layer, thereby preparing a hardcoat film.

Example 33

<Preparation of Phase Difference Plate>

A phase difference plate, in which a first optically-anisotropic layer (H) was laminated, was prepared based on the same procedure as that in Example 1 in JP2015-187717A, except that the alignment film described in Example 4 in JP2015-187717A was used. A surface of the transparent support of the phase difference plate and a surface of the support of the hardcoat film prepared in Example 14 were bonded to each other by using a pressure sensitive adhesive, and the peelable support between the alignment film and the first optically-anisotropic layer (H) was peeled, thereby preparing a hardcoat film in which the first optically-anisotropic layer (H) was laminated. A surface, which was coated with the first optically-anisotropic layer (H), of the hardcoat film in which the first optically-anisotropic layer (H) was laminated and a surface of the optically-anisotropic layer of the phase difference plate, in which a second optically-anisotropic layer (Q) prepared based on Example 4 in JP2015-187717A was laminated, were bonded to each other by using a pressure sensitive adhesive, and the peelable support between the alignment film and the second optically-anisotropic layer (H) was peeled. In this way, a ¼ wave phase difference plate was prepared in which the hardcoat film, the first optically-anisotropic layer (H), and the second optically-anisotropic layer (Q) were laminated in this order. The first optically-anisotropic layer (H) and the second optically-anisotropic layer (Q) were laminated such that an angle of 30° C. was formed between slow axes of these optically-anisotropic layers.

Evaluation

The prepared hardcoat film of each of the examples and the comparative examples was evaluated by the following evaluation method. The evaluation results are shown in the following Table 3.

<Film Thickness>

The hardcoat film of each of the examples and the comparative examples was cut with a microtome so as to cut off the cross-section, and stained with an approximately 3% by mass aqueous osmium tetroxide solution overnight. Then, the surface was cut off again, and the cross-section was observed using a Scanning Electron Microscope (SEM).

<Pencil Hardness>

Pencil hardness was evaluated according to JIS K 5400 (JIS stands for Japanese Industrial Standards).

The hardcoat film of each of the examples and the comparative examples was humidified for 2 hours at a temperature of 25° C. and a relative humidity of 60%, and then 5 different sites within the surface of the second cured layer were scratched under a load of 4.9 N by using a testing pencil with hardness of H to 9H specified in JIS S 6006. Then, among the hardnesses of the pencil by which a visually recognized scratch was formed at 0 to 2 sites, the highest pencil hardness was taken as an evaluation result.

It is preferable that the numerical value described before "H" is high, because then the pencil hardness is high.

<Scratch Resistance>

Steel wool (manufactured by NIHON STEEL WOOL Co., Ltd., No. 0) was wound around the tip rubbing portion (1 cm×1 cm), which will come into contact with an evaluation subject (hardcoat film), of a rubbing tester and fixed using a band so as to prevent the steel wool from moving. Then, in an environment with a temperature of 25° C. and a relative humidity of 60%, the surface of the second cured layer of the hardcoat film of each of the examples and the comparative examples was rubbed using the rubbing tester under the following conditions.

Moving distance (one way): 13 cm, rubbing speed: 13 cm/sec, load: 1,000 g, contact area of tip portion: 1 cm×1 cm After the test, an oil-based black ink was applied to a surface, which was opposite to the second cured layer, of the hardcoat film of each of the examples and the comparative examples. The surface of the second cured layer was visually observed using reflected light, the number of times of rubbing that caused scratches in the portion coming into contact with the steel wool was counted, and the scratch resistance was evaluated based on the following standards.

A: no scratch was made even though the second cured layer was rubbed 10,000 times.

B: no scratch was made until the second cured layer was rubbed 1,000 times, but while the number of times of rubbing was exceeding 1,000 and reaching 10.000, scratches were made.

C: no scratch was made until the second cured layer was rubbed 100 times, but while the number of times of rubbing was exceeding 100 and reaching 1,000, scratches were made.

D: no scratch was made until the second cured layer was rubbed 10 times, but while the number of times of rubbing was exceeding 10 and reaching 100, scratches were made.

E: scratches were made while the second cured layer was being rubbed 10 times or less, and the scratch resistance was problematic for practical use.

<Punching Properties>

The hardcoat film of each of the examples and the comparative examples was humidified for 2 hours at a temperature of 25° C. and a relative humidity of 60%. Then, by using a die cutting machine (manual press machine TOR-PAC PRESS TP series manufactured by AMADA CO., LTD.) that was controlled such that a punching blade was stuck into the hardcoat film from the second cured layer side and reached the support side, a hole having a diameter of 2 mm was made by punching. The punching blade was stuck into the hardcoat film in such a direction that an angle of 90° was formed between the surface of the second cured layer and the blade. After punching, the edges of the first cured layer side and the second cured layer side of the hardcoat film were observed using an optical microscope, and the punching properties were evaluated as below.

A: no crack was observed at the edge of the second cured layer side.

B: although a crack was observed at the edge of the second cured layer side, the length of the crack was less than 50 μm, and hence the punching properties were unproblematic for practical use.

C: although a crack was observed at the edge of the second cured layer side, the length of the crack was equal to or greater than 50 μm and less than 100 μm, and hence the punching properties were unproblematic for practical use.

D: although a crack was observed at the edge of the second cured layer side, the length of the crack was equal to or greater than 100 μm and less than 200 μm, and hence the punching properties were unproblematic for practical use.

E: a crack was observed at the edge of the second cured layer side, the length of the crack was equal to or greater than 200 μm, and hence the punching properties were problematic for practical use.

<Adhesiveness>

The adhesiveness was evaluated by the crosscut method described in JIS K 5600-5-6-1. That is, in the hardcoat film of each of the examples and the comparative examples, cuts reaching the interior of the first cured layer were made from the front surface side of the second cured layer. In this way, 100 grids having an interval of 1 mm were made. Then, a cellophane tape (manufactured by NICHIBAN CO., LTD.) was stuck to the surface of the second cured layer and then peeled, the number of film pieces peeled from the 100 grids was counted, and the adhesiveness was evaluated as below.

A: no film piece was peeled from the 100 grids.

B: 90 to 99 grids remained without experiencing peeling of film pieces.

C: the number of grids remaining without experiencing peeling of film pieces was less than 90, and hence the adhesiveness was problematic for practical use.

<Keystroke Resistance>

A glass plate (manufactured by Corning Incorporated, tradename: EAGLE XG, thickness: 1 mm) and a surface, which was opposite to a surface on which the second cured layer was formed, of each of the laminates were bonded to each other through a pressure sensitive adhesive (SK-2057 from Soken Chemical & Engineering Co., Ltd.) having a thickness of 20 μm under a load of 2 Kg applied thereto by a rubber roller. The laminate was humidified for 2 hours at a temperature of 25° C. and a relative humidity of 60%. Then, by using a keystroke tester (manufactured by YSC), an input stylus (material of the stylus tip: polyacetal, R=0.8 mm, manufactured by Wacom) was brought into contact with the laminate from above the second cured layer (keystroke speed: 2 times/min, load: 250 g), and the keystroke resistance was evaluated based on the following standards.

A: no recess was made even though keystroke was performed more than 50,000 times.

B: while the number of times of keystroke was exceeding 10,000 and then the laminate was being pressed 50,000 times, recesses were made.

C: while the number of times of keystroke was exceeding 1,000 and then the laminate was being pressed 10,000 times, recesses were made.

D: while the number of times of keystroke was exceeding 100 and then the laminate was being pressed 1,000 times, recesses were made.

E: while the laminate was being pressed until the number of time of keystroke reached 100 times, recesses were made.

TABLE 3

| | Support | | | First cured layer | | | |
| | | | | Polymerizable compound 1 | | Polymerizable compound 2 or compound for comparison | | Film thickness |
| | Type | Film thickness | Formulation | Compound | Content | Compound | Content | |
|---|---|---|---|---|---|---|---|---|
| Example 1 | TAC | 80 | A-1 | DPHA | 49 | CYCLOMER | 51 | 25 |
| Example 2 | TAC | 80 | A-2 | DPHA | 40 | CYCLOMER | 60 | 25 |
| Example 3 | TAC | 80 | A-3 | DPHA | 30 | CYCLOMER | 70 | 25 |
| Example 4 | TAC | 80 | A-4 | DPHA | 10 | CYCLOMER | 90 | 25 |
| Example 5 | TAC | 80 | A-3 | DPHA | 30 | CYCLOMER | 70 | 25 |
| Example 6 | TAC | 80 | A-3 | DPHA | 30 | CYCLOMER | 70 | 25 |
| Example 7 | TAC | 80 | A-3 | DPHA | 30 | CYCLOMER | 70 | 25 |
| Example 8 | TAC | 80 | A-5 | DPHA | 30 | CYCLOMER | 70 | 25 |
| Example 9 | TAC | 80 | A-5 | DPHA | 30 | CYCLOMER | 70 | 25 |
| Example 10 | TAC | 80 | A-5 | DPHA | 30 | CYCLOMER | 70 | 25 |

TABLE 3-continued

| | | | | | | | | |
|---|---|---|---|---|---|---|---|---|
| Example 11 | TAC | 80 | A-6 | DPHA | 30 | LIGHT ESTER G | 70 | 25 |
| Example 12 | TAC | 80 | A-7 | DPHA | 30 | 4HBAGE | 70 | 25 |
| Example 13 | TAC | 120 | A-5 | DPHA | 30 | CYCLOMER | 70 | 25 |
| Example 14 | TAC | 150 | A-5 | DPHA | 30 | CYCLOMER | 70 | 25 |
| Example 15 | TAC | 300 | A-5 | DPHA | 30 | CYCLOMER | 70 | 25 |
| Example 16 | PMMA/PC/PMMA | 300 | A-5 | DPHA | 30 | CYCLOMER | 70 | 25 |
| Example 17 | PET | 300 | A-5 | DPHA | 30 | CYCLOMER | 70 | 25 |
| Example 18 | TAC | 80 | A-5 | DPHA | 30 | CYCLOMER | 70 | 20 |
| Example 19 | TAC | 80 | A-5 | DPHA | 30 | CYCLOMER | 70 | 15 |
| Example 20 | TAC | 80 | A-5 | DPHA | 30 | CYCLOMER | 70 | 10 |
| Example 21 | TAC | 80 | A-5 | DPHA | 30 | CYCLOMER | 70 | 35 |
| Example 22 | TAC | 80 | A-5 | DPHA | 30 | CYCLOMER | 70 | 45 |
| Example 23 | TAC | 80 | A-5 | DPHA | 30 | CYCLOMER | 70 | 25 |
| Example 24 | TAC | 80 | A-5 | DPHA | 30 | CYCLOMER | 70 | 25 |
| Example 25 | TAC | 80 | A-5 | DPHA | 30 | CYCLOMER | 70 | 25 |
| Example 26 | TAC | 80 | A-5 | DPHA | 30 | CYCLOMER | 70 | 25 |
| Example 27 | TAC | 80 | A-5 | DPHA | 30 | CYCLOMER | 70 | 25 |
| Example 28 | TAC | 80 | A-5 | DPHA | 30 | CYCLOMER | 70 | 25 |
| Example 29 | TAC | 80 | A-5 | DPHA | 30 | CYCLOMER | 70 | 25 |
| Example 30 | TAC | 80 | A-10 | ATMMT | 30 | CYCLOMER | 70 | 25 |
| Example 31 | TAC | 80 | A-11 | PETA | 30 | CYCLOMER | 70 | 25 |
| Example 32 | TAC | 80 | A-12 | DPHA | 30 | CYCLOMER | 70 | 25 |
| Example 33 | TAC | 150 | A-5 | DPHA | 30 | CYCLOMER | 70 | 25 |
| Comparative Example 1 | TAC | 80 | A-8 | DPHA | 50 | CYCLOMER | 50 | 25 |
| Comparative Example 2 | TAC | 80 | A-3 | DPHA | 30 | CYCLOMER | 70 | 25 |
| Comparative Example 3 | TAC | 80 | A-9 | DPHA | 30 | CEL2021P | 70 | 25 |

| | Second cured layer | | | Evaluation | | | | |
|---|---|---|---|---|---|---|---|---|
| | Formulation | Polymerizable compound 3 or compound for comparison Compound | Film thickness | Pencil hardness | Scratch resistance | Punching properties | Adhesiveness | Keystroke resistance |
| Example 1 | B-1 | DPHA | 5 | 7H | A | C | A | E |
| Example 2 | B-1 | DPHA | 5 | 6H | A | B | A | E |
| Example 3 | B-1 | DPHA | 5 | 6H | A | A | A | E |
| Example 4 | B-1 | DPHA | 5 | 5H | A | A | B | E |
| Example 5 | B-2 | DPHA | 5 | 5H | B | A | A | E |
| Example 6 | B-3 | DPHA | 5 | 7H | C | A | A | E |
| Example 7 | B-4 | DPHA | 5 | 7H | D | A | A | E |
| Example 8 | B-1 | DPHA | 5 | 7H | A | A | A | E |
| Example 9 | B-5 | PETA | 5 | 6H | B | A | A | E |
| Example 10 | B-6 | 2G | 5 | 5H | D | A | A | E |
| Example 11 | B-1 | DPHA | 5 | 7H | A | C | A | E |
| Example 12 | B-1 | DPHA | 5 | 7H | A | B | A | E |
| Example 13 | B-1 | DPHA | 5 | 7H | A | A | A | C |
| Example 14 | B-1 | DPHA | 5 | 9H | A | A | A | B |
| Example 15 | B-1 | DPHA | 5 | 9H | A | B | A | A |
| Example 16 | B-1 | DPHA | 5 | 9H | A | C | A | A |
| Example 17 | B-1 | DPHA | 5 | 9H | A | A | A | A |
| Example 18 | B-1 | DPHA | 5 | 6H | A | A | A | E |
| Example 19 | B-1 | DPHA | 5 | 6H | A | A | A | E |
| Example 20 | B-1 | DPHA | 5 | 5H | A | A | A | E |
| Example 21 | B-1 | DPHA | 5 | 8H | A | B | A | E |
| Example 22 | B-1 | DPHA | 5 | 9H | A | C | A | D |
| Example 23 | B-1 | DPHA | 10 | 8H | A | B | A | E |
| Example 24 | B-1 | DPHA | 30 | 9H | A | D | A | E |
| Example 25 | B-1 | DPHA | 1 | 5H | B | A | A | E |
| Example 26 | B-1 | DPHA | 0.1 | 4H | C | A | A | E |
| Example 27 | B-1 | DPHA | 0.08 | 4H | D | A | A | E |
| Example 28 | B-8 | DPHA | 5 | 7H | D | A | A | E |
| Example 29 | B-9 | DPHA | 5 | 7H | C | A | A | E |
| Example 30 | B-1 | DPHA | 5 | 6H | A | A | A | E |
| Example 31 | B-1 | DPHA | 5 | 5H | A | A | A | E |
| Example 32 | B-1 | DPHA | 5 | 7H | A | A | A | E |
| Example 33 | B-1 | DPHA | 5 | 9H | A | A | A | B |
| Comparative Example 1 | B-1 | DPHA | 5 | 7H | A | E | A | E |
| Comparative Example 2 | B-7 | IAA | 5 | 4H | E | A | A | E |
| Comparative Example 3 | B-1 | DPHA | 5 | 5H | A | B | C | E |

In Table 3, the content of the polymerizable compounds 1 and 2 and the compound for comparison is a proportion of each of the polymerizable compounds that is calculated in a case where the total amount of the polymerizable compounds 1 and 2 and the compound for comparison contained in each of the curable compositions is regarded as 100% by mass. Furthermore, the unit of the film thickness is µm.

From Table 3, it was understood that the scratch resistance, the punching properties, and the adhesiveness of the hardcoat film of the present invention were excellent.

In contrast, in a case where the content of the polymerizable compound 2 with respect to the total content of polymerizable compounds contained in the curable composition for forming a first cured layer was smaller than the lower limit specified by the present invention (Comparative Example 1), the punching properties were poor. Furthermore, it was understood that in a case where the curable composition for forming a second cured layer did not contain the polymerizable compound 3 (Comparative Example 2), even though the curable composition contained a polymerizable compound having one radically polymerizable group instead, the scratch resistance was poor. In addition, it was understood that in a case where the curable composition for forming a first cured layer did not contain the polymerizable compound 2 (Comparative Example 3), even though the curable composition contained a polymerizable compound having only a cationically polymerizable group instead, the adhesiveness was poor.

6. Preparation of Capacitance-Type Touch Panel (6-1)

By the method described in paragraphs "0016" to "0040" in JP2013-206444A, the film sensor described in paragraphs "0026" to "0035" in the same publication was bonded as a touch sensor film to a surface, which was opposite to a surface on which the first cured layer was disposed, of the support of the hardcoat film of Example 8, thereby preparing a capacitance-type touch panel. The capacitance-type touch panel has a laminate of the hardcoat film of Example 8 and the film sensor as a front plate of an image display element.

(6-2)

A capacitance-type touch panel was prepared by the following method.

(Preparation of Silver Halide Emulsion)

With stirring, the following solution 2 and solution 3 were simultaneously added for 20 minutes in an amount that was 90% of the total amount of each of the solutions to the following solution 1 kept at 15° C. and pH 4.5, thereby forming 0.16 µm silver halide particles. Subsequently, the following solution 4 and solution 5 were simultaneously added thereto for 8 minutes, and then the following solution 2 and solution 3 were simultaneously added thereto for 2 minutes in an amount that was remaining 10% such that the particles grew to have a size of 0.21 µm. Furthermore, 0.15 g of potassium iodide was added thereto, the particles were matured for 5 minutes, and then the formation of particles was finished.

Solution 1:
Water . . . 750 ml
Gelatin . . . 8.6 g
Sodium chloride . . . 3 g
1,3-Dimethylimidazolidine-2-thione . . . 20 mg
Sodium benzene thiosulfonate . . . 10 mg
Citric acid . . . 0.7 g
Solution 2:
Water . . . 300 ml
Silver nitrate . . . 150 g
Solution 3:
Water . . . 300 ml
Sodium chloride . . . 15 g
Potassium bromide . . . 32 g
Potassium hexachloroiridate (III) (0.005% KCl 20% aqueous solution) . . . 8 ml
Ammonium hexachlororhodate (0.001% NaCl 20% aqueous solution) . . . 10 ml
Solution 4:
Water . . . 100 ml
Silver nitrate . . . 50 g
Solution 5:
Water . . . 100 ml
Sodium chloride . . . 13 g
Potassium bromide . . . 11 g
Yellow prussiate of potash . . . 5 mg Then, according to the common method, the obtained silver halide emulsion was rinsed with water by a flocculation method. Specifically, the temperature of the silver halide emulsion was reduced to 35° C., and then the pH thereof was reduced using sulfuric acid until the silver halide particles were precipitated (the pH was within a range of 21±0.2). Thereafter, approximately 3 L of the supernatant was removed (first rinsing). Furthermore, 3 L of distilled water was added thereto, and then sulfuric acid was added thereto until the silver halide particles were precipitated. Approximately 3 L of the supernatant was removed again (second rinsing), and the same operation as that in the second rinsing was repeated once (third rinsing). In this way, rinsing was performed. The pH and pAg of the silver halide emulsion having undergone rinsing were adjusted to be 6.4 and 7.5 respectively. Then, 25 g of gelatin, 10 mg of sodium benzene thiosulfonate, 3 mg of sodium benzene thiosulfinate, 15 mg of sodium thiosulfate, and 10 mg of sodium chloroaurate were added thereto, chemical sensitization was performed to obtain optimal sensitivity at 55° C., and 100 mg of 1,3,3a,7-tetraazaindene as a stabilizer and 100 mg of PROXEL (trade name, manufactured by ICI Co., Ltd.) as a preservative were added thereto. The finally obtained silver halide emulsion was an emulsion of silver iodochlorobromide cube particles containing 0.08 mol % of silver iodide and silver chloroiodobromide in which a ratio of silver chloride:silver bromide was 70 mol %:30 mol %, and having an average particle diameter of 0.22 µm and a coefficient of variation of 9%.

(Preparation of Composition for Forming Photosensitive Layer)

1,3,3a,7-tetraazaindene $1.2 \times 10^{-4}$ mol/mol Ag, hydroquinone $1.2 \times 10^{-2}$ mol/mol Ag, citric acid $3.0 \times 10^{-4}$ mol:mol Ag, 2,4-dichloro-6-hydroxy-1,3,5-triazine sodium salt 0.90 g/mol Ag were added to the aforementioned emulsion, and the pH thereof was adjusted to be 5.6 by using citric acid, thereby obtaining a coating solution.

Polymer latex containing a polymer (P-1) represented by (P-1) illustrated below and a dispersant formed of a dialkyl phenyl PEO sulfuric acid ester (mass ratio of dispersant/polymer=2.0/100=0.02) was added to the aforementioned coating solution, such that a ratio of the polymer to the gelatin (polymer/gelatin (mass ratio)) contained in the aforementioned coating solution became 0.5/1.

Furthermore, as a cross-linking agent, EPOXY RESIN DY 022 (trade name: manufactured by Nagase ChemteX Corporation) was added thereto. The amount of the cross-linking agent added was adjusted such that the amount of the cross-linking agent in the photosensitive layer, which will be described later, became 0.09 g/m².

In the manner described above, a composition for forming a photosensitive layer was prepared.

The polymer (P-1) was synthesized with reference to JP3305459B and JP3754745B.

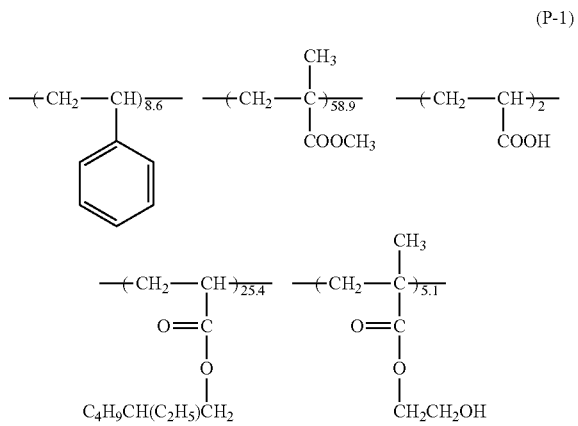

(P-1)

(Formation of Photosensitive Layer)

A corona discharge treatment was performed on a transparent insulating substrate (polyethylene terephthalate (PET) film having a thickness of 15 μm). Then, both surfaces of the transparent insulating substrate were coated with the aforementioned polymer latex to provide an undercoat having a thickness of 0.05 μm. Furthermore, on the undercoat, an antihalation layer (thickness: 1.0 μm) was provided with a mixture of the aforementioned polymer latex containing a dye which has an optical density of about 1.0 and can be decolored due to an alkali in a developer, and gelatin [mass ratio between mixed components (polymer/gelatin)=2/1]. The antihalation layer was coated with the aforementioned composition for forming a photosensitive layer and then with a composition for forming a protective layer obtained by mixing the aforementioned polymer latex with gelatin so as to provide a protective layer having a thickness of 0.15 μm. In this way, a transparent insulating substrate was obtained which had a photosensitive layer formed on both surfaces thereof. A mass ratio between the polymer and gelatin (polymer/gelatin) mixed to form the composition for forming a protective layer was 0.1/1. The film in which the photosensitive layer was formed on both surfaces of the transparent insulating substrate was used as a film A. In the formed photosensitive layer, the amount of silver was 6.0 g/m$^2$, and the amount of gelatin was 0.9 g/m$^2$.

(Exposure and Development Step)

Both surfaces of the film A were subjected to exposure through a photomask corresponding to the pattern of each of the conductive members by using parallel light from a high-pressure mercury lamp as a light source. After exposure, the film was developed using the following developer and then subjected to again a development treatment by using a fixing solution (trade name: N3X-R for CN16X, manufactured by FUJIFILM Corporation). The film was then rinsed with pure water and dried, thereby obtaining a resin substrate having a conductive member formed of Ag wires and a gelatin layer formed on both surfaces thereof. The gelatin layer was formed between the Ag wires. The obtained film was used as a film B.

Each of the first metal thin wire 15 and the second metal thin wire 25 had a line width of 4.0 μm, and the first mesh pattern M1 and the second mesh pattern M2 were regular diamond patterns (the opening portion had a diamond shape having an acute angle of 60°, and the length of one side of the opening portion was 500 μm).

The first conductive layer 8, in which the first metal thin wires 15 were disposed along the first mesh pattern M1, and the second conductive layer 9, in which the second metal thin wires 25 were disposed along the second mesh pattern M2, were disposed such that the layers overlapped each other in the transparent active area S1, thereby preparing the conductive film 1 for a touch panel shown in FIG. 3.

The first electrode 11 had an electrode width of 4.0 mm and an electrode pitch of 5.0 mm, and the second electrode 21 had an electrode width of 2.0 mm and an electrode pitch of 5.0 mm. The first peripheral wiring 12 and the second peripheral wiring 22 had a wiring width of 30 μm, and a minimum interwiring distance therebetween was 20 μm. Between the first electrodes 11 and between the second electrodes 21, a pattern using the dummy electrode shown in FIG. 5 was adopted. In the border between the electrode and the dummy electrode, a 10 μm disconnection portion was formed such that the electrode and the dummy electrode were electrically insulated.

(Composition of Developer)

1 L of the developer contains the following compounds.

Hydroquinone . . . 0.037 mol/L
N-methylaminophenol . . . 0.016 mol/L
Sodium metaborate . . . 0.140 mol/L
Sodium hydroxide . . . 0.210 mol/L
Sodium bromide . . . 0.031 mol/L
Potassium metabisulfate . . . 0.187 mol/L (Heating Step)

The aforementioned film B was subjected to a heating treatment by being left to stand for 130 seconds in a superheated vapor tank with a temperature of 120° C. The film having undergone the heating treatment was used as a film C.

(Gelatin Decomposition Treatment)

The film C was immersed in an aqueous solution (concentration of protease: 0.5% by mass, liquid temperature: 40° C.) of a protease (BIOPRASE AL-15FG manufactured by Nagase ChemteX Corporation) for 120 seconds. Furthermore, the film C was taken out of the aqueous solution, immersed in warm water (liquid temperature: 50° C.) for 120 seconds, and then washed with water. The film having undergone the gelatin decomposition treatment is used as a film D.

(Calender Treatment)

As a matting member for a calender treatment, a stainless steel plate having a surface shape in which an arithmetic mean roughness (Ra)=0.28 μm and an average interval (Sm) between asperities=1.87 μm was used. Furthermore, by using a calender device obtained by combining a metal roller having a mirror-finished surface with a roller made of a resin, a calender treatment was performed on the film D by transporting the film at a speed of 120 mm/min while applying a pressure of 11.4 MPa as a jacket pressure. The film having undergone the calender treatment was used as a film E.

(Heating Treatment)

The film E was subjected to a heating treatment by being left to stand for 130 seconds in a superheated vapor tank with a temperature of 120° C. The film having undergone the heating treatment was used as a film F.

OCA (#8146-3: 75 μm thick) manufactured by 3M and the hardcoat film of Example 8 were laminated in this order on one surface (top surface) of the film F obtained as above, such that a surface, opposite to a surface on which the first cured layer of the hardcoat film of Example 8 was disposed, and the top surface of the film F faced each other. Furthermore, a liquid crystal display was laminated on the other surface (bottom surface) of the film F through OCA (#8146-4: 100 µm thick) manufactured by 3M, such that the bottom surface of the film F and the rear polarizing plate of the liquid crystal display faced each other, thereby preparing a capacitance-type touch panel.

7-a. Preparation 1 of Front Plate of Image Display Element

By using the slot die coater described in FIG. 1 in JP2003-211052A, the second cured layer of the hardcoat film of Example 8 was wet-coated with a coating solution for a layer of low refractive index prepared by the following method, such that the dry film thickness of the layer of low refractive index became 100 nm, and the resulting film was dried for 50 seconds at 60° C. Then, with nitrogen purging, in an atmosphere with an oxygen concentration equal to or lower than 100 volume ppm, the film was irradiated with ultraviolet rays in an irradiation amount of 400 mJ/cm$^2$ by using a 240 W/cm air-cooled metal halide lamp (manufactured by EYE GRAPHICS Co., Ltd.), thereby forming a layer of low refractive index. Thereafter, the obtained laminate (laminate of a support, the first cured layer, the second cured layer, and the layer of low refractive index) was wound up, thereby preparing a front plate for an image display element.

(7-1) Preparation of Coating Solution for Layer of Low Refractive Index (7-1-1) Preparation of Sol Liquid a 120 parts by mass of methyl ethyl ketone, 100 parts by mass of acryloxypropyl trimethoxysilane (manufactured by Shin-Etsu Chemical Co., Ltd., KBM-5103), and 3 parts by mass of diisopropoxyaluminum ethyl acetate were put into a reactor equipped with a stirrer and a reflux cooling pipe, and mixed together. Then, 30 parts by mass of deionized water was added thereto, and the mixture was reacted for 4 hours at 60° C. Thereafter, the mixture was cooled to room temperature, thereby obtaining a sol liquid a. The weight-average molecular weight of the sol liquid a was 1,800, and the proportion of components having a weight-average molecular weight of 1,000 to 20,000 in the components having a molecular weight equal to or greater than that of an oligomer component was 100% by mass. Through gas chromatography, it was confirmed that acryloxypropyl trimethoxysilane as a raw material did not remain at all.

(7-1-2) Preparation of Hollow Silica Particle Dispersion Liquid (A-1)

Hollow silica particles, which are described in Preparation Example 4 in JP2002-79616A and have a particle size of about 40 to 50 nm, a shell thickness of 6 to 8 nm, and a refractive index of 1.31, were dispersed in isopropyl alcohol as a main solvent such that the concentration of solid contents became 20% by mass, thereby preparing a hollow silica particle sol. 30 parts by mass of acryloyloxypropyl trimethoxysilane (manufactured by Shin-Etsu Chemical Co., Ltd., KBM-5103) and 1.5 parts by mass of diisopropoxy-aluminum ethyl acetoacetate (manufactured by Hope Chemical Co., LTD. CHELOPE EP-12) were added to 500 parts by mass of the hollow silica particle sol, and mixed together. Then, 9 parts by mass of deionized water was added thereto, and the solution was reacted for 8 hours at 60° C. The obtained reaction solution was cooled to room temperature, 1.8 parts of acetyl acetone was then added thereto, thereby obtaining a hollow silica particle dispersion liquid (A-1). The obtained hollow silica particle dispersion liquid (A-1) had a concentration of solid contents of 18% by mass, and a refractive index thereof measured after drying the solvent was 1.31.

(7-1-3) Preparation of Coating Solution for Layer of Low Refractive Index (LL-1)

44.0 parts by mass of the fluorine-containing copolymer (P-3) (weight-average molecular weight: about 50,000) described in paragraph "0043" in JP2004-45462A, 6.0 parts by mass of a mixture of dipentaerythritol pentaacrylate and dipentaerythritol hexaacrylate (DPHA, manufactured by Nippon Kayaku Co., Ltd.), 3.0 parts by mass of terminal methacrylate group-containing silicone (manufactured by Gelest, Inc, RMS-033), and 3.0 parts by mass of IRGACURE 907 (manufactured by BASF SE) were added to 100 parts by mass of methyl ethyl ketone and dissolved. Then, 195 parts by mass (39.0 parts by mass as solid contents including silica and a surface treatment agent thereof) of the hollow silica particle dispersion liquid (A-1) and 17.2 parts by mass (5.0 parts by mass as solid contents) of the sol liquid a were added thereto. The dispersion liquid was diluted with cyclohexane and methyl ethyl ketone such that the concentration of solid contents of the entirety of the coating solution became 6% by mass and that a mass ratio of cyclohexane/methyl ethyl ketone became 10/90, thereby preparing a coating solution for a layer of low refractive index (LL-1). A coating film obtained by coating performed using the coating solution for a layer of low refractive index (LL-1) had a refractive index of 1.38 after curing.

7-b. Preparation 2 of Front Plate of Image Display Element

The hardcoat film of Example 8 was disposed in a chamber of a magnetron sputtering device such that the second cured layer was exposed. On the second cured layer, a layer of low refractive index 1 (refractive index: 1.47, thickness: 20 nm) was formed using $SiO_2$ by sputtering. Furthermore, on the layer of low refractive index 1, a layer of high refractive index 1 (refractive index: 2.33, thickness: 17 nm) was formed using $Nb_2O_5$ by sputtering. In addition, on the layer of high refractive index 1, a layer of low refractive index 2 (refractive index: 1.47, thickness: 42 nm) was formed using $SiO_2$ by sputtering. Moreover, on the layer of low refractive index 2, a layer of high refractive index 2 (refractive index: 2.33, thickness: 30 nm) was formed using $Nb_2O_5$ by sputtering. On the layer of high refractive index 2, a layer of low refractive index 3 (refractive index: 1.47, thickness: 110 nm) was formed using $SiO_2$ by sputtering. The obtained laminate (laminate of a support, the first cured layer, the second cured layer, the layers of low refractive index, and the layers of high refractive index) was wound up, thereby preparing a front plate for an image display element.

8. Preparation of Polarizing Plate

A triacetyl cellulose film (TAC-TD80U, manufactured by FUJIFILM Corporation) having a thickness of 80 µm was immersed in a 1.5 mol/L aqueous NaOH solution with a temperature of 55° C. for 2 minutes, and then neutralized and rinsed with water. Iodine was adsorbed onto polyvinyl alcohol, and the film was stretched, thereby preparing a polarizer. The triacetyl cellulose film having been rinsed with water was stuck to one surface of the prepared polarizer. The other surface of the polarizer was bonded to a surface, which was opposite to a surface on which the first cured layer was disposed, of the support of each of the hardcoat films of Examples 1 to 32, thereby preparing polarizing plates 101 to 132.

9. Preparation of Image Display Having in-Cell Touch Panel Display Element.

A liquid crystal display element was prepared which was an in-cell touch panel display element incorporated into a commercial liquid crystal display (manufactured by Sony Ericsson, Xperia P). A polarizing plate 108 was bonded to the top of the in-cell touch panel display element through an adhesive layer having a thickness of 20 μm, thereby preparing an image display having an in-cell touch panel display element.

10. Preparation of Image Display Having On-Cell Touch Panel Display Element

An organic electroluminescent display element was prepared which was an on-cell touch panel display element incorporated into a commercial organic EL display (manufactured by SAMSUNG, GALAXY SII). The polarizing plate 108 was bonded to the top of the on-cell touch panel display element through an adhesive layer having a thickness of 20 μm, thereby preparing an image display having an on-cell touch panel display element.

EXPLANATION OF REFERENCES

1A: support
2A: first cured layer
3A: second cured layer
1: conductive film for touch panel
2: touch panel
3: hardcoat film
4: pressure sensitive adhesive
5: transparent insulating substrate
6A, 6B: conductive member
7A, 7B: protective layer
8: first conductive layer
9: second conductive layer
11A: first dummy electrode
11: first electrode
12: first peripheral wiring
13: first external connection terminal
14: first connector portion
15: first metal thin wire
21: second electrode
22: second peripheral wiring
23: second external connection terminal
24: second connector portion
25: second metal thin wire
C1: first cell
C2: second cell
D1: first direction
D2: second direction
M1: first mesh pattern
M2: second mesh pattern
S1: active area
S2: peripheral region

What is claimed is:

1. A hardcoat film comprising:
a support;
a first cured layer; and
a second cured layer in this order,
wherein the first cured layer is formed of a curable composition for forming a first cured layer containing a polymerizable compound 1 having a radically polymerizable group and a polymerizable compound 2 which has a cationically polymerizable group and a radically polymerizable group in the same molecule and is different from the polymerizable compound 1,
the second cured layer is formed of a curable composition for forming a second cured layer containing a polymerizable compound 3 having at least two radically polymerizable groups in the same molecule,
a content of the polymerizable compound 2 with respect to a total content of the polymerizable compounds contained in the curable composition for forming a first cured layer is equal to or greater than 51% by mass, and
the support includes three or more layers in which outer layers and layers other than the outer layers are films of different compositions.

2. The hardcoat film according to claim 1,
wherein a content of a polymerizable compound having a cationically polymerizable group with respect to a total content of polymerizable compounds contained in the curable composition for forming a second cured layer is equal to or smaller than 20% by mass.

3. The hardcoat film according to claim 1,
wherein a content of inorganic particles with respect to the solid content in the curable composition for forming a second cured layer is equal to or smaller than 20% by mass.

4. The hardcoat film according to claim 1,
wherein the curable composition for forming a second cured layer contains a fluorine-containing compound.

5. The hardcoat film according to claim 4,
wherein the fluorine-containing compound has a radically polymerizable group.

6. The hardcoat film according to claim 1,
wherein the cationically polymerizable group of the polymerizable compound 2 is an epoxy group.

7. The hardcoat film according to claim 1,
wherein the cationically polymerizable group of the polymerizable compound 2 is an alicyclic epoxy group.

8. The hardcoat film according to claim 1,
wherein the second cured layer is directly positioned on a surface of the first cured layer.

9. The hardcoat film according to claim 1,
wherein an optically-anisotropic layer containing a liquid crystal compound is laminated on one side of the support.

10. The hardcoat film according to claim 1,
wherein a film thickness of the support is 50 μm to 400 μm.

11. A polarizing plate comprising:
the hardcoat film according to claim 1; and
a polarizer.

12. A front plate of an image display, comprising:
the hardcoat film according to claim 1.

13. An image display comprising;
the front plate according to claim 12; and
an image display element.

14. The image display according to claim 13,
wherein the image display element is a liquid crystal display element.

15. The image display according to claim 13,
wherein the image display element is an organic electroluminescent display element.

16. The image display according to claim 13,
wherein the image display element is an in-cell touch panel display element.

17. The image display according to claim 13,
wherein the image display element is an on-cell touch panel display element.

18. A resistive film touch panel comprising:
the front plate according to claim 12.

19. A capacitance touch panel comprising:
the front plate according to claim 12.

20. A method for manufacturing a hardcoat film, comprising:
forming a first cured layer on a support by using a curable composition for forming a first cured layer containing a polymerizable compound 1 having a radically polymerizable group and a polymerizable compound 2 which has a cationically polymerizable group and a radically polymerizable group in the same molecule and is different from the polymerizable compound 1; and forming a second cured layer on the first cured layer by using a curable composition for forming a second cured layer containing a polymerizable compound 3 having at least two radically polymerizable groups in the same molecule, wherein the second cured layer is formed such that the support, the first cured layer, and the second cured layer are laminated in this order, a content of the polymerizable compound 2 with respect to a total content of the polymerizable compounds contained in the curable composition for forming a first cured layer is equal to or greater than 51% by mass, and the support includes three or more layers in which outer layers and layers other than the outer layers are films of different compositions.

21. The method for manufacturing a hardcoat film according to claim 20,
wherein the second cured layer is directly formed on a surface of the first cured layer.

* * * * *